United States Patent
Yamazaki et al.

(10) Patent No.: US 8,427,595 B2
(45) Date of Patent: Apr. 23, 2013

(54) DISPLAY DEVICE WITH PIXEL PORTION AND COMMON CONNECTION PORTION HAVING OXIDE SEMICONDUCTOR LAYERS

(75) Inventors: Shunpei Yamazaki, Setagaya (JP); Kengo Akimoto, Atsugi (JP); Shigeki Komori, Isehara (JP); Hideki Uochi, Atsugi (JP); Rihito Wada, Atsugi (JP); Yoko Chiba, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 394 days.

(21) Appl. No.: 12/556,595

(22) Filed: Sep. 10, 2009

(65) Prior Publication Data

US 2010/0072469 A1 Mar. 25, 2010

(30) Foreign Application Priority Data

Sep. 19, 2008 (JP) ................................ 2008-241557

(51) Int. Cl.
  *G02F 1/136* (2006.01)
  *G02F 1/1343* (2006.01)
  *G02F 1/1345* (2006.01)
  *H01L 27/14* (2006.01)
  *H01L 29/04* (2006.01)
  *H01L 29/15* (2006.01)
  *H01L 31/036* (2006.01)

(52) U.S. Cl.
  USPC ................. 349/43; 349/140; 349/152; 257/72

(58) Field of Classification Search .................... 349/43, 349/138–140, 142, 149, 151–153, 158; 257/72
  See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 1987573 | 6/2007 |
| EP | 1737044 A | 12/2006 |

(Continued)

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

(Continued)

*Primary Examiner* — Bumsuk Won
*Assistant Examiner* — Paisley L Arendt
(74) *Attorney, Agent, or Firm* — Eric J. Robinson; Robinson Intellectual Property Law Office, P.C.

(57) ABSTRACT

To provide a structure suitable for a common connection portion provided in a display panel. A common connection portion provided in an outer region of a pixel portion has a stacked structure of an insulating layer formed using the same layer as a gate insulating layer, an oxide semiconductor layer formed using the same layer as a second oxide semiconductor layer, and a conductive layer (also referred to as a common potential line) formed using the same layer as the conductive layer, in which the conductive layer (also referred to as the common potential line) is connected to a common electrode through an opening in an interlayer insulating layer provided over the first oxide semiconductor layer and an electrode opposite to a pixel electrode is electrically connected to the common electrode through conductive particles.

13 Claims, 33 Drawing Sheets

U.S. PATENT DOCUMENTS

| | | | |
|---|---|---|---|
| 5,847,410 A | 12/1998 | Nakajima | |
| 5,982,471 A | 11/1999 | Hirakata et al. | |
| 6,177,974 B1 | 1/2001 | Hirakata et al. | |
| 6,294,274 B1 | 9/2001 | Kawazoe et al. | |
| 6,404,480 B2 | 6/2002 | Hirakata et al. | |
| 6,563,174 B2 | 5/2003 | Kawasaki et al. | |
| 6,586,346 B1 | 7/2003 | Yamazaki et al. | |
| 6,600,524 B1* | 7/2003 | Ando et al. | 349/43 |
| 6,727,522 B1 | 4/2004 | Kawasaki et al. | |
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,301,211 B2 | 11/2007 | Yamazaki et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,443,478 B2 | 10/2008 | Hirakata et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,561,242 B2 | 7/2009 | Hirakata et al. | |
| 7,616,273 B2 | 11/2009 | Hirakata et al. | |
| 7,619,608 B2 | 11/2009 | Lee et al. | |
| 7,663,302 B2 | 2/2010 | Shin et al. | |
| 7,674,650 B2 | 3/2010 | Akimoto et al. | |
| 7,714,974 B2 | 5/2010 | Lee et al. | |
| 7,732,819 B2 | 6/2010 | Akimoto et al. | |
| 7,977,675 B2 | 7/2011 | Kawamura et al. | |
| 2001/0000440 A1 | 4/2001 | Hirakata et al. | |
| 2001/0046027 A1 | 11/2001 | Tai et al. | |
| 2002/0056838 A1 | 5/2002 | Ogawa | |
| 2002/0109815 A1 | 8/2002 | Hirakata et al. | |
| 2002/0132454 A1 | 9/2002 | Ohtsu et al. | |
| 2003/0189401 A1 | 10/2003 | Kido et al. | |
| 2003/0210357 A1 | 11/2003 | Hirakata et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0270469 A1 | 12/2005 | Hirakata et al. | |
| 2005/0270470 A1 | 12/2005 | Hirakata et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0121745 A1* | 6/2006 | Fujii | 438/790 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Theiss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0139600 A1* | 6/2007 | Lee et al. | 349/153 |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0197350 A1 | 8/2008 | Park et al. | |
| 2008/0203387 A1 | 8/2008 | Kang et al. | |
| 2008/0224133 A1 | 9/2008 | Park et al. | |
| 2008/0246064 A1 | 10/2008 | Kimura | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0050890 A1 | 2/2009 | Hirakata et al. | |
| 2009/0061569 A1 | 3/2009 | Hirakata et al. | |
| 2009/0065771 A1 | 3/2009 | Iwasaki et al. | |
| 2009/0068773 A1 | 3/2009 | Lai et al. | |
| 2009/0072232 A1 | 3/2009 | Hayashi et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0244423 A1 | 10/2009 | Hirakata et al. | |
| 2009/0278122 A1 | 11/2009 | Hosono et al. | |
| 2009/0280600 A1 | 11/2009 | Hosono et al. | |
| 2010/0025678 A1 | 2/2010 | Yamazaki et al. | |
| 2010/0065844 A1 | 3/2010 | Tokunaga | |
| 2010/0072467 A1 | 3/2010 | Yamazaki et al. | |
| 2010/0072468 A1 | 3/2010 | Yamazaki et al. | |
| 2010/0092800 A1 | 4/2010 | Itagaki et al. | |
| 2010/0109002 A1 | 5/2010 | Itagaki et al. | |
| 2011/0133183 A1 | 6/2011 | Yamazaki et al. | |

FOREIGN PATENT DOCUMENTS

| | | |
|---|---|---|
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 A | 10/1996 |
| JP | 10-268335 A | 10/1998 |
| JP | 11-505377 | 5/1999 |
| JP | 11-202366 A | 7/1999 |
| JP | 2000-044236 A | 2/2000 |

| JP | 2000-150900 A | 5/2000 |
| JP | 2001-250949 A | 9/2001 |
| JP | 2002-076356 A | 3/2002 |
| JP | 2002-289859 A | 10/2002 |
| JP | 2003-069028 A | 3/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2007-150158 A | 6/2007 |
| JP | 2007-250982 A | 9/2007 |
| JP | 2007-250983 A | 9/2007 |
| JP | 2008-166716 A | 7/2008 |
| JP | 2008-182209 A | 8/2008 |
| JP | 2009-260002 A | 11/2009 |
| WO | WO-2004/114391 | 12/2004 |
| WO | WO-2007/108293 | 9/2007 |
| WO | WO-2007/119386 | 10/2007 |
| WO | WO-2008/069056 | 6/2008 |
| WO | WO-2008/069255 | 6/2008 |

OTHER PUBLICATIONS

Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphos Oxide Semiconductors,", Nature, Nov. 25, 2004, vol. 432, pp. 488-492.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the $In_2O_3$-$Ga_2ZnO_4$-ZnO system at 1350°C,", Journal of Solid State Chemistry, Aug. 1, 1991, vol. 93, No. 2, pp. 298-315.
Kimizuka.N. et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$(m = 7,8,9, and 16) in the $In_2O_3$-$ZnGa_2O_4$-ZnO System,", Journal of Solid State Chemistry, Apr. 1, 1995, vol. 116, No. 1, pp. 170-178.
Nomura.K et al., "Thin-Film Transistor Fabricated in Single-Crystalline Oxide Semiconductor,", Science, May 23, 2003, vol. 300, No. 5623, pp. 1269-1272.
Osada.T et al., "15.2: Development of Driver-Integrated Panel using Amorphous In-Ga-Oxide TFT,", SID Digest '09 : SID International Symposium Digest of Technical Papers, May 31, 2009, pp. 184-187.
Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.
Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, pp. 899-902.
Kanno.H et al., "White Stacked Electrophosphorecent Organic Light-Emitting Device Employing $MoO_3$ as a Change-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.
Park.J et al., "Amorphous Indium-Gallium-Zinc Oxide TFTS and Their Application for Large Size AMOLED,", AM-FPD '08 Digest of Technical Papers, Jul. 2, 2008, pp. 275-277.
Park.S et al., "Challenge to Future Displays: Transparent AM-OLED Driven by PEALD Grown ZnO TFT,", IMID '07 Digest, 2007, p. 1249-1252.
Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.
Osada.T et al., "Development of Driver-Integrated Panel Using Amorphous In-Ga-Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9: Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.
Ohara.H et al., "21.3: 4.0 in. QVGA AMOLED Display Using In-Ga-Zn-Oxide TFTs With a Novel Passivation Layer,", SID Digest '09 : SID International Symposium Digest of Technical Papers, May 31, 2009, pp. 284-287.
Miyasaka.M, "58.2 Invited Paper : Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1: Invited Paper: Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology,", SID Digest '09 : SID International Symposium Digest of Technical Papers, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2: Invited Paper: Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Kikuchi.H et al., "Polymer-Stabilized Liquid Crystal Blue Phases,", Nature Materials, Sep. 2, 2002, vol. 1, pp. 64-68.
Kimizuka.N. et al., "Spinel, YbFe$_2$O$_4$, and Yb$_2$Fe$_3$O$_7$ Types of Structures for Compounds in the In$_2$O$_3$ and Sc$_2$O$_3$-O$_3$-BO Systems [A: Fe, Ga, or Al; B: Mg, Mn, Fe, Mi, Cu or Zn] at Temperatures over 1000°C,", Journal of Solid State Chemistry, 1985, vol. 60, pp. 382-384.
Kitzerow.H et al., "Observation of Blue Phases in Chiral Networks,", Liquid Crystals, 1993, vol 14, No. 3, pp. 911-916.
Costello.M et al., "Electron Microscopy of a Cholesteric Liquid Crystal and Its Blue Phase,", Phys. Rev. A (Physical Review A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.
International Search Report (Application No. PCT/JP2009/065546) Dated Nov. 2, 2009.
Written Opinion (Application No. PCT/JP2009/065546) Dated Nov. 2, 2009.
Fortunato. E et al., "Wide-Bandgap High-Mobility Zno Thin-Film Transistors Produced At Room Temperature,", Appl. Phys. Lett. (Applied Physics Letters), Sep. 27, 2004, vol. 85, No. 13, pp. 2541-2543.
Park. J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Hayashi. R et al., "42.1: Invited Paper: Improved Amorphous In-Ga-Zn-O TFTS,", SID Digest '08: SID International Symposium Digest of Technical Papers, May 20, 2008, vol. 39. pp. 621-624.
Masuda. S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma. N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Nomura. K et al., "Carrier transport in transparent oxide semiconductor with intrinsic structural randomness probed using single-crystalline InGaO3(ZnO)5 Films,", Appl. Phys. Lett. (Applied Physics Letters), Sep. 13, 2004, vol. 85, No. 11, pp. 1993-1995.
Son. K et al., "42.4L: Late-News Paper: 4 Inch QVGA Amoled Driven by the Threshold Voltage Controlled Amorphous Gizo (Ga2O3-In2O3-ZnO) TFT,", SID Digest '08: SID International Symposium Digest of Technical Papers, May 20, 2008, vol. 39, pp. 633-636.
Van de Walle. C, "Hydrogen as a Cause of Doping in Zinc Oxide,", Phys. Rev. Lett. (Physical Review Letters), Jul. 31, 2000, vol. 85, No. 5, pp. 1012-1015.
Fung. T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.
Park. J et al., "High performance amorphous oxide thin film transistors with self-aligned top-gate structure,", IEDM 09:Technical Digest of International Electron Devices Meeting, Dec. 7, 2009, pp. 191-194.

Nakamura. M, "Synthesis of Homologous Compound with New Long-Period Structure,", NIRIM Newsletter, Mar. 1, 1995, vol. 150, pp. 1-4.
Park. Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.
Orita. M et al., "Mechanism of Electrical Conductivity of Transparent InGaZnO4,", Phys.Rev. B (Physical Review. B), Jan. 15, 2000, vol. 61, No. 3, pp. 1811-1816.
Nomura. K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4304-4308.
Janotti. A et al., "Native Point Defects in ZnO,", Phys. Rev. B (Physical Review. B), Oct. 4, 2007, vol. 76, No. 16, pp. 165202-1-165202-22.
Park. J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.
Hsieh. H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.
Janotti. A et al., "Oxygen Vacancies in ZnO,", Appl. Phys. Lett. (Applied Physics Letters), 2005, vol. 87, pp. 122102-1-122102-3.
Oba. F et al., "Defect energetics in ZnO: A hybrid Hartree-Fock density functional study,", Phys. Rev. B (Physical Review. B), 2008, vol. 77, pp. 245202-1-245202-6.
Orita. M et al., "Amorphous transparent conductive oxide InGaO3(ZnO)m (m <4):a Zn4s conductor,", Philosophical Magazine, 2001, vol. 81, No. 5, pp. 501-515.
Hosono. H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo. Y et al., "Amorphous Oxide TFT Backplanes for Large Size AMOLED Displays,", IDW '08: Proceedings of the 6TH International Display Workshops, Dec. 3, 2008, pp. 581-584.
Kim. S et al., "High-Performance oxide thin film transistors passivated by various gas plasmas,", 214th ECS Meeting, 2008, No. 2317, ECS.
Clark. S et al., "First Principles Methods Using Castep,", Zeitschrift fur Kristallographie, 2005, vol. 220, pp. 567-570.
Lany. S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park. J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh. M et al., "Improving the Gate Stability of Zno Thin-Film Transistors With Aluminum Oxide Dielectric Layers,", J. Electrochem. Soc. (Journal of the Electrochemical Society), 2008, vol. 155, No. 12, pp. H1009-H1014.
Ueno. K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.
Chinese Office Action (Application No. 200980137845.2) Dated Jan. 25, 2013.

* cited by examiner

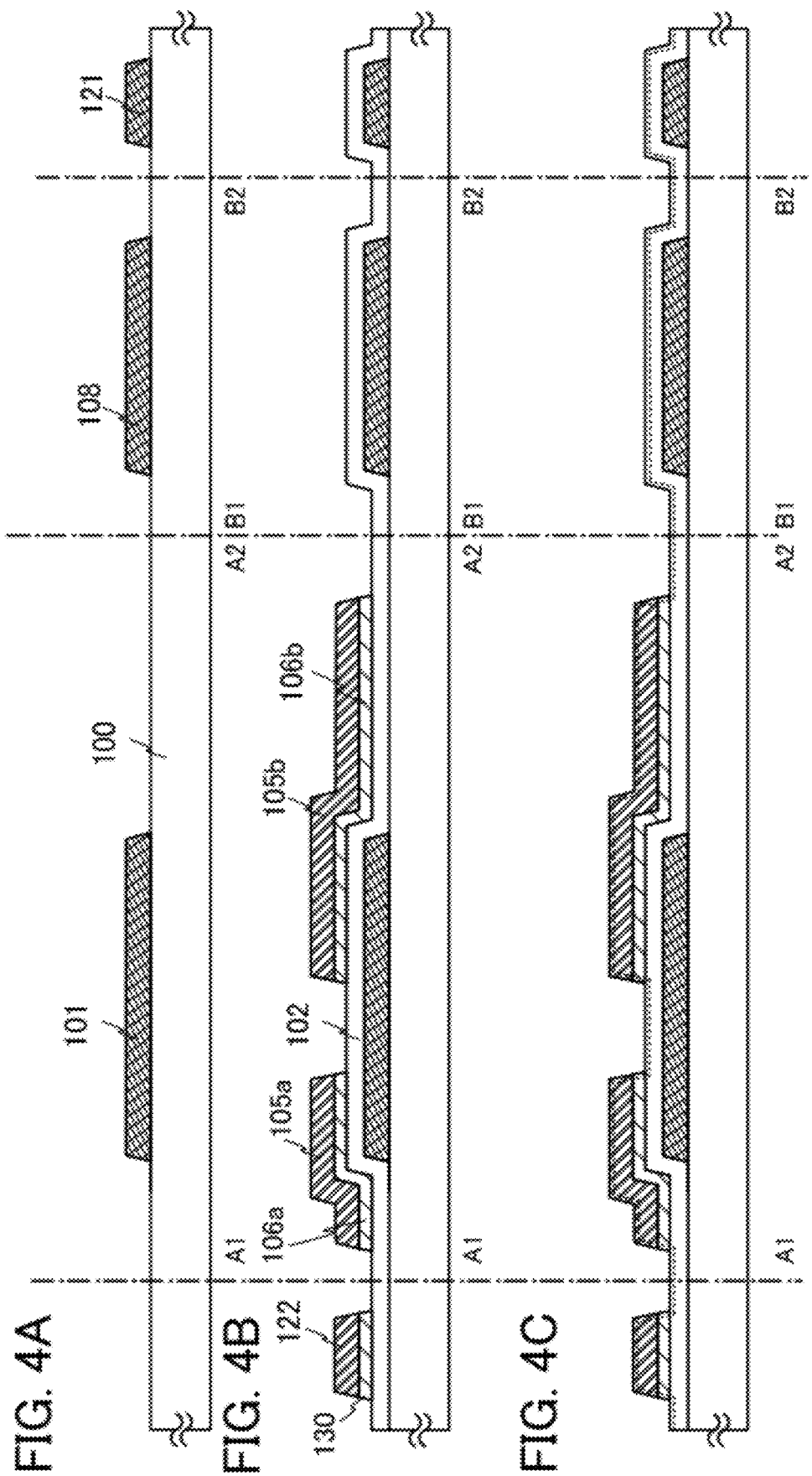

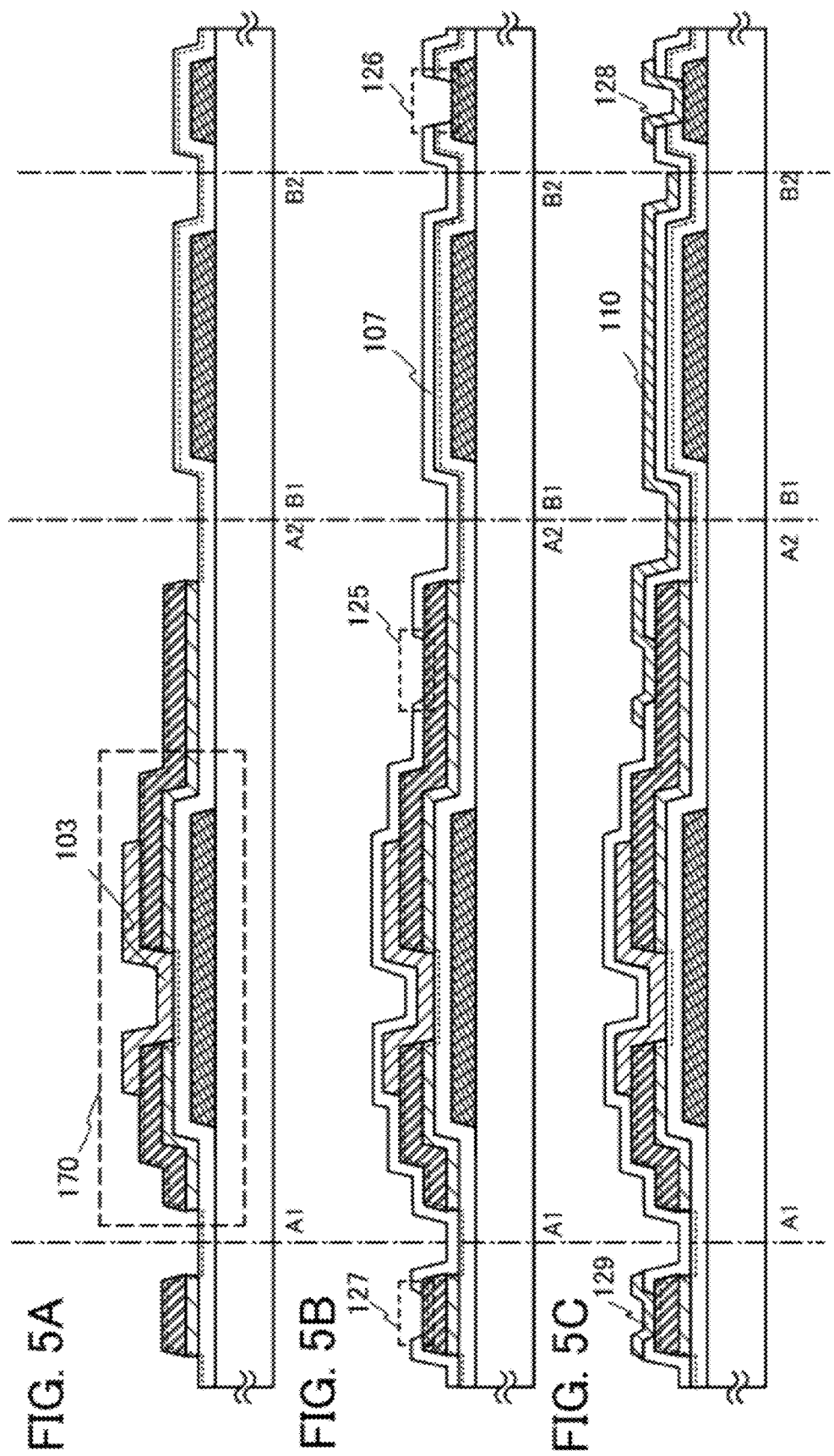

FIG. 10A1
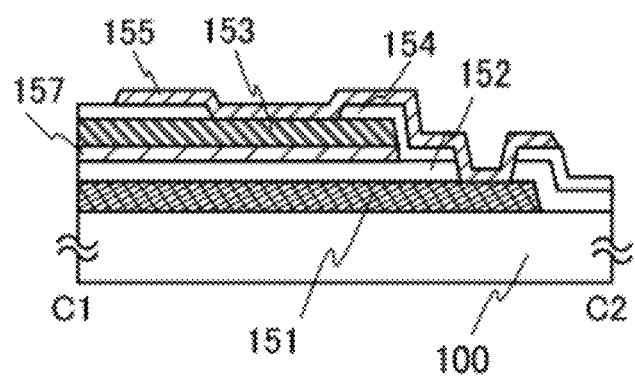
FIG. 10A2
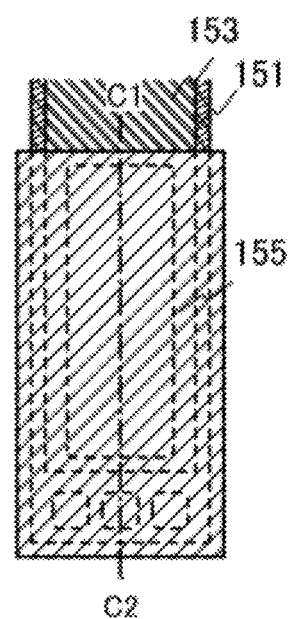
FIG. 10B1
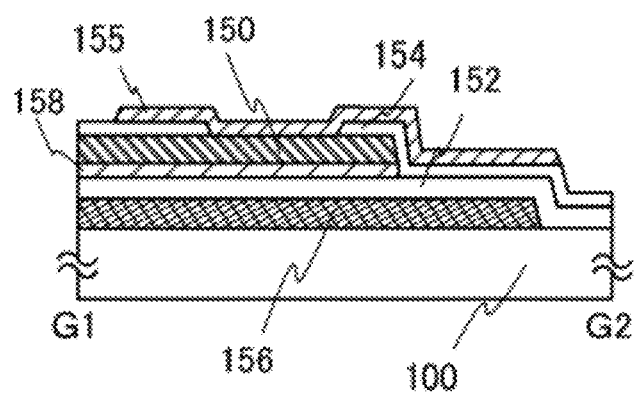
FIG. 10B2
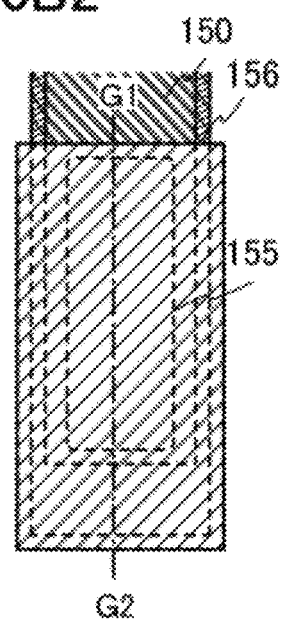

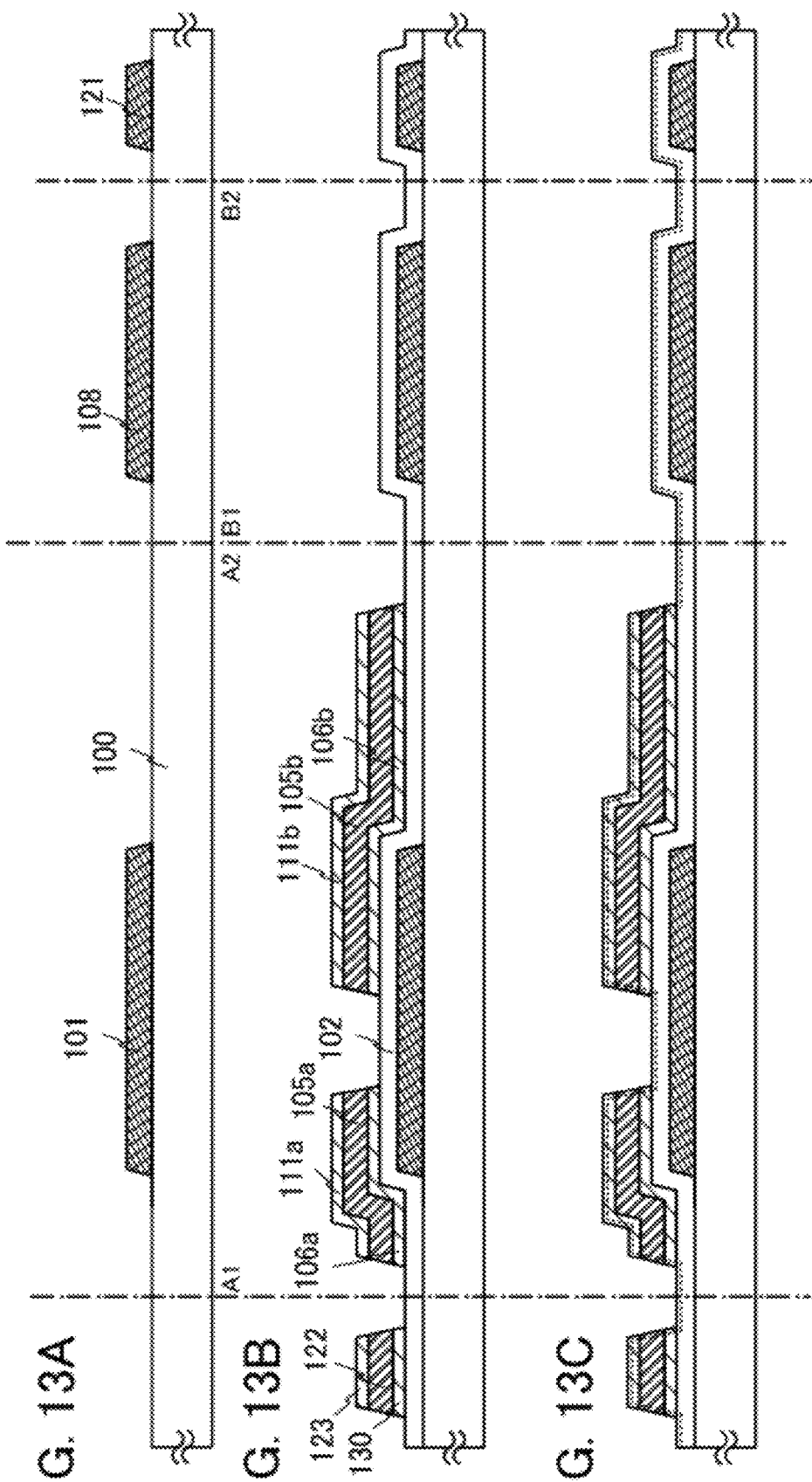

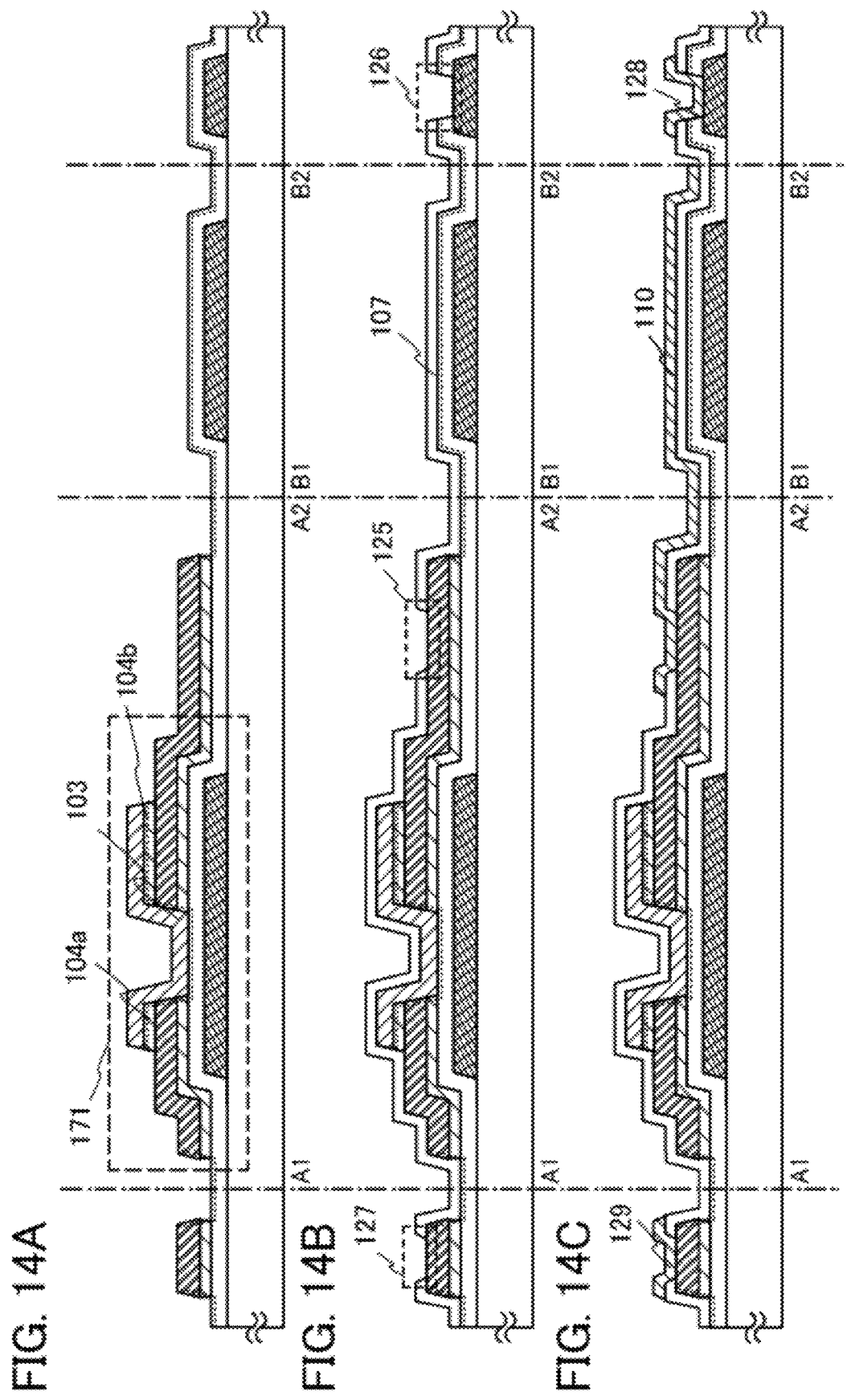

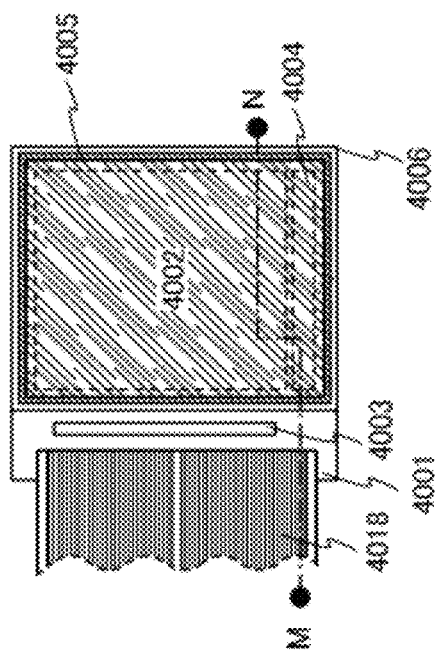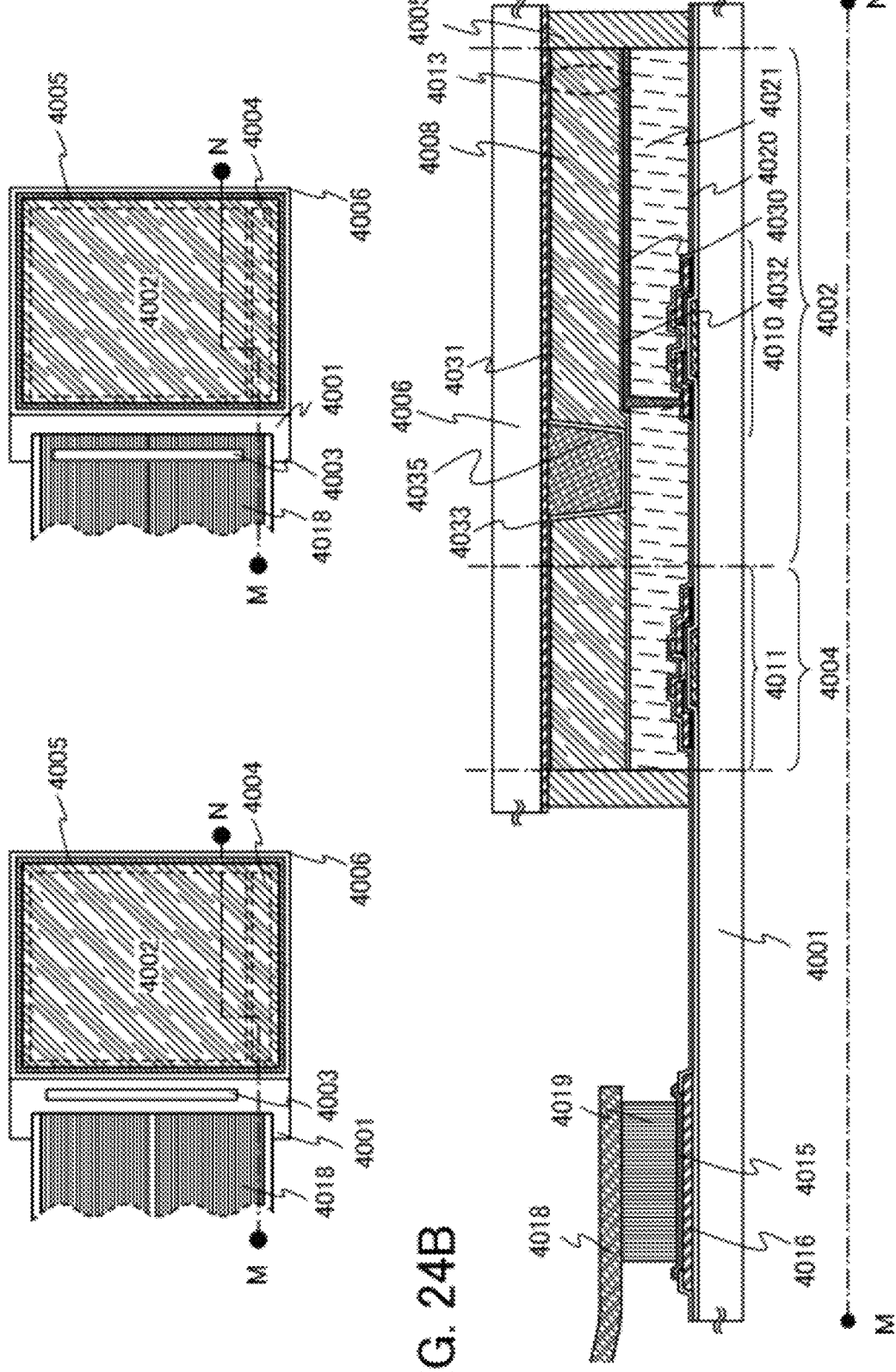

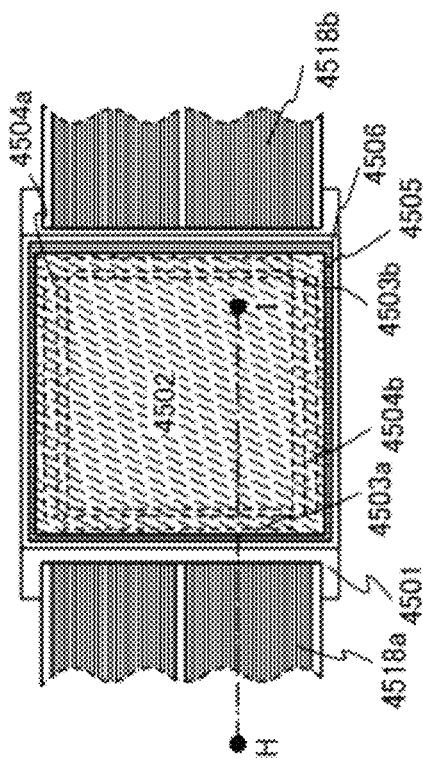
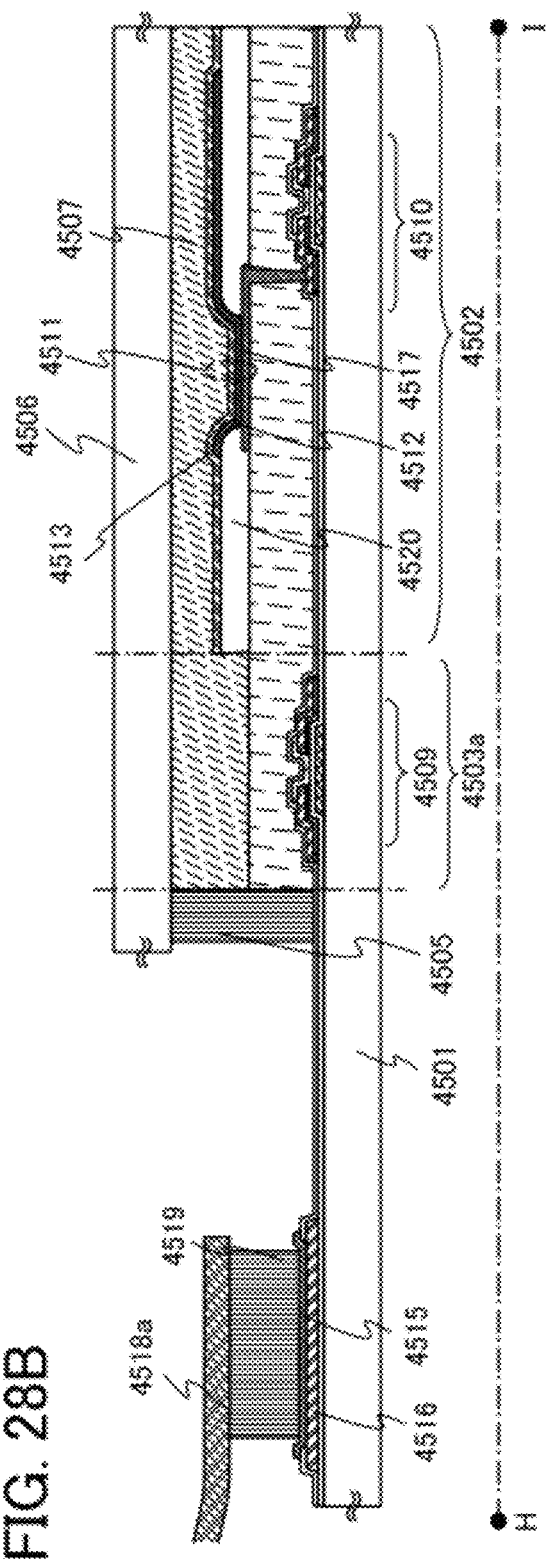
FIG. 28A
FIG. 28B

DISPLAY DEVICE WITH PIXEL PORTION AND COMMON CONNECTION PORTION HAVING OXIDE SEMICONDUCTOR LAYERS

TECHNICAL FIELD

The present invention relates to a display device using an oxide semiconductor and a manufacturing method of the same.

BACKGROUND ART

As typically seen in a liquid crystal display device, a thin film transistor formed on a flat plate such as a glass substrate is manufactured using amorphous silicon or polycrystalline silicon. Although the field effect mobility of an amorphous silicon thin film transistor is low, it can be formed on a large glass substrate. On the other hand, the field effect mobility of a polycrystalline silicon thin film transistor is high; however, it cannot always be formed on a large glass substrate because of a crystallization process such as laser annealing.

Techniques have attracted attention, where a thin film transistor using an oxide semiconductor is manufactured and applied to electronic devices or optical devices. Examples of the techniques are disclosed in Reference 1 and Reference 2, where a thin film transistor is manufactured using zinc oxide or an In—Ga—Zn—O based oxide semiconductor used for an oxide semiconductor film and used as a switching element or the like of an image display device.

REFERENCES

Patent Document

Reference 1: Japanese Published Patent Application No. 2007-123861
Reference 2: Japanese Published Patent Application No. 2007-096055

DISCLOSURE OF INVENTION

The field effect mobility of the thin film transistor using an oxide semiconductor in a channel formation region is higher than that of the amorphous silicon thin film transistor. The oxide semiconductor film can be formed by a sputtering method and the like at a temperature of 300° C. or lower. The manufacturing process is easier than that of a polycrystalline silicon thin film transistor.

Such an oxide semiconductor is expected to be used for forming a thin film transistor on a glass substrate, a plastic substrate, or the like, and to be applied to a liquid crystal display device, an electroluminescent display device, electronic paper, or the like.

The oxide semiconductor thin film transistor has superior operating characteristics and can be manufactured at a low temperature. In order to make efficient use of these features, a structure and manufacturing conditions of elements need to be optimized, and it is also necessary to consider the structure of wirings needed to input and output signals and the connection structure of the wirings. Despite the fact that an oxide semiconductor film can be formed at a low temperature, the product can be defective if a thin film of a metal or the like used for a wiring or an electrode, or an insulating film such as an interlayer insulating film, is separated. In addition, if the connection resistance of electrodes in a common connection portion provided on an element substrate side of a display panel is high, there is a problem that spots appear on the display screen and thus the luminance is decreased.

An object of an embodiment of the present invention is to provide a structure suitable for a common connection portion provided on a display panel.

Another object of an embodiment of the present invention is to prevent a defect due to the separation of a thin film in various kinds of display devices that are manufactured using stacked layers of an oxide semiconductor, an insulating film, and a conductive film.

An embodiment of the present invention is a display device including a pixel portion that includes a pixel electrode arranged in a matrix form and where a scan line and a signal line are crossed each other, and where a thin film transistor provided so as to correspond to the pixel electrode and formed with stacking at least two kinds of oxide semiconductor layers that contain different amounts of oxygen. In this display device, in an outer region of the pixel portion, a common connection portion is provided. The common connection portion includes a conductive layer forming the scan line, the signal line, or a common potential line; a semiconductor layer formed using the same material as the oxide semiconductor layers included in the thin film transistor; and a common electrode that is electrically connected to an electrode opposite to the pixel electrode.

An example of an embodiment of the present invention is a display device including a pixel portion including a thin film transistor connected to a pixel electrode, and a common connection portion where a common electrode is electrically connected to an electrode opposite to the pixel electrode, and having the following structures.

In the pixel portion, a scan line and a signal line are crossed each other and the pixel electrode is arranged in a matrix form.

The thin film transistor provided so as to correspond to the pixel electrode includes a first oxide semiconductor layer serving as a channel formation region, a gate electrode connected to the scan line, a gate insulating layer covering the gate electrode, a first wiring layer that is connected to the signal line and in contact with the first oxide semiconductor layer and formed by stacking a second oxide semiconductor layer (also referred to as a source region) and a conductive layer (also referred to as a source electrode layer), and a second wiring layer that is connected to the pixel electrode and in contact with the first oxide semiconductor layer, and has the same stacked structure as that of the first wiring layer.

The common connection portion provided in the outer region of the pixel portion includes an oxide semiconductor layer formed using the same layer as the second oxide semiconductor layer and a conductive layer (also referred to as the common potential line) formed using the same layer as the conductive layer in the pixel portion stacked over an insulating layer formed using the same layer as the gate insulating layer. The conductive layer (also referred to as the common potential line) is connected to the common electrode through an opening in an interlayer insulating layer provided on the first oxide semiconductor layer, and an electrode opposite to the pixel electrode is electrically connected to the common electrode through conductive particles such as plastic particles plated with gold.

Note that the term "the electrode opposite to the pixel electrode" refers to a counter electrode provided on a counter substrate.

In an example of an embodiment of the present invention, the common connection portion provided in the outer region of the pixel portion has another structure where a first conductive layer formed using the same layer as a gate electrode, over the same insulating layer as the gate insulating layer, an oxide semiconductor layer formed using the same layer as a second oxide semiconductor layer, and a second conductive layer (also referred to as a common potential line) formed using the same layer as the conductive layer in the pixel portion are stacked. The first and second conductive layers are electrically connected to a common electrode through a plurality of openings in an interlayer insulating layer provided on a first oxide semiconductor layer, and the common electrode is electrically connected to an electrode opposite to a pixel electrode through conductive particles arranged in a region overlapping with the first conductive layer.

Here, the oxygen concentration in the first oxide semiconductor layer is higher than that in the second oxide semiconductor layer. In other words, the first oxide semiconductor layer is of an oxygen-excess type whereas the second oxide semiconductor layer is of an oxygen-deficiency type. The second oxide semiconductor layer has n-type conductivity, and the electric conductivity of the first oxide semiconductor layer is lower than that of the second oxide semiconductor layer. The second oxide semiconductor layer can serve as a source region and a drain region of the thin film transistor. The first oxide semiconductor layer has an amorphous structure whereas the second oxide semiconductor layer can include a crystal grain (a nanocrystal) in the amorphous structure. Note that the second oxide semiconductor layer is a non-single-crystal semiconductor layer, and includes at least an amorphous component.

Note that ordinal numbers such as "first" and "second" in this specification are used for convenience. Therefore, they do not denote the order of steps, the stacking order of layers, and particular names which specify the invention.

A substrate that includes a pixel electrode and a thin film transistor electrically connected to the pixel electrode on a surface is fixed to the counter substrate with an adhesive called a sealant.

In a liquid crystal display device, a liquid crystal material is sealed between two substrates with a sealant.

The sealant is mixed with a plurality of conductive particles such as plastic particles plated with gold; accordingly, the counter electrode (also referred to as the common electrode) provided on the counter substrate and the common electrode or common potential line on the other substrate are electrically connected.

The common potential line can be formed on the same substrate through the same manufacturing process as the thin film transistor.

In addition, a portion where the common potential line overlaps with the conductive particles in the sealant can be called a common connection portion. The portion where the common potential line overlaps with the conductive particles can also be called a common electrode.

The common potential line formed on the same substrate as the thin film transistor can be referred to as a line to supply a reference voltage to be used as a reference when a liquid crystal is driven by an alternating current.

In addition to the common potential line connected to the counter electrode, a capacitor wiring connected to one electrode of a storage capacitor can be regarded as a variation of the common potential line and formed on the same substrate as the thin film transistor in a similar way.

A display device using an electrophoretic display element, which is also referred to as electronic paper, has a structure in which white particles, black particles having an opposite polarity to the white particles, and a dispersion medium (gas or liquid) for dispersing them are included between a pair of substrates. An electrode provided on one of the pair of substrates is a common electrode. Pixel electrodes are provided on the other substrate so as to face the common electrode. A plurality of thin film transistors to be electrically connected to the pixel electrodes are also arranged on the substrate. In the operation of the display device using electrophoretic display element, for example, a voltage positive to the common potential applied to the common electrode is applied to the pixel electrode for turning a white display to a black display; a voltage negative to the common potential applied to the common electrode is applied to the pixel electrode for turning the black display to the white display; or the pixel electrode for not changing the display is set at the same potential as the common potential.

The common potential line formed on the same substrate as the thin film transistor can be referred to as a line to supply a reference voltage to be used as a reference when the electrophoretic display element is operated.

Note that the display device using the electrophoretic display element includes a plurality of separated spaces of a uniform size formed by the pair of substrates and partitions provided between the pair of substrates. A separated space serves as a pixel unit, displaying part of an image. A separated space includes a plurality of white particles and black particles having the opposite polarity to the white particles and a dispersion medium (gas or liquid) for dispersing them.

Also in the display device using the electrophoretic display element, a plurality of colored particles having different polarities and the dispersion medium for dispersing them are sealed between the two substrates with a sealant. In addition, in the display device using the electrophoretic display element, the common electrode provided on one substrate and the common potential line formed on the other substrate are electrically connected through the conductive particles in the common connection portion.

A plastic film can be used as a material for the pair of substrates to be used in the liquid crystal display device or the display device using the electrophoretic display element, depending on a temperature of the manufacturing process.

According to an embodiment of the present invention, by stacking the oxide semiconductor layer and the conductive layer in the common connection portion provided in the outer region of the pixel portion, a defect due to the separation of a thin film can be prevented.

In addition, by stacking the oxide semiconductor layer and the conductive layer, the common connection portion becomes thick; accordingly, the resistance can be reduced and the structure can be strong.

BRIEF DESCRIPTION OF DRAWINGS

FIGS. 4A to 4C are cross-sectional views each illustrating a semiconductor device according to an embodiment of the present invention in its manufacturing process.

FIGS. 5A to 5C are cross-sectional views each illustrating a semiconductor device according to an embodiment of the present invention in its manufacturing process.

FIGS. 10A and 10B respectively illustrate a top view and a cross-sectional view of an end portion of semiconductor devices according to an embodiment of the present invention.

FIGS. 13A to 13C are cross-sectional views each illustrating a semiconductor device according to an embodiment of the present invention in its manufacturing process.

FIGS. 14A to 14C are cross-sectional views each illustrating a semiconductor device according to an embodiment of the present invention in its manufacturing process.

FIGS. 24A and 24B respectively illustrate a top view and a cross-sectional view of semiconductor devices according to an embodiment of the present invention.

FIGS. 28A and 28B respectively illustrate a top view and a cross-sectional view of a semiconductor device according to an embodiment of the present invention.

BEST MODE FOR CARRYING OUT THE INVENTION

Embodiments of the present invention are described hereinafter.

(Embodiment 1)

This embodiment shows an example of a liquid crystal display device in which a liquid crystal layer is sealed between a first substrate and a second substrate, and a common connection portion is formed on the first substrate to be electrically connected to a counter electrode provided on the second substrate. Note that a thin film transistor is formed as a switching element on the first substrate, and the common connection portion is formed through the same manufacturing process as the switching element in a pixel portion so that the process is not complicated.

The common connection portion is provided in a position overlapping with a sealant for bonding the first substrate and the second substrate and is electrically connected to a counter electrode through conductive particles in the sealant. Alternatively, the common connection portion is provided in a position which does not overlap with the sealant (except for the pixel portion) and a paste including conductive particles is provided separately from the sealant so as to overlap with the common connection portion so that the common connection portion can be electrically connected to the counter electrode.

Figure 1A:
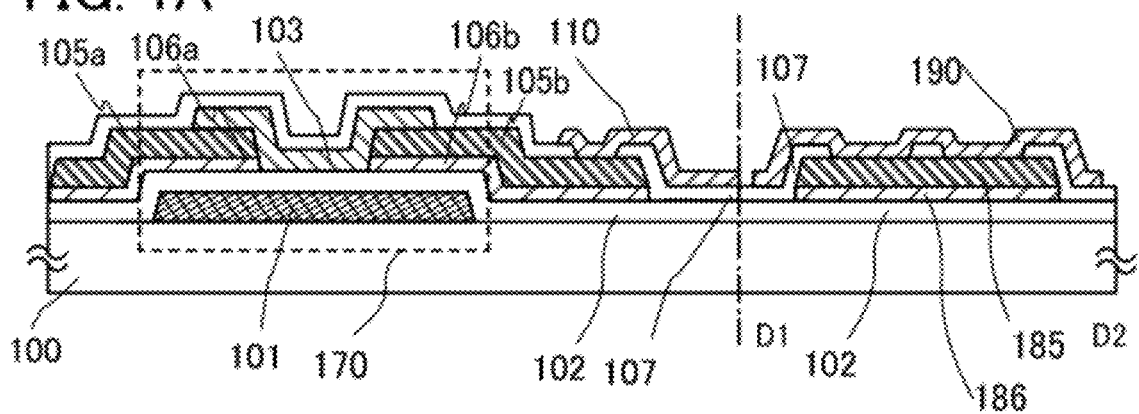
FIGS. 1A and 1B respectively illustrate a cross-sectional view and a top view of a semiconductor device according to an embodiment of the present invention.

FIG. 1A illustrates a cross-sectional view of a structure of a semiconductor device in which a thin film transistor and a common connection portion are formed on the same substrate. Note that the thin film transistor illustrated in FIG. 1A includes a source electrode layer 105a and a drain electrode layer 105b over a gate insulating layer 102 with a source region 106a and a drain region 106b interposed therebetween. The thin film transistor in this example further includes an IGZO semiconductor layer 103 on the source electrode layer 105a and the drain electrode layer 105b. The IGZO semiconductor layer 103 is a non-single-crystal semiconductor layer including In, Ga, Zn, and O and including at least an amorphous component. The source region 106a and the drain region 106b are oxide layers including In, Ga, Zn, and O. Formed under different conditions from the IGZO semiconductor layer 103, the oxide layers have a lower oxygen concentration and lower resistance than the IGZO semiconductor layer 103. The source region 106a and the drain region 106b can also be referred to as an n$^+$ region having n-type conductivity and an activation energy ($\Delta$E) of from 0.01 eV to 0.1 eV, inclusive. Note that the source region 106a and the drain region 106b are non-single-crystal semiconductor layers, and include at least an amorphous component.

Figure 1B:
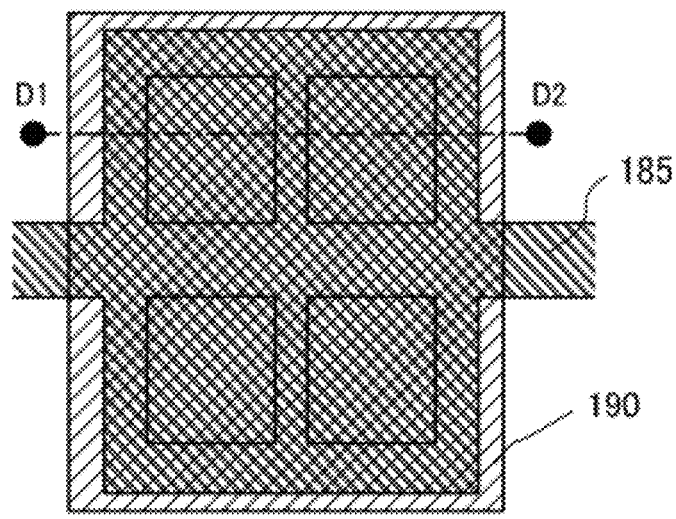

FIG. 1B illustrates an example of a top view of the common connection portion. Dashed line D1-D2 in FIG. 1B corresponds to a cross section of the common connection portion in FIG. 1A. Note that portions similar to those in FIGS. 1A and 1B are denoted by the same reference numerals.

An oxide semiconductor layer 186 is provided on the gate insulating layer 102, and formed using the same material and through the same process as the source region 106a and the drain region 106b.

A common potential line 185 is provided on the oxide semiconductor layer 186 and formed using the same material and through the same process as the source electrode layer 105a and the drain electrode layer 105b.

The common potential line 185 is covered with a protective insulating film 107 having a plurality of openings in a position overlapping with the common potential line 185. The openings are formed through the same process as a contact hole to connect the drain electrode layer 105*b* and the pixel electrode 110.

Note that the contact hole in the pixel portion and the openings in the common connection portion are distinctively described because their sizes differ considerably. In FIG. 1A, the pixel portion and the common connection portion are not illustrated on the same scale. For example, the length of dashed line D1-D2 in the common connection portion is about 500 μm, and the width of the thin film transistor is less than 50 μm; thus, the area of the common connection portion is ten times or more as large as that of the thin film transistor. However, the scales of the pixel portion and the common connection portion are changed in FIG. 1A for simplification.

The common electrode 190 is provided on the protective insulating film 107 and formed using the same material and through the same process as the pixel electrode 110 in the pixel portion.

In this manner, the common connection portion is manufactured through the same process as the switching element in the pixel portion.

The first substrate provided with the pixel portion and the common connection portion and the second substrate having the counter electrode are fixed with the sealant.

In the case where conductive particles are included in the sealant, the pair of substrates is fixed such that the sealant and the common connection portion overlap with each other. For example, in the case of a small liquid crystal panel, two common connection portions overlap with the sealant at opposite corners of the pixel portion and the like. In the case of a large liquid crystal panel, four or more common connection portions overlap with the sealant.

Note that the common electrode 190 is in contact with the conductive particles in the sealant and thus it is electrically connected to the counter electrode on the second substrate.

In the case of using a liquid crystal injection method, after the pair of substrates is fixed with the sealant, liquid crystals are injected between the pair of substrates. In the case of using a liquid crystal dropping method, after the sealant is drawn on the second substrate or the first substrate and liquid crystals are dropped thereon, the pair of substrates is bonded to each other under a reduced pressure.

This embodiment shows an example in which the common connection portion is electrically connected to the counter electrode; however, the present invention is not limited to the above case. The present invention can be applied to the case where a connection portion is connected to another wiring, the case where a connection portion is connected to an external connection terminal, or the like.

For example, in the case of manufacturing a light-emitting display device, unlike a liquid crystal display device, there is no connection portion to be connected to the counter electrode. Instead, the light-emitting display device has a portion to connect a cathode (negative electrode) of a light-emitting element to a common wiring. The structure of the portion may be the same as the connection structure illustrated in FIG. 1A. The cathode of the light-emitting element may be provided with a connection portion in each pixel. Alternatively, the connection portion may be provided between a pixel portion and a driver circuit portion.

(Embodiment 2)

Figure 2A:
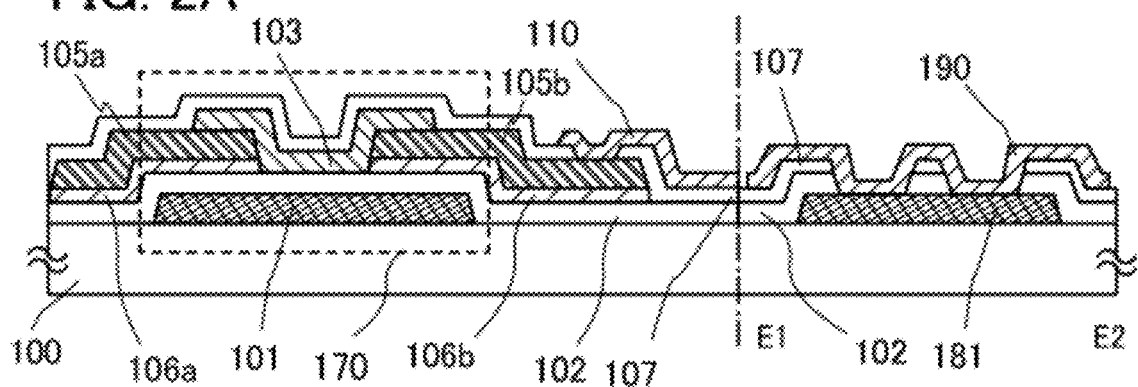
FIGS. 2A and 2B respectively illustrate a cross-sectional view and a top view of a semiconductor device according to an embodiment of the present invention.
Figure 2B:
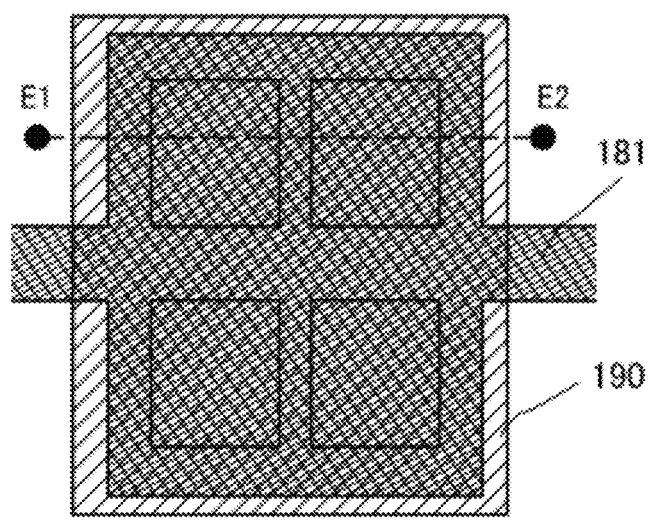

In this embodiment, an example of manufacturing a common connection portion, in which a wiring formed using the same material and through the same process as a gate wiring is used as a common potential line, will be illustrated in FIGS. 2A and 2B.

FIG. 2B illustrates an example of a top view of the common connection portion. Dashed line E1-E2 in FIG. 2B corresponds to a cross section of the common connection portion of FIG. 2A.

Note that as illustrated in FIG. 2A, a thin film transistor in a pixel portion has the same structure as that of Embodiment 1; thus, portions similar to those in FIG. 1A are denoted by the same reference numerals and detailed description is omitted here.

A common potential line 181 is provided over a substrate 100 and formed using the same material and through the same process as the gate electrode 101.

In addition, the common potential line 181 is covered with the gate insulating layer 102 and the protective insulating film 107. The gate insulating layer 102 and the protective insulating film 107 have a plurality of openings at positions overlapping with the common potential line 181. These openings, unlike in Embodiment 1, have a large depth which corresponds to the thickness of the two insulating layers. Note that these openings are formed by etching through the same process as a contact hole for connecting the drain electrode layer 105*b* and a pixel electrode 110, and then further etching the gate insulating layer selectively.

The common electrode 190 is provided over the protective insulating film 107 and formed using the same material and through the same process as the pixel electrode 110 in the pixel portion.

In this manner, the common connection portion is manufactured through the same process as the switching element in the pixel portion.

Then, the first substrate 100 provided with the pixel portion and the common connection portion is fixed to a second substrate provided with a counter electrode with a sealant.

In the case where the sealant contains conductive particles, the pair of substrates is aligned so that the sealant overlaps with the common connection portion.

Note that the common electrode 190 is an electrode in contact with the conductive particles contained in the sealant, and is electrically connected to the counter electrode of the second substrate.

In the case of using a liquid crystal injection method, after the pair of substrates is fixed with the sealant, liquid crystals are injected between the pair of substrates. In the case of using a liquid crystal dropping method, after the sealant is drawn on the second substrate or the first substrate and liquid crystals are dropped thereon, the pair of substrates is bonded to each other under a reduced pressure.

This embodiment shows an example in which the common connection portion is electrically connected to the counter electrode; however, the present invention is not limited to the above case. The present invention can be applied to the case where a connection portion is connected to another wiring, the case where a connection portion is connected to an external connection terminal, or the like.

(Embodiment 3)

Figure 3A:
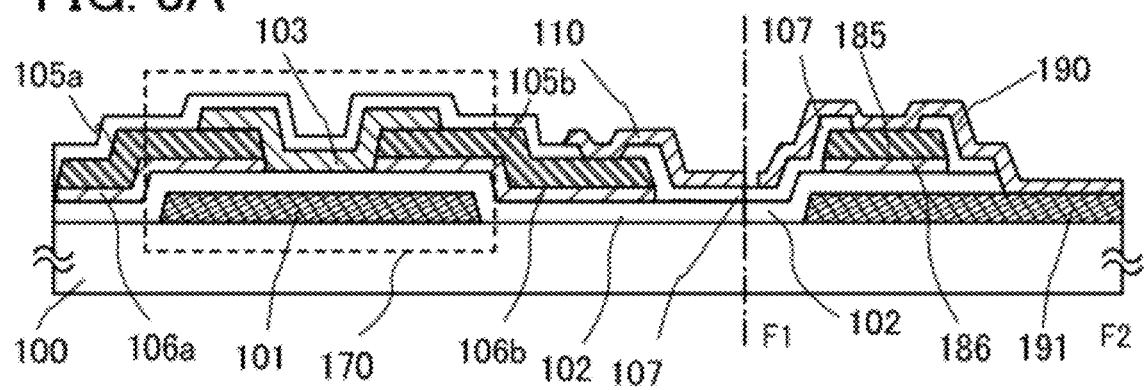
FIGS. 3A and 3B respectively illustrate a cross-sectional view and a top view of a semiconductor device according to an embodiment of the present invention.
Figure 3B:
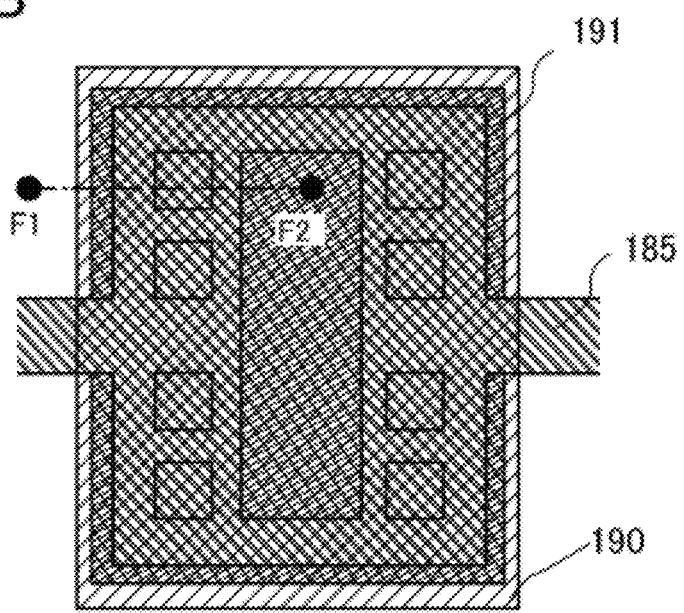

In this embodiment, an example of manufacturing a common connection portion, in which an electrode formed using the same material and through the same process as a gate wiring is formed and a wiring formed using the same material and through the same process as a source electrode layer is provided as a common potential line over the electrode, will be illustrated in FIGS. 3A and 3B.

FIG. 3B illustrates an example of a top view of the common connection portion. Dashed line F1-F2 in FIG. 3B corresponds to a cross section of the common connection portion of FIG. 3A.

Note that as illustrated in FIG. 3A, a thin film transistor in a pixel portion has the same structure as that of Embodiment 1; thus, portions similar to those in FIG. 1A are denoted by the same reference numerals and detailed description is omitted here.

A connection electrode 191 is provided over the substrate 100 and formed using the same material and through the same process as the gate electrode 101.

In addition, the connection electrode 191 is covered with the gate insulating layer 102 and the protective insulating film 107. The gate insulating layer 102 and the protective insulating film 107 have an opening at a position overlapping with the common electrode 190. This opening, unlike in Embodiment 1, has a large depth which corresponds to the thickness of the two insulating layers. Note that this opening is manufactured by etching through the same process as a contact hole for connecting the drain electrode layer 105b and the pixel electrode 110, and then further etching the gate insulating layer selectively.

The oxide semiconductor layer 186 is provided on the gate insulating layer 102 and formed using the same material and through the same process as the source region 106a and the drain region 106b.

The common potential line 185 is provided on the oxide semiconductor layer 186 and formed using the same material and through the same process as the source electrode layer 105a and the drain electrode layer 105b.

The common potential line 185 is covered with the protective insulating film 107, and the protective insulating film 107 has a plurality of openings at positions overlapping with the common potential line 185. These openings are formed through the same process as a contact hole for connecting the drain electrode layer 105b and the pixel electrode 110.

The common electrode 190 is provided over the protective insulating film 107 and formed using the same material and through the same process as the pixel electrode 110 in the pixel portion.

In this manner, the common connection portion is manufactured through the same process as the switching element in the pixel portion.

Then, the first substrate 100 provided with the pixel portion and the common connection portion is fixed to a second substrate provided with a counter electrode with a sealant.

Note that in this embodiment, a plurality of conductive particles are selectively disposed in the opening of the gate insulating layer. That is, the plurality of conductive particles are disposed in a region where the common electrode 190 and the connection electrode 191 are in contact with each other. The common electrode 190 touching both the connection electrode 191 and the common potential line 185 is an electrode in contact with the conductive particles, and is electrically connected to the counter electrode of the second substrate.

In the case of using a liquid crystal injection method, after the pair of substrates is fixed with the sealant, liquid crystals are injected between the pair of substrates. In the case of using a liquid crystal dropping method, after the sealant is drawn on the second substrate or the first substrate and liquid crystals are dropped thereon, the pair of substrates is bonded to each other under a reduced pressure.

This embodiment shows an example in which the common connection portion is electrically connected to the counter electrode; however, the present invention is not limited to the above case. The present invention can be applied to the case where a connection portion is connected to another wiring, the case where a connection portion is connected to an external connection terminal, or the like.

(Embodiment 4)

This embodiment shows a thin film transistor 170, a connection portion, and a terminal portion illustrated in FIGS. 1A, 2A, and 3A, and a manufacturing process of these with reference to FIGS. 4A to 4C, FIGS. 5A to 5C, FIGS. 6 to 9, and FIGS. 10A and 10B.

In FIG. 4A, as the light-transmitting substrate 100, it is possible to use a glass substrate made of barium borosilicate glass, aluminoborosilicate glass, or the like typified by #7059 glass, #1737 glass, or the like manufactured by Corning Incorporated.

Figure 6:
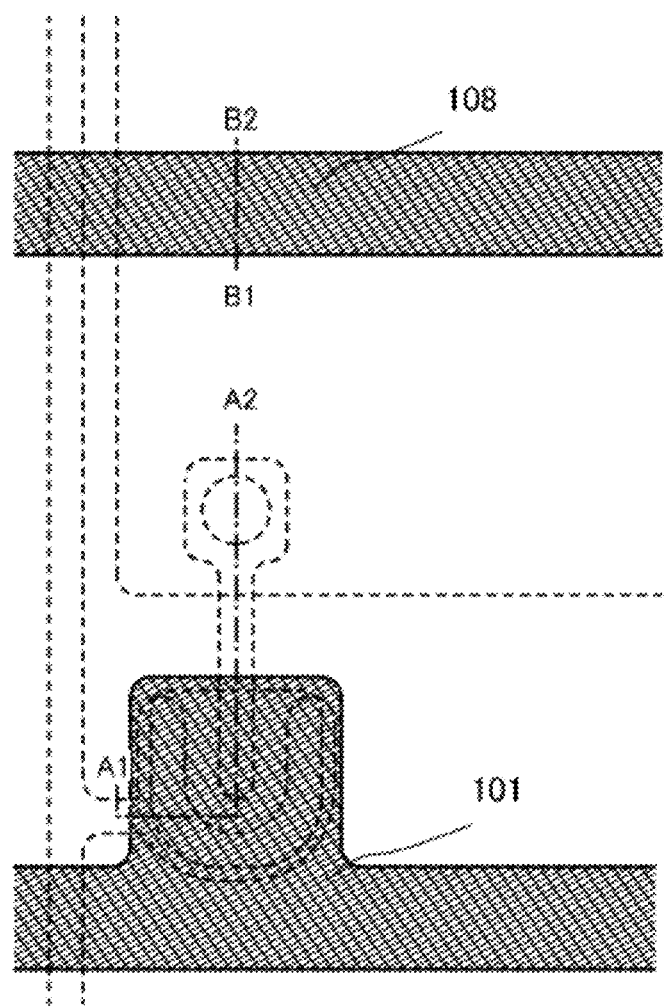
FIG. 6 illustrates a top view of a semiconductor device according to an embodiment of the present invention.

After a conductive layer is formed on the entire surface of the substrate 100, a resist mask is formed through a first photolithography process. Then, unnecessary portions are removed by etching to form wirings and electrodes (a gate wiring including the gate electrode 101, a capacitor wiring 108, and a first terminal 121). At that time, etching is performed so that at least the edge of the gate electrode 101 is tapered. FIG. 4A illustrates a cross-sectional view at this stage. Note that FIG. 6 illustrates a top view at this stage.

The gate wiring including the gate electrode 101, the capacitor wiring 108, and the first terminal 121 in the terminal portion are preferably formed using a low-resistant conductive material such as aluminum (Al) or copper (Cu). However, aluminum alone has the disadvantages of low heat resistance, being easily corroded, and the like; thus, it is used in combination with a conductive material having heat resistance. As the conductive material having heat resistance, it is possible to use an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any one of these elements, or a nitride containing any one of these elements as its component.

Then, the gate insulating layer 102 is formed on the entire surface of the gate electrode 101. The gate insulating layer 102 is formed to have a thickness of 50 nm to 250 nm by sputtering or the like.

For example, as the gate insulating layer 102, a silicon oxide film is formed to have a thickness of 100 nm by sputtering. It is needless to say that the gate insulating layer 102 is not limited to such a silicon oxide film, and other insulating films such as a silicon oxynitride film, a silicon nitride film, an aluminum oxide film, or a tantalum oxide film may be used to form a single-layer structure or a multi-layer structure.

Then, a first IGZO film is deposited over the gate insulating layer 102 by sputtering. Here, with the use of a target of $In_2O_3:Ga_2O_3:ZnO=1:1:1$, sputtering deposition is performed at a pressure of 0.4 Pa, a power of 500 W, a temperature of room temperature, and an argon gas flow rate of 40 sccm. Despite the intentional use of the target of $In_2O_3:Ga_2O_3:ZnO=1:1:1$, an IGZO film including crystal grains having a diameter of 1 nm to 10 nm is formed in some cases immediately after deposition. It is said that the presence, density, and diameter of crystal grains can be controlled by adjusting the deposition conditions of reactive sputtering as appropriate, such as the composition ratio of a target, the deposition pressure (0.1 Pa to 2.0 Pa), the power (250 W to 3000 W: 8 inches φ), or the temperature (room temperature to 100° C.). The diameter of crystal grains is controlled within a range of 1 nm to 10 nm. The thickness of the first IGZO film is 5 nm to 20 nm. It is needless to say that, if the film includes crystal grains, the diameter of the crystal grains does not exceed the thickness of the film. In this embodiment, the thickness of the first IGZO film is 5 nm.

Then, a conductive film made of a metal material is formed over the first IGZO film by sputtering or vacuum evaporation.

As the material of the conductive film, there are an element selected from Al, Cr, Ta, Ti, Mo, and W, an alloy containing any of these elements as its component, an alloy containing a combination of any of these elements, and the like. If heat treatment at 200° C. to 600° C. is performed, the conductive film preferably has heat resistance enough to withstand the heat treatment. Since aluminum alone has the disadvantages of low heat resistance, being easily corroded, and the like, it is used in combination with a conductive material having heat resistance. As the conductive material having heat resistance which is combined with aluminum, it is possible to use an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, or a nitride containing any of these elements as its component. Here, the conductive film of a three-layer structure in which a titanium film, an aluminum film containing neodymium (an Al—Nd film), and a titanium film are stacked in order. Alternatively, the conductive film may have a two-layer structure in which a titanium film is stacked on an aluminum film. Further alternatively, the conductive film may have a single-layer structure of an aluminum film containing silicon or a single-layer structure of a titanium film.

The gate insulating layer, the first IGZO film, and the conductive film can be formed successively by a sputtering method by changing gases introduced into a chamber or targets set therein as appropriate without being exposed to the atmosphere. Such a successive formation without the exposure to the atmosphere prevents impurities to be mixed in. In such a case, a multi-chamber system manufacturing apparatus is preferably used.

Next, a resist mask is formed through a second photolithography process and unnecessary portions are removed by etching to form the source electrode layer 105a and the drain electrode layer 105b. Either a wet etching or a dry etching is employed in this etching process. Here, a dry etching is performed using a mixed gas of $SiCl_4$, $Cl_2$, and $BCl_3$ as a reaction gas to etch the conductive film of a titanium film, an aluminum film, and a titanium film stacked in this order so that the source electrode layer 105a and the drain electrode layer 105b are formed.

In the second photolithography process, the second terminal 122 formed using the same material as the source electrode layer 105a and the drain electrode layer 105b remains in the terminal portion. Note that the second terminal 122 is electrically connected to a source wiring (a source wiring including the source electrode layer 105a).

Figure 7:
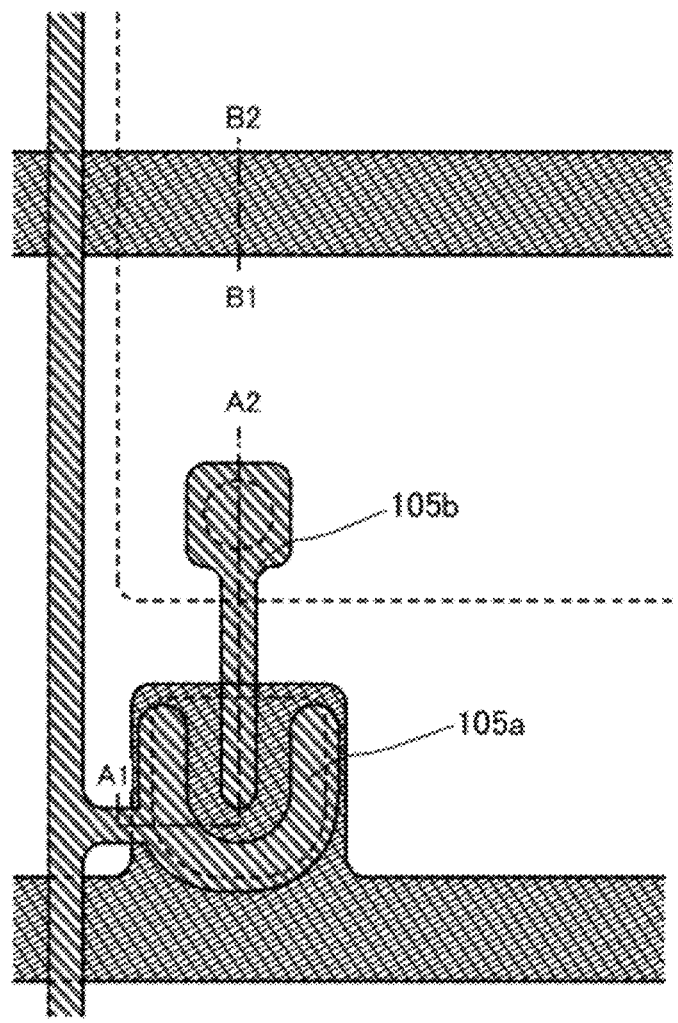
FIG. 7 illustrates a top view of a semiconductor device according to an embodiment of the present invention.

Next, the first IGZO film is etched in a self-alignment manner where the source electrode layer 105a and the drain electrode layer 105b are used as masks. Here, a wet etching is performed using ITO07N (produced by KANTO CHEMICAL CO., INC.) and unnecessary portions are removed by etching to form the source region 106a and the drain region 106b. The etching here is not limited to a wet etching but a dry etching may also be employed. FIG. 4B illustrates a cross-sectional view at this stage. Note that FIG. 7 illustrates a top view at this stage.

In the capacitor portion, the first IGZO film overlapping with the capacitor wiring 108 is removed. In the terminal portion, a part of the first IGZO film 130, which exists under the second terminal 122 and overlaps with the second terminal 122, remains.

After the resist mask is removed, plasma treatment is performed. FIG. 4C illustrates a cross-sectional view at this stage. Here, a reverse sputtering is performed in which an argon gas is introduced and plasma is generated to remove dust attached to a surface. In this manner, dust such as etching residue of the resist mask attached on the surface is removed. The plasma treatment is not limited to that using only the argon gas, but an $N_2O$ gas or an oxygen gas may also be used. Alternatively, the plasma treatment may be performed in a nitrogen atmosphere including oxygen, a helium atmosphere including oxygen, or an argon atmosphere including oxygen. In the plasma treatment in the argon atmosphere including oxygen, the surface of the thin film is modified by introducing the argon gas and the oxygen gas and generating plasma. An argon atom (Ar) in a reactive space in which an electric field is applied and discharge plasma is generated is excited or ionized by an electron (e) in the discharge plasma to be converted into an argon radical (Ar*), an argon ion (Ar$^+$), or an electron (e). An argon radical (Ar*) is in a metastable state with high energy, and tends to return to a stable state by reacting with an atom of the same kind or a different kind in its vicinity and exciting or ionizing the atom; thus, a reaction occurs like an avalanche. In the presence of oxygen in its vicinity at that time, an oxygen atom (O) is excited or ionized to be converted into an oxygen radical (O*), an oxygen ion (O$^+$), or oxygen (O). The oxygen radical (O*) reacts with a material on a surface of a thin film that is an object to be treated. In this plasma treatment, the surface is modified in a way that the oxygen radical reacts with an organic substance on the surface and the organic substance is removed. Note that a feature of a radical of an inert gas such as helium or argon is to maintain a metastable state for a longer period compared to a radical of a reactive gas; accordingly, an inert gas is generally used to generate plasma. It is useful to perform oxygen radical treatment on a surface of the gate insulating layer to form an oxygen-excess region on the surface because it can serve as an oxygen supplying source for modifying the interface of the IGZO semiconductor layer in heat treatment (at 200° C. to 600° C.) in a later process for enhancing the reliability. Alternatively, oxygen radicals may be supplied by a plasma generating apparatus using a gas including oxygen or an ozone generating apparatus. The surface of the thin film can be modified when exposed to the oxygen radicals or oxygen supplied.

After the plasma treatment, a second IGZO film is formed without being exposed to the atmosphere. The formation of the second IGZO film after the plasma treatment without the exposure to the atmosphere is useful because dust or moisture is not attached to the interface between the gate insulating layer and the semiconductor film. Here, the second IGZO film is formed using an oxide semiconductor target including In, Ga, and Zn ($In_2O_3$ :$Ga_2O_3$:$ZnO=1:1:1$) with a diameter of 8 inches, with the distance between the substrate and the target of 170 mm, a pressure of 0.4 Pa, and a direct current (DC) power source of 0.5 kW, and in an argon atmosphere or an oxygen atmosphere. The use of a pulsed direct current (DC) power source is preferable because dust can be reduced and the thickness of films can be uniform. The thickness of the second IGZO film is 5 nm to 200 nm. In this embodiment, the second IGZO is formed to have a thickness of 100 nm.

Formed under a different condition from that of the first IGZO film, the second IGZO film has a higher oxygen concentration than the first IGZO film does. For example, the gas flow rate ratio of oxygen is higher at the formation of the second IGZO film as compared to the flow rate ratio of oxygen at the formation of the first IGZO film. Specifically, the first IGZO film is formed in an atmosphere of a rare-gas such as argon or helium (alternatively, in an atmosphere containing an oxygen gas at 10% or less and an argon gas at 90% or more) and the second IGZO film is formed in an oxygen atmosphere (alternatively, in an atmosphere in which the flow rate of the argon gas is equal to or less than that of the oxygen gas). Since the amount of oxygen in the second IGZO film is large, the second IGZO film has lower conductivity than the first IGZO film. Further, the large amount of oxygen in the second IGZO film can reduce the off-current; accordingly, a thin film transistor having a high on/off ratio can be obtained.

The second IGZO film may be formed using the same chamber as that previously used for the reverse sputtering. Alternatively, the second IGZO film may be formed using a different chamber from the one used for the reverse sputtering as long as it can be formed without being exposed to the atmosphere.

Next, heat treatment at 200° C. to 600° C., typically 300° C. to 500° C. is preferably performed. Here, the heat treatment is performed at 350° C. for an hour in a nitrogen atmosphere in a furnace. Through the heat treatment, the atomic level of the IGZO film is realigned. The heat treatment including annealing with light is important because strain energy which inhibits carrier movement is released by the heat treatment. Note that the timing of the heat treatment is not limited as long as it is performed after the formation of the second IGZO film. The heat treatment may be performed, for example, after the formation of the pixel electrodes.

Figure 8:
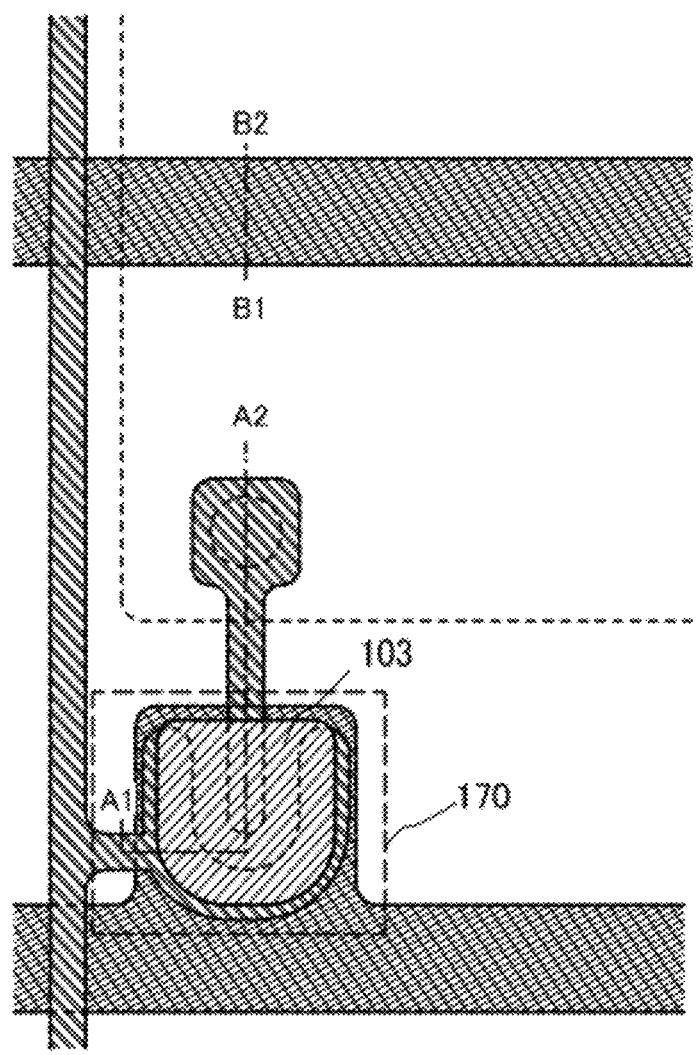
FIG. 8 illustrates a top view of a semiconductor device according to an embodiment of the present invention.

Next, a resist mask is formed through a third photolithography process and unnecessary portions are removed by etching to form the IGZO semiconductor layer 103. Then, the resist mask is removed. Through the above process, the thin film transistor 170 in which the IGZO semiconductor layer 103 serves as a channel formation region is formed. FIG. 5A illustrates a cross-sectional view at this stage. Note that FIG. 8 illustrates a top view at this stage. Here, a wet etching is performed using ITO07N (produced by KANTO CHEMICAL CO., INC.) to remove the second IGZO film and form the IGZO semiconductor layer 103. Since the same etchant is used for etching of the first IGZO film and etching of the second IGZO film, the first IGZO film is also removed through this etching. Accordingly, as illustrated in FIG. 5A, one side of the first IGZO film covered with the second IGZO film is protected; the other side thereof is exposed and its shape is a little changed through the etching process. The etching of the IGZO semiconductor layer 103 is not limited to a wet etching but a dry etching may also be used.

After the resist mask is removed, a protective insulating film 107 is formed to cover the IGZO semiconductor layer 103. The protective insulating film 107 can be formed with a silicon nitride film, a silicon oxide film, a silicon oxynitride film, an aluminum oxide film, a tantalum oxide film, or the like, which is formed by a sputtering method or the like. In addition, oxygen radical treatment is preferably performed on a surface of the IGZO semiconductor layer 103 before the formation of the protective insulating film 107. Plasma treatment, for example, a reverse sputtering can be performed as the oxygen radical treatment on the surface of the IGZO semiconductor layer 103. The reverse sputtering is a method to modify a surface of a thin film on a substrate by plasma generated by applying voltage to the substrate side, instead of to a target side, in an oxygen atmosphere or an atmosphere including oxygen and argon. By the oxygen radical treatment on the surface of the IGZO semiconductor layer 103, the threshold voltage of the thin film transistor 170 is positive and a so-called normally-off switching element can be obtained. It is desirable for a display device that a channel be formed with a threshold voltage that is a positive value and as close to 0 V as possible. If the threshold voltage of the thin film transistor is negative, it tends to be normally on; in other words, current flows between the source electrode and the drain electrode even when the gate voltage is 0 V.

Then, a resist mask is formed through a fourth photolithography process, and the protective insulating film 107 is etched to form a contact hole 125 reaching the drain electrode layer 105b. In addition, a contact hole 127 reaching the second terminal 122 is also formed through the same etching process. In order to reduce the number of masks, the gate insulating layer is preferably etched using the same resist mask so that a contact hole 126 reaching the gate electrode is formed. FIG. 5B illustrates a cross-sectional view at this stage.

Next, the resist mask is removed, and then a transparent conductive film is formed. The transparent conductive film is formed of indium oxide ($In_2O_3$), indium oxide-tin oxide alloy ($In_2O_3$—$SnO_2$, abbreviated to ITO), or the like by sputtering, vacuum evaporation, or the like. Such a material is etched with a hydrochloric acid-based solution. However, since a residue is easily generated particularly in etching ITO, indium oxide-zinc oxide alloy ($In_2O_3$—$ZnO$) may be used to improve etching processability.

Next, a resist mask is formed through a fifth photolithography process, and unnecessary portions of the transparent conductive film are removed by etching to form the pixel electrode 110.

In the fifth photolithography process, a storage capacitor is formed between the capacitor wiring 108 and the pixel electrode 110 by using the gate insulating layer 102 and the protective insulating film 107 in the capacitor portion as a dielectric.

Furthermore, in the fifth photolithography process, the first terminal and the second terminal are covered with the resist mask so that transparent conductive films 128 and 129 remain in the terminal portion. The transparent conductive films 128 and 129 serve as an electrode or a wiring connected to an FPC. The transparent conductive film 129 formed over the second terminal 122 is a connecting terminal electrode serving as an input terminal of a source wiring.

Figure 9:
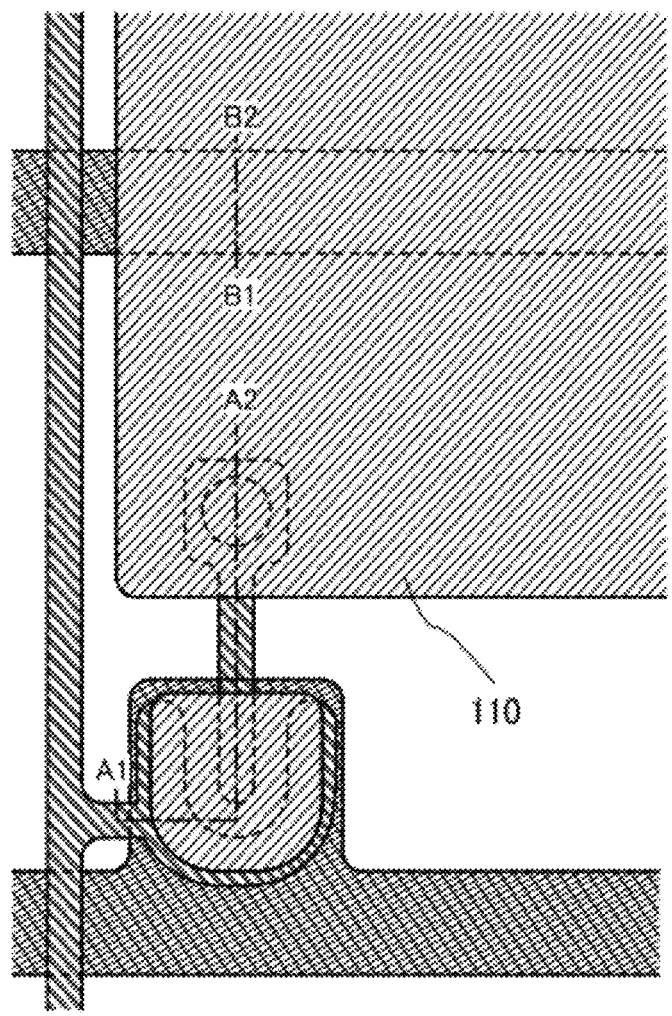
FIG. 9 illustrates a top view of a semiconductor device according to an embodiment of the present invention.

Then, the resist mask is removed. FIG. 5C illustrates a cross-sectional view at this stage. Note that FIG. 9 illustrates a top view at this stage.

FIGS. 10A1 and 10A2 are respectively a cross-sectional view and a top view of a gate wiring terminal portion at this stage. FIG. 10A1 is a cross-sectional view taken along line C1-C2 of FIG 10A2. In FIG 10A1, a transparent conductive film 155 formed over the protective insulating film 154 is a connecting terminal electrode serving as an input terminal. Furthermore, in the terminal portion of FIG 10A1, a first terminal 151 formed using the same material as the gate wiring and a connection electrode 153 formed using the same material as the source wiring overlap with each other with a gate insulating layer 152 interposed therebetween, and are electrically connected to each other through the transparent conductive film 155. Note that a part of FIG. 5C where the transparent conductive film 128 is in contact with the first terminal 121 corresponds to a part of FIG 10A1 where the transparent conductive film 155 is in contact with the first terminal 151. In addition, a first IGZO film 157 is provided between the gate insulating layer 152 and the connection electrode 153.

FIGS. 10B1 and 10B2 are respectively a cross-sectional view and a top view of a source wiring terminal portion which is different from that illustrated in FIG. 5C. FIG 10B1 is a cross-sectional view taken along line G1-G2 of FIG. 10B2. In FIG 10B1, the transparent conductive film 155 formed over the protective insulating film 154 is a connecting terminal electrode serving as an input terminal. Furthermore, in the terminal portion of FIG 10B1, an electrode 156 formed using the same material as the gate wiring is formed under a second terminal 150 electrically connected to the source wiring and overlaps with the second terminal 150 with the gate insulating layer 152 interposed therebetween. The electrode 156 is not electrically connected to the second terminal 150, and a capacitor to prevent noise or static electricity can be formed if the potential of the electrode 156 is set to a potential different from that of the second terminal 150, such as floating, GND, or 0 V. The second terminal 150 is electrically connected to the transparent conductive film 155 with the protective insulating film 154 interposed therebetween. In addition, a first IGZO film 158 is provided between the gate insulating layer 152 and the second terminal 150.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. There is no particular limitation on the number of each of the terminals, and the number of the terminals may be determined by a practitioner as appropriate.

Through these five photolithography processes using five photo masks, a pixel thin film transistor portion including the thin film transistor 170 which is a bottom-gate n-channel thin film transistor, and the storage capacitor can be completed. When these pixel thin film transistor portion and storage capacitor are arranged in a matrix form corresponding to respective pixels, a pixel portion can be formed and one of the substrates for manufacturing an active-matrix display device can be obtained. In this specification, such a substrate is referred to as an active-matrix substrate for convenience.

In the case of manufacturing an active-matrix liquid crystal display device, an active-matrix substrate and a counter substrate provided with a counter electrode are bonded to each other with a liquid crystal layer interposed therebetween. Note that a common electrode electrically connected to the counter electrode on the counter substrate is provided over the active-matrix substrate, and a fourth terminal electrically connected to the common electrode is provided in the terminal portion. The fourth terminal is provided so that the common electrode is fixed to a predetermined potential such as GND or 0 V.

Figure 11:
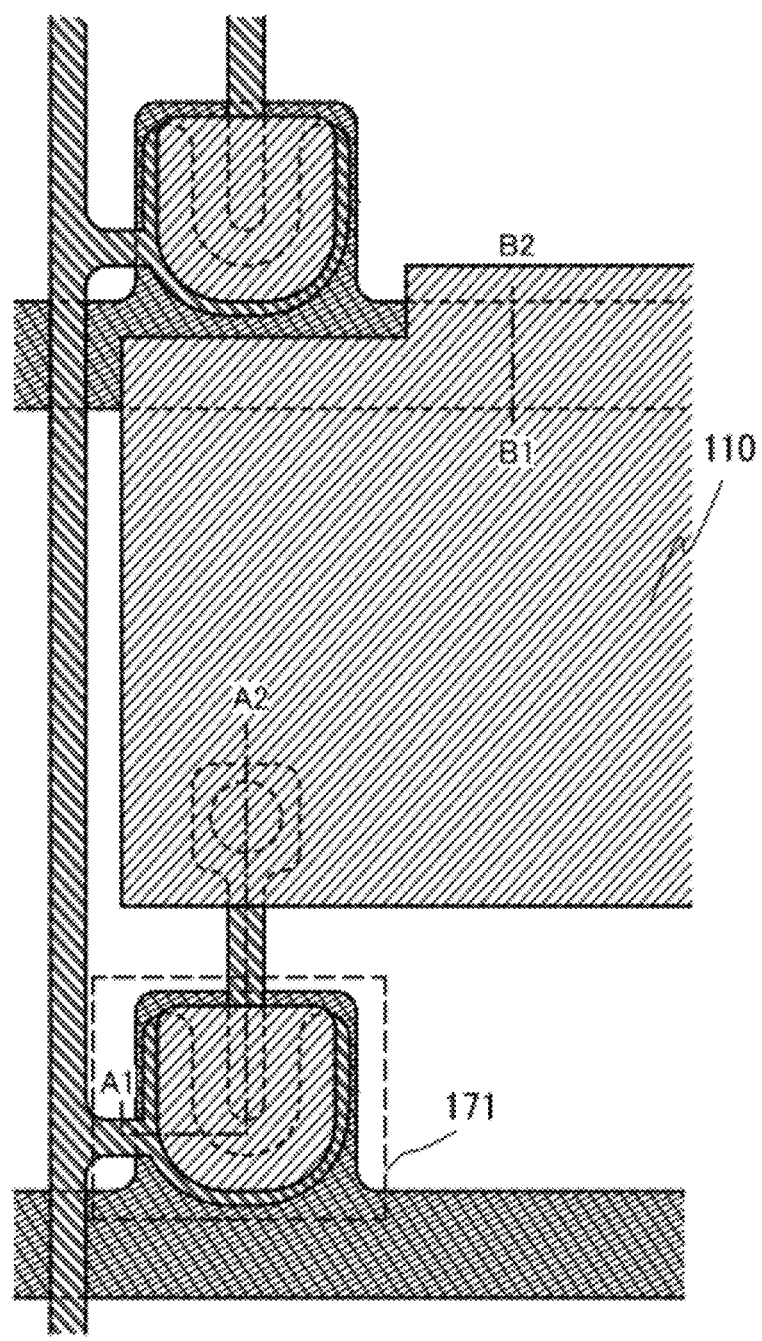
FIG. 11 illustrates a top view of a pixel of a semiconductor device according to an embodiment of the present invention.

One embodiment of the present invention is not limited to the pixel structure of FIG. 9, and an example of the top view different from FIG. 9 is illustrated in FIG. 11. FIG. 11 illustrates an example in which a capacitor wiring is not provided and a pixel electrode overlaps with a gate wiring of an adjacent pixel with a protective insulating film and a gate insulating layer interposed therebetween to form a storage capacitor. In that case, the capacitor wiring and the third terminal connected to the capacitor wiring can be omitted. Note that in FIG. 11, portions similar to those in FIG. 9 are denoted by the same reference numerals.

In an active-matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Alternatively, a driving method called double-frame rate driving may be employed in which the vertical cycle is set 1.5 times as much as a normal vertical cycle or more (preferably 2 times or more) to improve the moving-image characteristics.

Further alternatively, in order to improve the moving-image characteristics of a liquid crystal display device, a driving method may be employed in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

The n-channel transistor of this embodiment includes an IGZO semiconductor layer in a channel formation region and has good dynamic characteristics. Accordingly, these driving methods can be applied in combination to the n-channel transistor of this embodiment.

In the case of manufacturing a light-emitting display device, one electrode (also referred to as a cathode) of an organic light-emitting element is set to a low power supply potential such as GND or 0 V; thus, a terminal portion is provided with a fourth terminal for setting the cathode to a low power supply potential such as GND or 0 V. Also in the case of manufacturing a light-emitting display device, a power supply line is provided in addition to a source wiring and a gate wiring. Accordingly, a terminal portion is provided with a fifth terminal electrically connected to the power supply line.

This embodiment can be combined with any one of Embodiments 1 to 3.

(Embodiment 5)

This embodiment shows an example in which the common connection portion is formed on the same substrate as a thin film transistor 171 whose structure is different from that of the thin film transistor 170 in Embodiments 1 to 3, FIGS. 12A to 12C, FIGS. 13A to 13C, and FIGS. 14A to 14C.

Figure 12A:
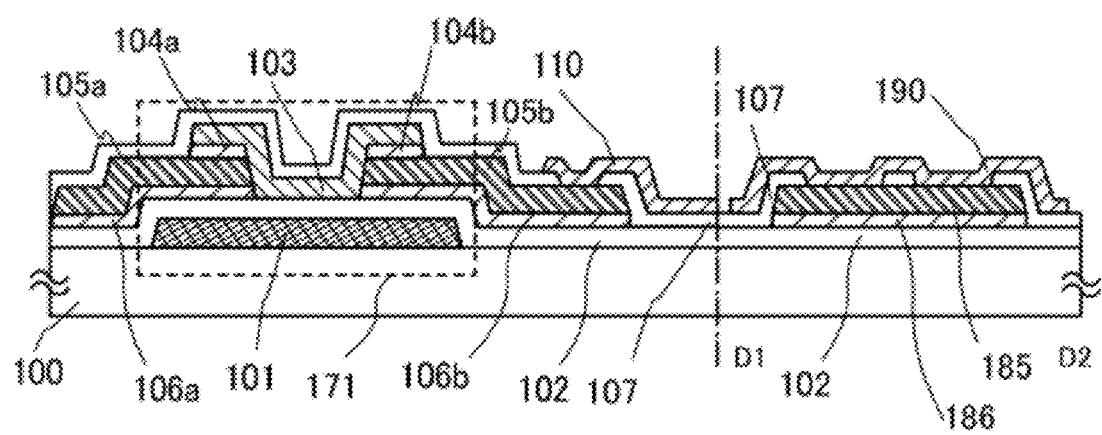
FIGS. 12A to 12C are cross-sectional views each illustrating a semiconductor device according to an embodiment of the present invention.

FIG. 12A illustrates an example in which the common connection portion described in Embodiment 1 is formed on the same substrate as a thin film transistor. Since the difference from Embodiment 1 is the structure of the thin film transistor, portions similar to those in FIGS. 1A and 1B are denoted by the same reference numerals.

Figure 12B:
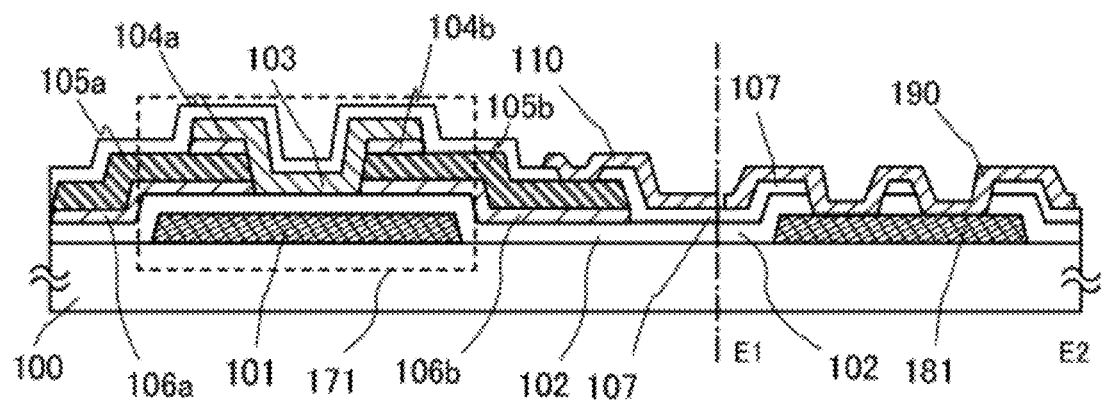

FIG. 12B illustrates an example in which the common connection portion described in Embodiment 2 is formed on the same substrate as a thin film transistor. Since the difference from Embodiment 2 is the structure of the thin film transistor, portions similar to those in FIGS. 2A and 2B are denoted by the same reference numerals.

Figure 12C:
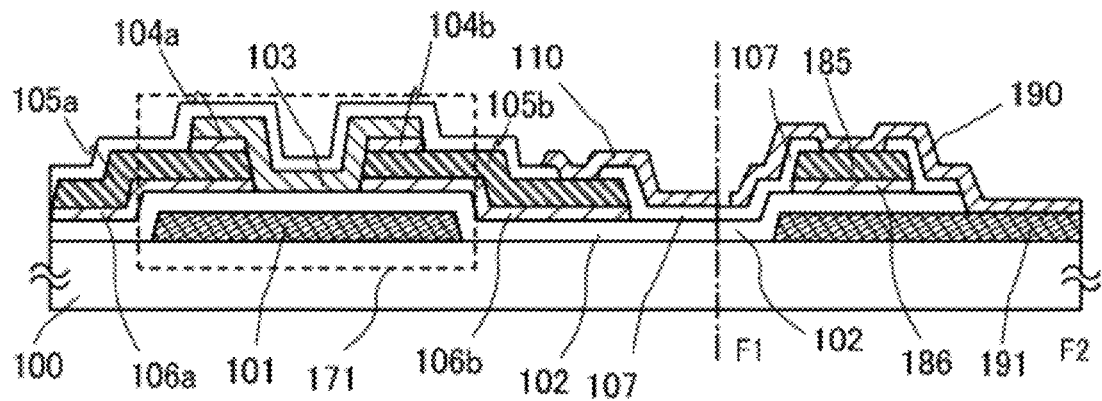

FIG. 12C illustrates an example in which the common connection portion described in Embodiment 3 is formed on the same substrate as a thin film transistor. Since the difference from Embodiment 3 is the structure of the thin film transistor, portions similar to those in FIGS. 3A and 3B are denoted by the same reference numerals.

In the case of designing the common connection portion, one of the above three types of the common connection portions is selected.

A manufacturing process of the thin film transistor 171 formed on the same substrate as the common connection portion is described below.

Embodiments 1 to 3 show examples in which the source region and the drain region are formed under the source electrode layer and the drain electrode layer; however, this embodiment shows an example in which the source region and the drain region are formed over and under the source electrode layer and the drain electrode layer.

Since only some parts are different between this embodiment and Embodiment 4, portions similar to those in FIGS. 4A to 4C, FIGS. 5A to 5C, FIGS. 6 to 9, FIGS. 10A and 10B, and FIG. 11 are denoted by the same reference numerals and the description of same process is omitted.

First, as in Embodiment 4, after a conductive layer is formed over the substrate 100, a resist mask is formed through a first photolithography process, and unnecessary portions are removed by etching to form wirings and electrodes (a gate wiring including the gate electrode 101, the capacitor wiring 108, and the first terminal 121). FIG. 13A illustrates a cross-sectional view at this stage, which is the same as FIG. 4A. Thus, FIG. 13A corresponds to a top view of FIG. 6.

Next, as in Embodiment 4, the gate insulating layer 102 is formed over the entire surface of the gate electrode 101. The gate insulating layer 102 is formed by a sputtering method or the like to have a thickness of 50 nm to 250 nm. For example, a silicon oxide film is formed as the gate insulating layer 102 by a sputtering method to have a thickness of 100 nm.

Then, as in Embodiment 4, a first IGZO film is formed over the gate insulating layer 102 by a sputtering method.

As in Embodiment 4, a conductive film including a metal material is formed by a sputtering method or a vacuum evaporating method over the first IGZO film. Here, a three-layer conductive film of a titanium film, an aluminum film including neodymium, and a titanium film is formed.

Then, a second IGZO film is formed over the conductive film by a sputtering method. The second IGZO film can be formed under the same condition as the first IGZO film. In this embodiment, the second IGZO film has a thickness of 5 nm.

A resist mask is formed through a second photolithography process, and unnecessary portions are removed by etching to form the source electrode layer 105a and a drain electrode layer 105b. Either a wet etching or a dry etching is employed as an etching method at this time. In this embodiment, an ammonia peroxide mixture (hydrogen peroxide:ammonia:water=5:2:2) is used as an etchant of the titanium film, and a mixed solution of phosphoric acid, acetic acid, and nitric acid is used for the etching of the aluminum film including neodymium. In this wet etching, the conductive film of the titanium film, the Al—Nd film, and the titanium film stacked in this order is etched to form the source electrode layer 105a and the drain electrode layer 105b. Note that the first IGZO film and the second IGZO film can also be etched by a wet etching using the ammonia peroxide mixture to form the first source region 106a, the first drain region 106b, IGZO layers 111a and 111b which are both the second IGZO film. FIG. 13B illustrates a cross-sectional view when the above process is performed.

In the capacitor portion, the first IGZO film and the second IGZO film overlapping with the capacitor wiring 108 are removed.

In the terminal portion, an IGZO layer 123 that is the second IGZO film remains on the second terminal 122. A part of the IGZO film 130, which exists under the second terminal 122 and overlaps with the second terminal 122, remains.

After the resist mask is removed, plasma treatment is performed. FIG. 13C illustrates a cross-sectional view when this treatment is performed. In this embodiment, a reverse sputtering is performed in which plasma is generated by the introduction of an oxygen gas and an argon gas, and the exposed gate insulating layer is exposed to oxygen radicals or oxygen.

The IGZO layers 111a and 111b, which are both the second IGZO film and respectively formed on the source electrode layer 105a and a drain electrode layer 105b, reduce plasma damage.

After the plasma treatment, a third IGZO film is formed without being exposed to the atmosphere. The formation of the third IGZO film after the plasma treatment without the exposure to the atmosphere is useful because dust or moisture is not attached to the interface between the gate insulating layer and the semiconductor film. The third IGZO film has a thickness of 5 nm to 200 nm. In this embodiment, the thickness of the third IGZO film is 100 nm.

Formed under a different condition, the third IGZO film has a higher oxygen concentration than the first and second IGZO films do. For example, the gas flow rate ratio of oxygen to argon is higher at the formation of the third IGZO film as compared to the flow rate ratio of oxygen to argon at the formation of the first and second IGZO films.

Specifically, the first and the second IGZO films are formed in an atmosphere of a rare gas such as argon or helium (alternatively, in an atmosphere containing an oxygen gas at 10% or less and an argon gas at 90% or more). The third IGZO film is formed in an oxygen atmosphere (alternatively, in an atmosphere in which the flow rate of the argon gas is equal to or less than that of the oxygen gas).

The third IGZO film may be formed using the same chamber as that previously used for the reverse sputtering. Alternatively, the third IGZO film may be formed using a different chamber from the one used for the reverse sputtering as long as it can be formed without being exposed to the atmosphere.

Next, heat treatment at 200° C. to 600° C., typically 300° C. to 500° C. is preferably performed. Here, the heat treatment is performed at 350° C. for an hour in a nitrogen atmosphere in a furnace. Through the heat treatment, the atomic level of the IGZO film is realigned. The heat treatment including annealing with light is important because it improves distortion that impedes the transfer of carriers. Note that the timing of the heat treatment is not limited as long as it is performed after the formation of the third IGZO film. The heat treatment may be performed after the formation of the pixel electrodes, for example.

A resist mask is formed through a third photolithography process, and unnecessary portions are removed by etching to form the IGZO semiconductor layer 103. Through the above process, the thin film transistor 171 in which the IGZO semiconductor layer 103 serves as a channel formation region is formed. FIG. 14A illustrates a cross-sectional view at this stage. Note that FIG. 8 illustrates a top view at this stage. Since the first IGZO film, the second IGZO film, and the third IGZO film are removed as selected through the etching processes, part of the first IGZO film and the second IGZO film is removed. Remaining parts of the second IGZO film covered with the third IGZO film serve as a second source region 104a and a second drain region 104b. In addition, as illustrated in FIG. 14A, one side of the first IGZO film covered with the third IGZO film is protected; the other side thereof is exposed and its shape is a little changed through the etching process.

In addition, in the terminal portion, the IGZO layer 123 that is the second IGZO film formed on the second terminal 122 is removed through the etching.

As in Embodiment 4, the protective insulating film 107 is formed to cover the IGZO semiconductor layer 103. Since the later steps are the same as those in Embodiment 4, only a brief description is given here.

After the formation of the protective insulating film 107, a resist mask is formed through a fourth photolithography process, and parts of the protective insulating film 107 are etched to form contact holes 125, 126, and 127. FIG. 14B illustrates a cross-sectional view at this stage.

After the resist mask is removed, transparent conductive film is formed. A resist mask is formed through a fifth photolithography process, and unnecessary portions are removed by etching to form the pixel electrode 110. Transparent conductive films 128 and 129 remain in the terminal portion. Then, the resist mask is removed. FIG. 14C illustrates a cross-sectional view at this stage. Note that FIG. 9 illustrates a top view at this stage.

Through these five photolithography processes using five photo masks, a pixel thin film transistor portion including a bottom-gate type n-channel thin film transistor 171, and the storage capacitor can be completed.

The n-channel thin film transistor 171 in this embodiment includes a plurality of source regions and drain regions; accordingly, on-current can be increased as compared to that in Embodiment 4.

Note that this embodiment can be freely combined with Embodiment 4.

(Embodiment 6)

Figure 15A:
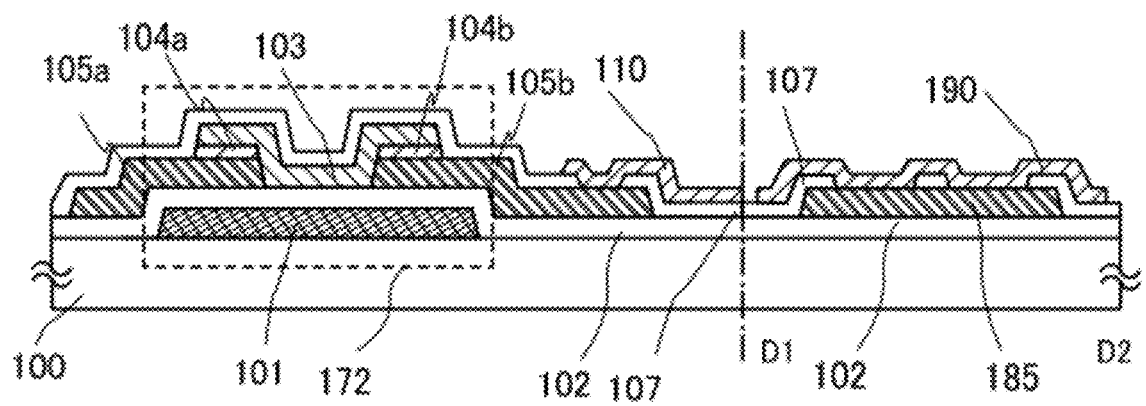
FIGS. 15A to 15C are cross-sectional views each illustrating a semiconductor device according to an embodiment of the present invention.
Figure 15B:
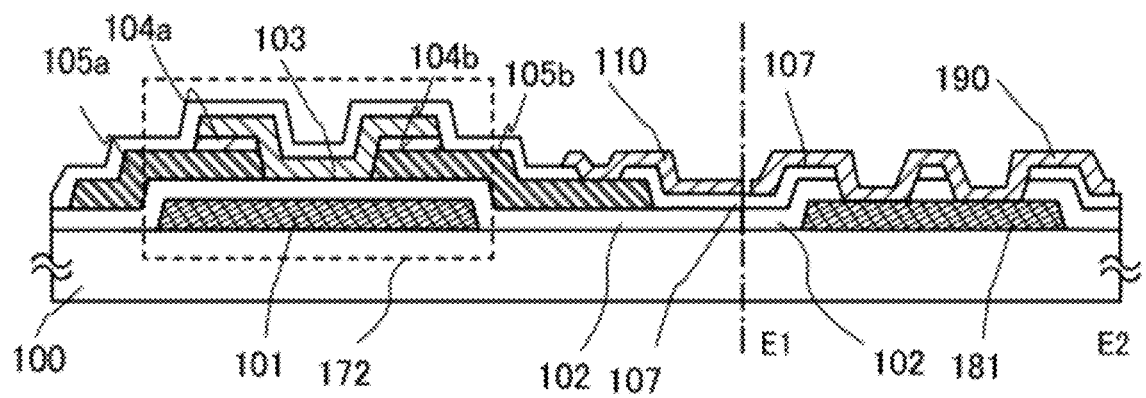
Figure 15C:
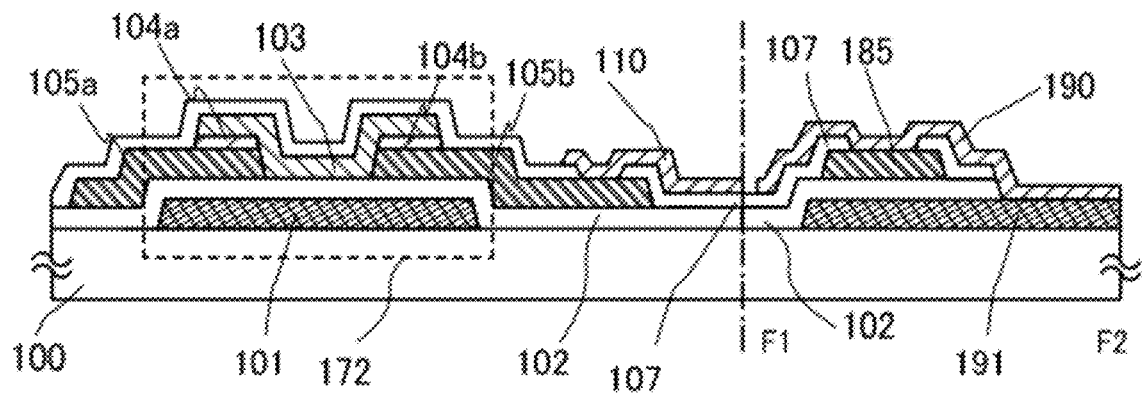

This embodiment shows an example in which the common connection portion is formed on the same substrate as a thin film transistor 172 whose structure is different from any one of the thin film transistors described in Embodiments 1 to 5, with reference to FIGS. 15A, 15B, and 15C.

Note that the thin film transistor 172 is an example of a thin film transistor including the IGZO semiconductor layer 103 over the source electrode layer 105a and the drain electrode layer 105b with the source region 104a and the drain region 104b interposed therebetween.

FIG. 15A illustrates an example in which the common connection portion described in Embodiment 1 is formed on the same substrate as the thin film transistor. Since differences from Embodiment 1 are the structure of the thin film transistor and the absence of the oxide semiconductor layer 186 in the common connection portion, portions similar to those in FIGS. 1A and 1B are denoted by the same reference numerals.

FIG. 15B illustrates an example in which the common connection portion described in Embodiment 2 is formed on the same substrate as the thin film transistor. Since differences from Embodiment 2 are the structure of the thin film transistor and the absence of the oxide semiconductor layer 186 in the common connection portion, portions similar to those in FIGS. 2A and 2B are denoted by the same reference numerals.

FIG. 15C illustrates an example in which the common connection portion described in Embodiment 3 is formed on the same substrate as the thin film transistor. Since differences from Embodiment 3 are the structure of the thin film transistor and the absence of the oxide semiconductor layer 186 in the common connection portion, portions similar to those in FIGS. 3A and 3B are denoted by the same reference numerals.

(Embodiment 7)

Figure 16A:
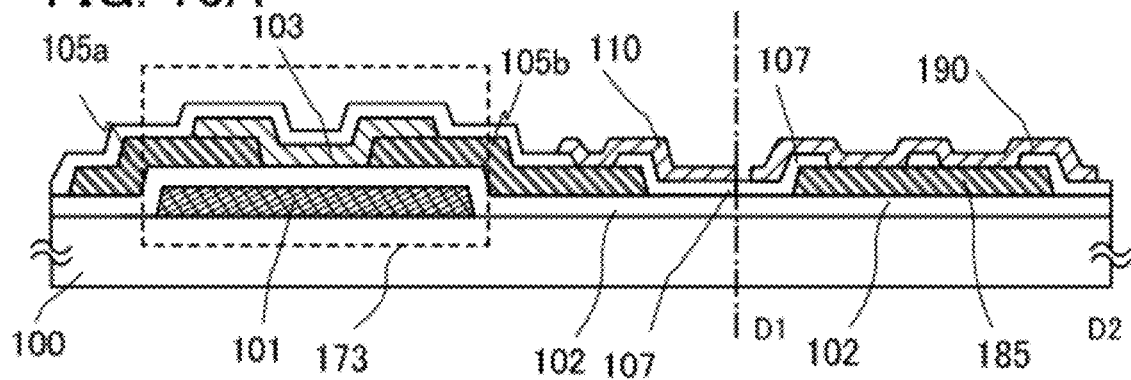
FIGS. 16A to 16C are cross-sectional views each illustrating a semiconductor device according to an embodiment of the present invention.
Figure 16B:
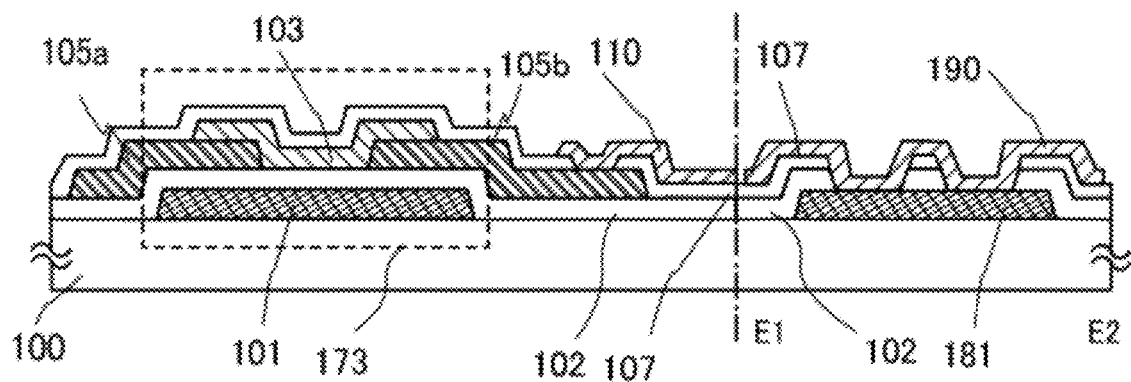
Figure 16C:
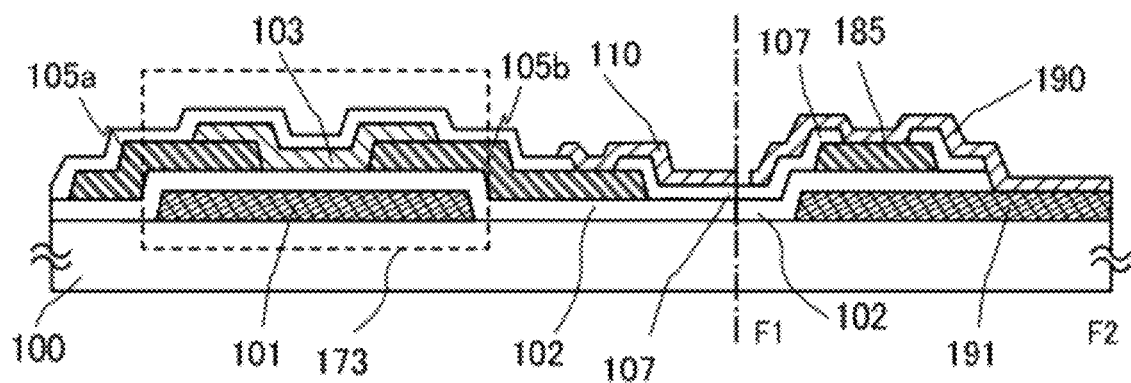

This embodiment shows an example in which the common connection portion is formed on the same substrate as a thin film transistor 173 whose structure is different from that of any one of the thin film transistors described in Embodiments 1 to 6, with reference to FIGS. 16A, 16B, and 16C.

FIGS. 16A, 16B, and 16C illustrate the thin film transistor 173 as an example of a thin film transistor in which the IGZO semiconductor layer 103 is formed in a direct contact with the source electrode layer 105a and the drain electrode layer 105b. It is desirable that plasma treatment be performed before the formation of the IGZO semiconductor layer 103 also in the case of the thin film transistor 173 illustrated in FIGS. 16A, 16B, and 16C. In this embodiment, a surface of a thin film on the substrate is modified by plasma generated by applying voltage to the substrate side in an argon atmosphere. This process can remove dust attached to the exposed gate insulating layer 102, the source electrode layer 105a and the drain electrode layer 105b. Oxygen radical treatment is preferably performed on the surface of the IGZO semiconductor layer 103 before the formation of the protective insulating film also in the case of the thin film transistor 173 illustrated in FIGS. 16A, 16B, and 16C. Plasma treatment, for example, a reverse sputtering can be performed as the oxygen radical treatment on the surface of the IGZO semiconductor layer 103. The reverse sputtering is a method to modify a surface of a thin film on a substrate by plasma generated by applying voltage to the substrate side, instead of to a target side, in an oxygen atmosphere or an atmosphere including oxygen and argon. By the oxygen radical treatment on the surface of the IGZO semiconductor layer 103, the threshold voltage of the thin film transistor 173 is positive and a so-called normally-off switching element can be obtained. It is desirable for a display device that a channel be formed with a threshold voltage that is a positive value and as close to 0 V as possible. If the threshold voltage of the thin film transistor is negative, it tends to be normally on; in other words, current flows between the source electrode and the drain electrode even when the gate voltage is 0 V.

FIG. 16A illustrates an example in which the common connection portion described in Embodiment 1 is formed on the same substrate as the thin film transistor. Since differences from Embodiment 1 are the structure of the thin film transistor and the absence of the oxide semiconductor layer 186 in the common connection portion, portions similar to those in FIGS. 1A and 1B are denoted by the same reference numerals.

FIG. 16B illustrates an example in which the common connection portion described in Embodiment 2 is formed on the same substrate as the thin film transistor. Since differences from Embodiment 2 are the structure of the thin film transistor and the absence of the oxide semiconductor layer 186 in the common connection portion, portions similar to those in FIGS. 2A and 2B are denoted by the same reference numerals.

FIG. 16C illustrates an example in which the common connection portion described in Embodiment 3 is formed on the same substrate as the thin film transistor. Since differences from Embodiment 3 are the structure of the thin film transistor and the absence of the oxide semiconductor layer 186 in the common connection portion, portions similar to those in FIGS. 3A and 3B are denoted by the same reference numerals.

(Embodiment 8)

This embodiment shows an example of electronic paper as a semiconductor device according to an embodiment of the present invention.

Figure 17:
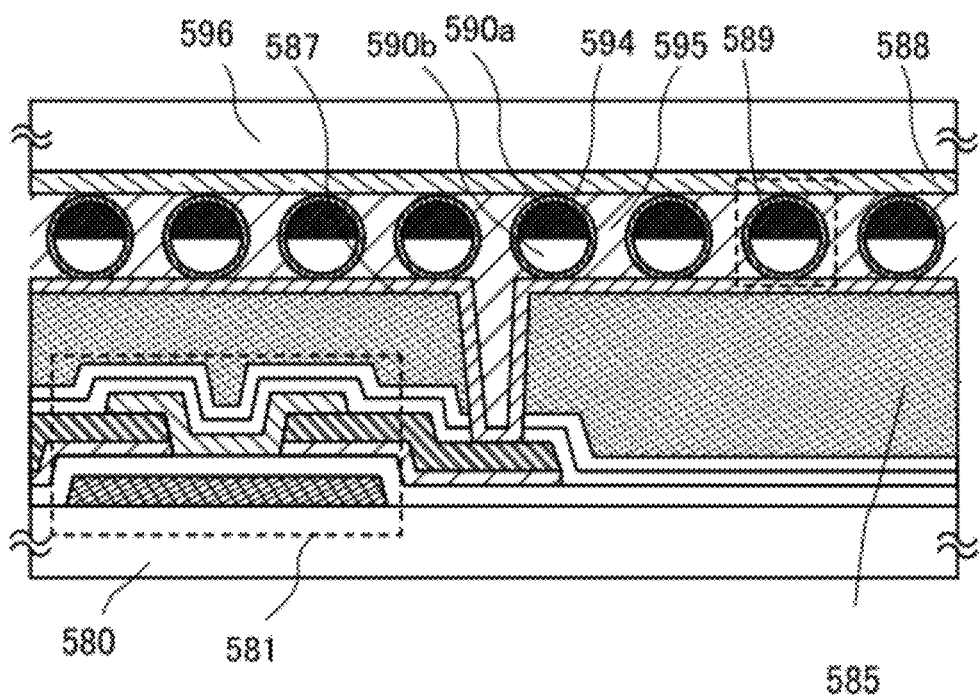
FIG. 17 illustrates a cross-sectional view of electronic paper according to an embodiment of the present invention.

FIG. 17 illustrates active-matrix electronic paper as an example of a semiconductor device to which an embodiment of the present invention is applied. A thin film transistor 581 used for the semiconductor device can be manufactured in a manner similar to that of the thin film transistor 170 described in Embodiment 4 and is a thin film transistor having high electrical characteristics including a gate insulating layer, a source electrode layer and a drain electrode layer respectively formed on a source region and a drain region, and an IGZO semiconductor layer over the gate insulating layer, the source electrode layer and the drain electrode layer.

The electronic paper in FIG. 17 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 which is sealed between a substrate 580 and a substrate 596 is a thin film transistor with a bottom-gate structure, and a source electrode layer or a drain electrode layer thereof is in contact with a first electrode layer 587 at an opening formed in an insulating layer 585, and thus, the thin film transistor 581 is electrically connected to the first electrode layer 587. Between the first electrode layer 587 and a second electrode layer 588, spherical particles 589 each having a black region 590a, a white region 590b, and a cavity 594 around the regions which is filled with liquid are provided. A space around the spherical particles 589 is filled with a filler 595 such as a resin (FIG. 17). In this embodiment, the first electrode layer 587 corresponds to a pixel electrode, and the second electrode layer 588, a common electrode. The second electrode layer 588 is electrically connected to a common potential line provided on the same substrate as the thin film transistor 581. The second electrode layer 588 and the common potential line are electrically connected through conductive particles arranged between a pair of substrates by using the common connection portion according to any one of Embodiments 1 to 3.

Further, instead of the twisting ball, an electrophoretic element can also be used. A microcapsule having a diameter of about 10 µm to 200 µm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles are transferred to opposite sides, and thus, white or black can be displayed. A display element using this principle is an electrophoretic display element and is called electronic paper in general. The electrophoretic display element has higher reflectivity than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, electronic paper with a high reliability as a semiconductor device can be manufactured.

This embodiment can be combined with the common connection portions described in any one of Embodiments 1 to 3, as appropriate.

(Embodiment 9)

Hereinafter, this embodiment shows an example in which at least part of a driver circuit and a thin film transistor arranged in a pixel portion are formed over the same substrate in a display device as an example of a semiconductor device according to an embodiment of the present invention.

The thin film transistor to be arranged in the pixel portion is formed according to Embodiment 4. Further, the thin film transistor 170 described in Embodiment 4 is an n-channel TFT, and thus part of the driver circuit that can include an n-channel TFT among driver circuits is formed over the same substrate as the thin film transistor of the pixel portion.

Figure 18A:
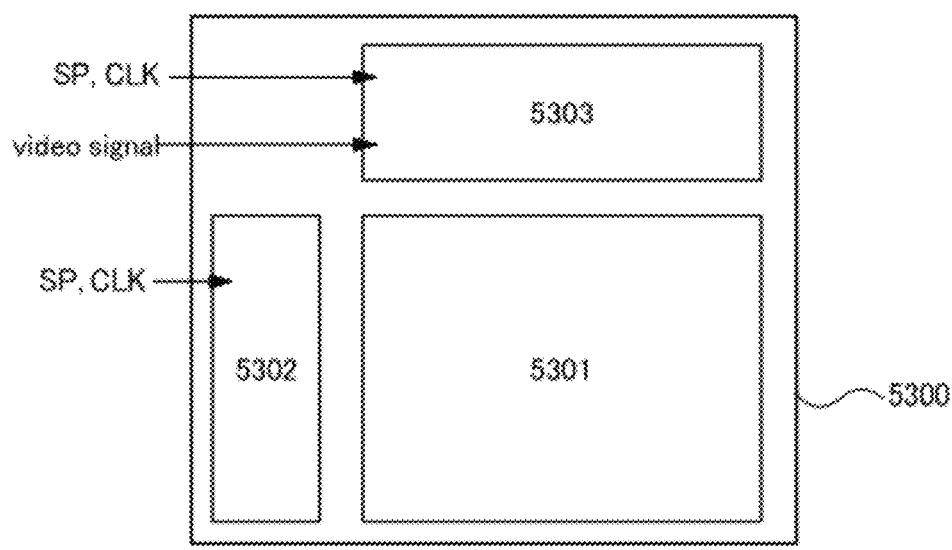
FIGS. 18A and 18B are block diagrams each illustrating a semiconductor device according to an embodiment of the present invention.

FIG. 18A illustrates an example of a block diagram of an active-matrix liquid crystal display device as an example of a semiconductor device according to an embodiment of the present invention. The display device illustrated in FIG. 18A includes, over a substrate 5300, a pixel portion 5301 including a plurality of pixels that are each provided with a display element; a scan line driver circuit 5302 that selects a pixel; and a signal line driver circuit 5303 that controls a video signal input to the selected pixel.

The thin film transistor 170 in Embodiment 4 is an n-channel TFT. A signal line driver circuit including an n-channel TFT is described with reference to FIG. 19.

Figure 19:
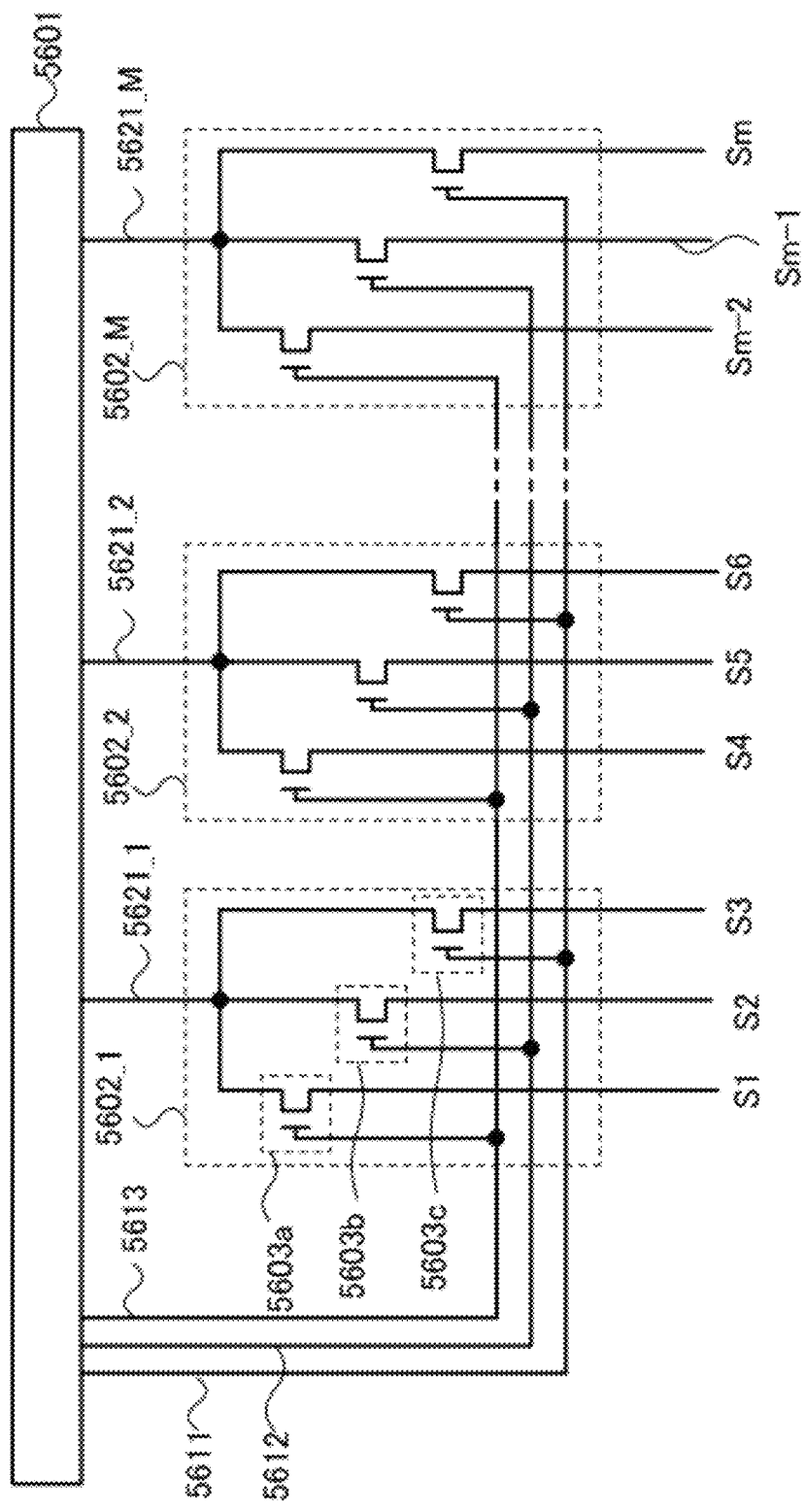
FIG. 19 illustrates a structure of a signal line driver circuit according to an embodiment of the present invention.

A signal line driver circuit illustrated in FIG. 19 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The pixel portion 5301 is connected to the signal line driver circuit 5303 through a plurality of signal lines S1 to Sm (not illustrated) that extend in a column direction from the signal line driver circuit 5303, and to the scan line driver circuit 5302 through a plurality of scan lines G1 to Gn (not illustrated) that extend in a row direction from the scan line driver circuit 5302. The pixel portion 5301 includes a plurality of pixels (not illustrated) arranged in a matrix form so as to correspond to the signal lines S1 to Sm and the scan lines G1 to Gn. Each pixel is connected to a signal line Sj (one of the signal lines S1 to Sm) and a scan line Gj (one of the scan lines G1 to Gn).

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the wirings 5621_1 to 5621_M are connected to the switch groups 5602_1 to 5602_M, respectively. Each of the wirings 5621_1 to 5621_M is connected to three signal lines via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, the signal line Sj, and a signal line Sj+1 via the first thin film transistor 5603a, the second thin film transistor 5603b, and the third thin film transistor 5603c which are included in the switch group 5602_J.

A signal is input to each of the first wiring 5611, the second wiring 5612, and the third wiring 5613.

Note that the driver IC 5601 is preferably formed over a single crystalline substrate. The switch groups 5602_1 to 5602_M are preferably formed over the same substrate as the pixel portion. Therefore, the driver IC 5601 and the switch groups 5602_1 to 5602_M are preferably connected through an FPC or the like.

Figure 20:
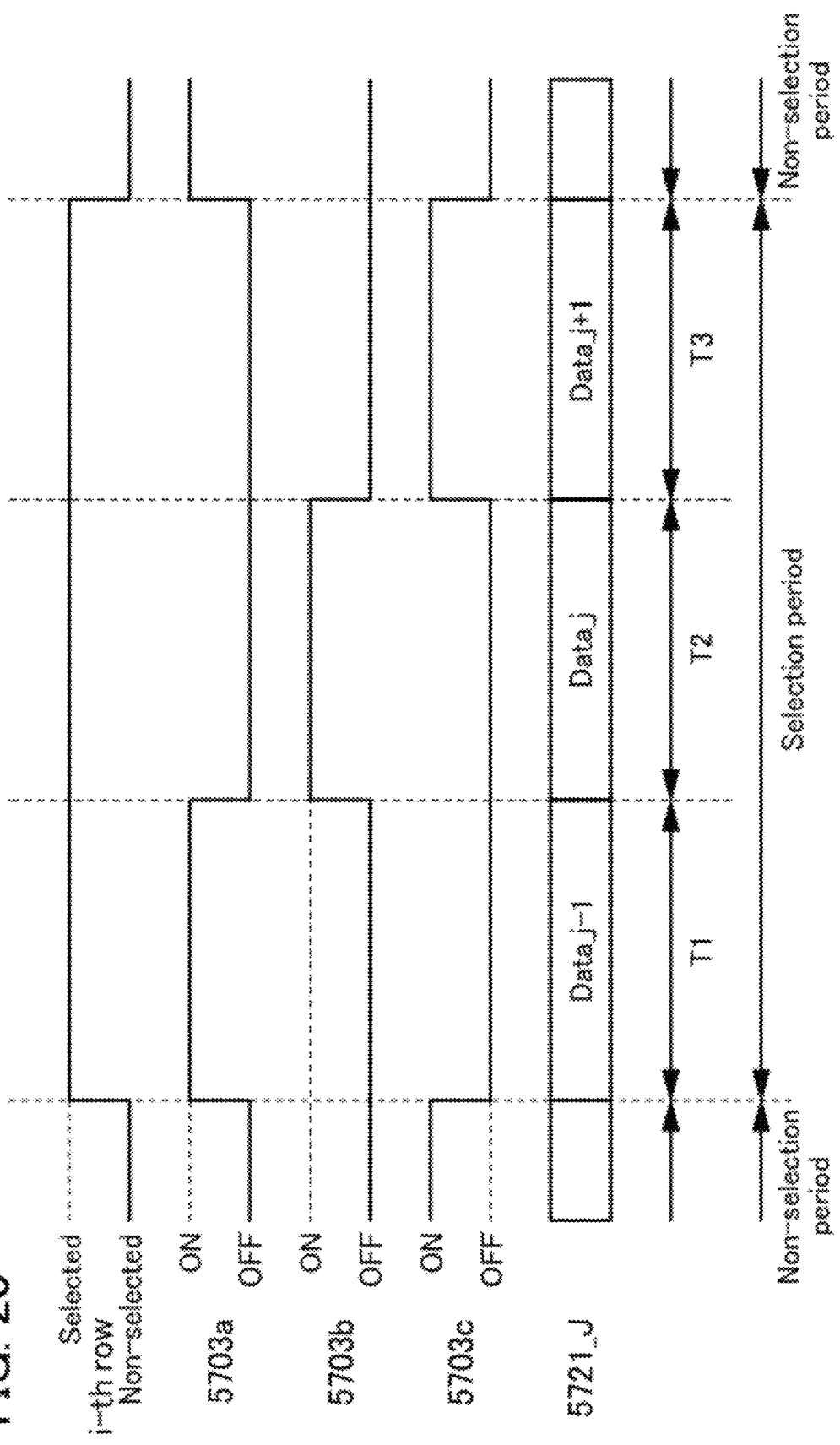
FIG. 20 is a timing chart illustrating the operation of a signal line driver circuit.

Next, the operation of the signal line driver circuit illustrated in FIG. 19 is described with reference to a timing chart of FIG. 20. The timing chart of FIG. 20 shows a case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 19 operates similarly to that in FIG. 20 even when a scan line of another row is selected.

Note that the timing chart of FIG. 20 shows a case where the wiring 5621_J of the J-th column is connected to the signal line Sj−1, the signal line Sj, and the signal line Sj+1 via the first thin film transistor 5603a, the second thin film transistor 5603b, and the third thin film transistor 5603c.

The timing chart of FIG. 20 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, the video signals input to the wiring 5621_J in the first sub-selection period T1, the second sub-selection period T2, and the third sub-selection period T3 are denoted by Data_j−1, Data_j, and Data_j+1.

As shown in FIG. 20, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

From the above, in the signal line driver circuit in FIG. 19, by dividing one gate selection period into three, video signals can be input to three signal lines from one wiring 5621 in one gate selection period. Accordingly, in the signal line driver circuit in FIG. 19, the number of connections between the substrate provided with the driver IC 5601 and the substrate provided with the pixel portion can be approximately ⅓ of the number of signal lines. Consequently, reliability, yield, etc., of the signal line driver circuit in FIG. 19 can be improved.

Note that there is no particular limitation on the arrangement, the number, the driving method, and the like of the thin film transistors, as long as one gate selection period is divided into a plurality of sub-selection periods and video signals are input to a plurality of signal lines from one wiring in each of the plurality of the sub-selection periods as illustrated in FIG. 19.

For example, when video signals are input to three or more signal lines from one wiring in each of three or more sub-selection periods, it is only necessary to add a thin film transistor and a wiring for controlling the thin film transistor. Note that when one gate selection period is divided into four or more sub-selection periods, one sub-selection period becomes short. Thus, one gate selection period is preferably divided into two or three sub-selection periods.

Figure 21:
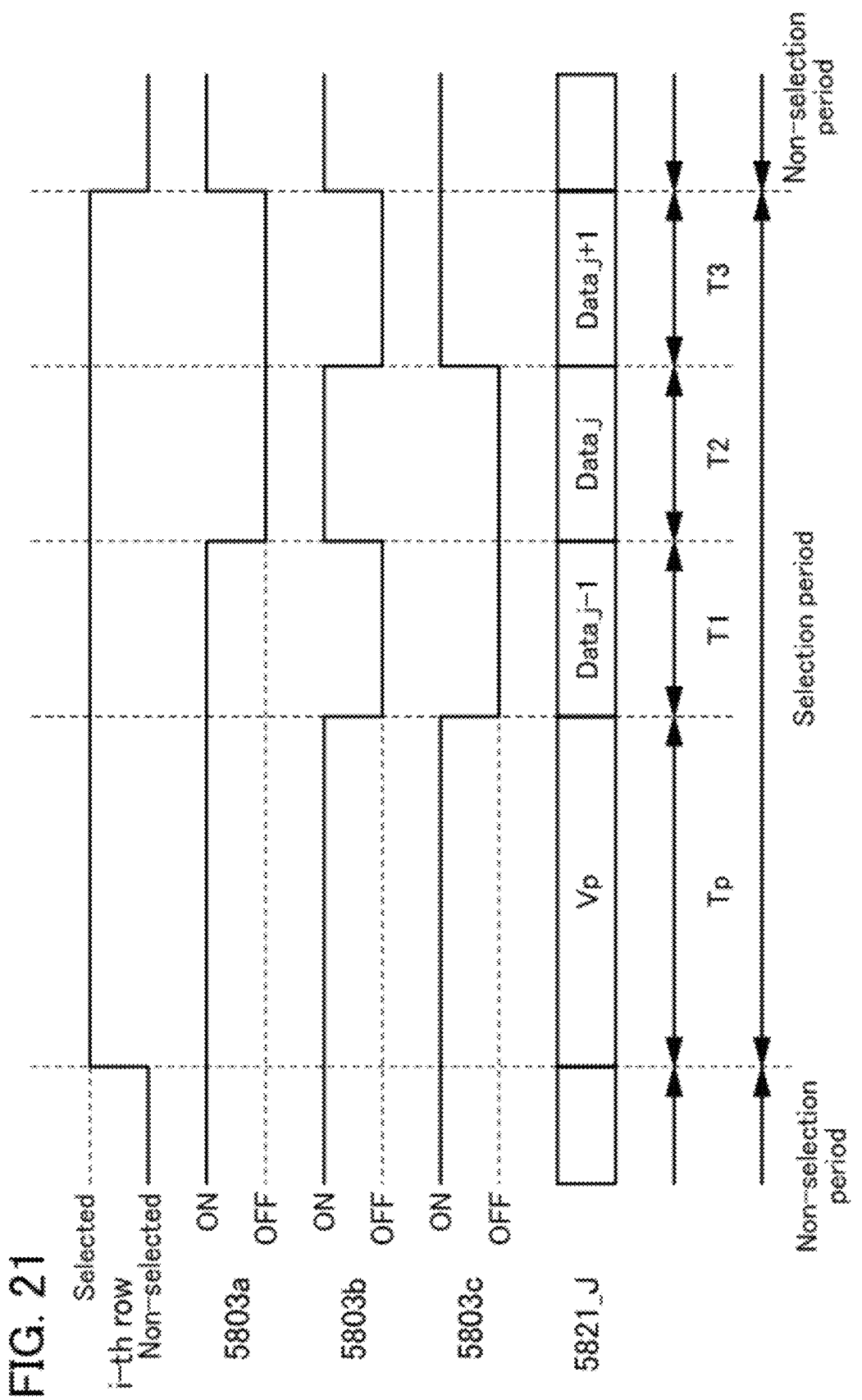
FIG. 21 is a timing chart illustrating the operation of a signal line driver circuit.

As another example, one gate selection period may be divided into a pre-charge period Tp, the first sub-selection period T1, the second sub-selection period T2, and the third sub-selection period T3 as illustrated in a timing chart of FIG. 21. The timing chart of FIG. 21 illustrates timing at which the scan line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As illustrated in FIG. 21, the first thin film transistor 5603a, the second thin film transistor 5603b, and the third thin film transistor 5603c are tuned on in the pre-charge period Tp. At this time, pre-charge voltage Vp input to the wiring 5621_J is input to the signal line Sj−1, the signal line Sj, and the signal line Sj+1 via the first thin film transistor 5603a, the second thin film transistor 5603b, and the third thin film transistor 5603c, respectively. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 19 to which the timing chart of FIG. 21 is applied, the video signal can be written to the pixel at high speed because the signal line can be pre-charged by providing a pre-charge period before a sub-selection period. Note that portions in FIG. 21 which are similar to those of FIG. 20 are denoted by the same reference numerals and detailed description of the same portions and portions which have similar functions is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is produced. The selection signal produced is buffered and amplified by the buffer, and the resulting signal is supplied to a corresponding scan line. The scan line is connected to gate electrodes of transistors in pixels of one line. Further, since the transistors in the pixels of one line have to be turned on at the same time, a buffer which can flow a large amount of current is used.

One mode of a shift register which is used for a part of a scan line driver circuit is described with reference to FIG. 22 and FIG. 23.

Figure 22:
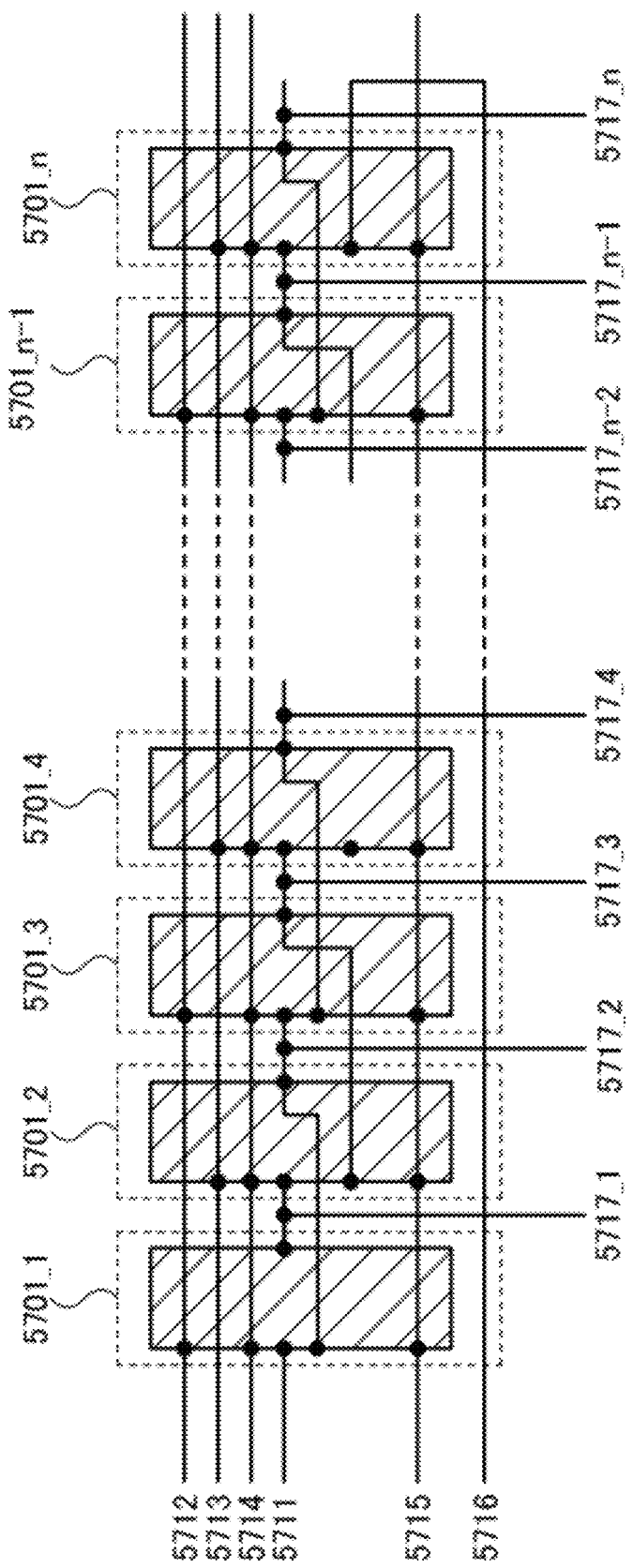
FIG. 22 illustrates a structure of a shift register.

FIG. 22 illustrates a circuit configuration of the shift register. The shift register illustrated in FIG. 22 includes a plurality of flip-flops (flip-flops 5701_1 to 5701_n). The shift register is operated with the input of a first clock signal, a second clock signal, a start pulse signal, and/or a reset signal.

Relationship of the connections in the shift register in FIG. 22 is described. In the i-th stage flip-flop 5701_i (any one of the flip-flops 5701_1 to 5701_n) in the shift register of FIG. 22, a first wiring 5501 illustrated in FIG. 23 is connected to a seventh wiring 5717_i−1; a second wiring 5502 illustrated in FIG. 23, a seventh wiring 5717_i+1; a third wiring 5503 illustrated in FIG. 23, a seventh wiring 5717_i; and a sixth wiring 5506 illustrated in FIG. 23, a fifth wiring 5715.

Figure 23:
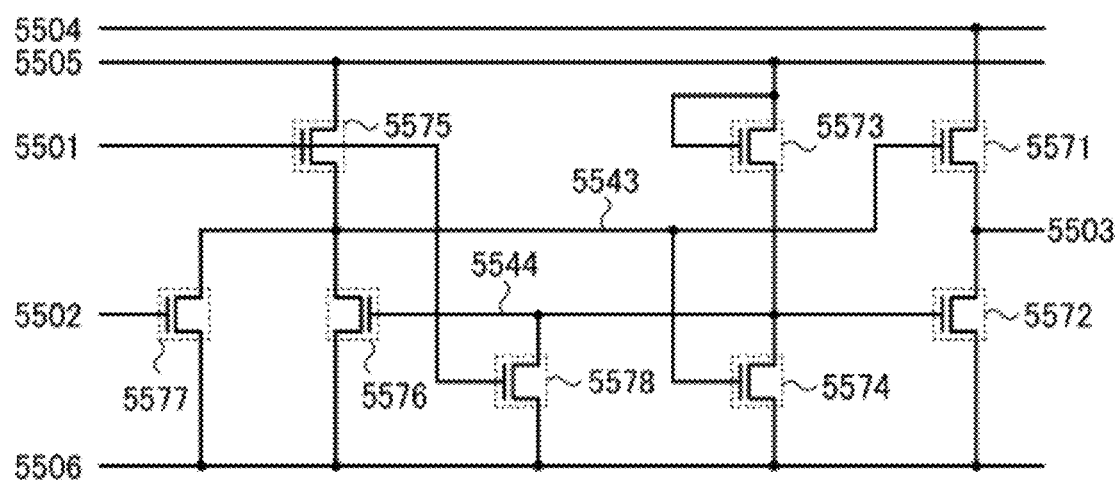
FIG. 23 illustrates a connection structure of a flip-flop in FIG. 22.

Further, a fourth wiring 5504 illustrated in FIG. 23 is connected to a second wiring 5712 in flip-flops of odd-numbered stages, and is connected to a third wiring 5713 in flip-flops of even-numbered stages. A fifth wiring 5505 illustrated in FIG. 23 is connected to a fourth wiring 5714.

Note that the first wiring 5501 of the first stage flip-flop 5701_1 illustrated in FIG. 23 is connected to a first wiring 5711. Moreover, the second wiring 5502 of the n-th stage flip-flop 5701_n illustrated in FIG. 23 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 23 illustrates details of the flip-flop illustrated in FIG. 22. A flip-flop illustrated in FIG. 23 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. The first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 are each n-channel transistors and are turned on when the gate-source voltage ($V_{gs}$) exceeds the threshold voltage ($V_{th}$).

Next, connections of the flip-flop illustrated in FIG. 23 are described below.

A first electrode (either a source electrode or a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, the signal line driver circuit and the scan line driver circuit can be formed using only the n-channel TFTs described in Embodiment 4. The n-channel TFT described in Embodiment 4 has high mobility, and thus a driving frequency of a driver circuit can be increased. Further, the parasitic capacitance is reduced by the source region or the drain region, which is an oxide semiconductor layer of oxygen-deficiency type including indium, gallium, and zinc; thus the n-channel TFT described in Embodiment 4 has a high frequency characteristic (referred to as f characteristics). For example, a scan line driver circuit using the n-channel TFT described in Embodiment 4 can operate at high speed, and thus a frame frequency can be increased and insertion of black images can be realized.

In addition, when the channel width of the transistor in the scan line driver circuit is increased or a plurality of scan line driver circuits are provided, for example, a higher frame frequency can be realized. When a plurality of scan line driver circuits are provided, a scan line driver circuit for driving scan lines of even-numbered rows is provided on one side and a scan line driver circuit for driving scan lines of odd-numbered rows is provided on the opposite side; thus, the frame frequency can be increased.

Figure 18B:
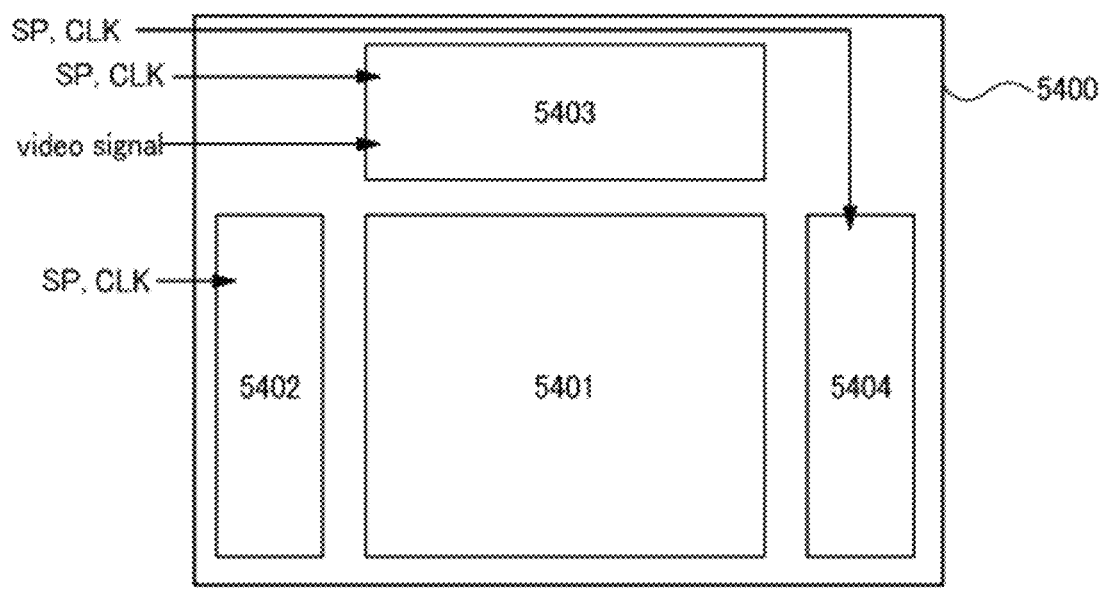

Further, when an active-matrix light-emitting display device which is an example of a semiconductor device according to an embodiment of the present invention is manufactured, a plurality of thin film transistors are arranged in at least one pixel, and thus a plurality of scan line driver circuits are preferably arranged. FIG. 18B is a block diagram illustrating an example of an active-matrix light-emitting display device.

The light-emitting display device illustrated in FIG. 18B includes, over a substrate 5400, a pixel portion 5401 having a plurality of pixels each provided with a display element, a first scan line driver circuit 5402 and a second scan line driver circuit 5404 that select a pixel, and a signal line driver circuit 5403 that controls the input of a video signal to the selected pixel.

When the video signal input to a pixel of the light-emitting display device illustrated in FIG. 18B is a digital signal, the pixel is in a light-emitting state or in a non-light-emitting state by switching of ON/OFF of a transistor. Thus, grayscale can be displayed using an area ratio grayscale method or a time ratio grayscale method. An area ratio grayscale method refers to a driving method by which one pixel is divided into a plurality of sub-pixels and each of the sub-pixels are driven independently in accordance with video signals to display grayscale. A time ratio grayscale method refers to a driving method by which a period during which a pixel is in a light-emitting state is controlled to display grayscale.

Since the response speed of light-emitting elements is higher than that of liquid crystal elements and the like, the light-emitting elements are more suitable for a time ratio grayscale method than liquid-crystal display elements. Specifically, in the case of displaying with a time gray scale method, one frame period is divided into a plurality of sub-frame periods. Then, in accordance with video signals, the light-emitting element in the pixel is set in the light-emitting state or in the non-light-emitting state during each sub-frame period. By dividing one frame into a plurality of sub-frames, the total length of time, in which pixels actually emit light in one frame period, can be controlled with video signals to display gray scales.

In the light-emitting display device illustrated in FIG. 18B, in the case where a switching TFT and a current control TFT are arranged in one pixel, the first scan line driver circuit 5402 generates a signal to be input to a first scan line serving as a gate wiring of the switching TFT, and the second scan line driver circuit 5404 generates a signal to be input to a second scan line serving as a gate wiring of the current control TFT; however, one scan line driver circuit may generate both of the signals to be input to the first scan line and the second scan line. In addition, for example, a plurality of the first scan lines used for controlling the operation of the switching element can be provided in each pixel, depending on the number of transistors included in the switching element. In that case, one scan line driver circuit may generate all signals to be input to the plurality of the first scan lines, or a plurality of scan line driver circuits may generate signals to be input to the plurality of the first scan lines.

In addition, also in the light-emitting display device, part of the driver circuit that can include n-channel TFTs among driver circuits can be formed over the same substrate as the thin film transistors of the pixel portion. Alternatively, the signal line driver circuit and the scan line driver circuit can be formed using only the n-channel TFTs described in Embodiment 4.

Moreover, the above-described driver circuit can be used for electronic paper that drives electronic ink using an element electrically connected to a switching element, without being limited to applications to a liquid crystal display device or a light-emitting display device. The electronic paper is also referred to as an electrophoretic display device (electrophoretic display) and has the advantages that it has the same level of readability as plain paper, its power consumption is lower than other display devices, and that it can be made thin and lightweight.

Electrophoretic displays can have a variety of modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules are transferred in opposite directions and only the color of the particles concentrated on one side is exhibited. Note that the first particles and the second particles each contain pigment and do not move without an electric field. Moreover, the colors of the first particles and the second particles are different from each other (including colorless or achromatic colors).

In this way, an electrophoretic display device utilizes a so-called dielectrophoretic effect by which a substance having a high dielectric constant moves to a high-electric field region. Unlike a liquid crystal display device, an electrophoretic display does not need to have a polarizer and a counter substrate, and thus, both the thickness and weight of the electrophoretic display device can be a half of those of a liquid crystal display device.

A solution in which the above-described microcapsules are dispersed throughout a solvent is referred to as electronic ink. This electronic ink can be printed on a surface of glass, plastic, cloth, paper, or the like. Furthermore, by the use of a color filter or particles that have a pigment, color display is also possible.

In addition, if a plurality of the above-described microcapsules are arranged as appropriate over an active-matrix substrate so as to be interposed between two electrodes, an active-matrix display device can be completed, and display can be performed by the application of an electric field to the microcapsules. For example, the active-matrix substrate obtained with the thin film transistor described in Embodiment 4 can be used.

Note that the first particles and the second particles in the microcapsules may each be formed with a single material selected from a conductive material, an insulating material, a semiconductor material, a magnetic material, a liquid crystal material, a ferroelectric material, an electroluminescent material, an electrochromic material, a magnetophoretic material, or a composite material of any one of these.

Through the above process, a highly reliable display device as a semiconductor device can be manufactured.

This embodiment can be combined with any structure according to the other embodiments as appropriate.

(Embodiment 10)

A thin film transistor of an embodiment of the present invention disclosed in this specification is manufactured, and a semiconductor device having a display function (also referred to as a display device) can be manufactured using the thin film transistor in a pixel portion and further in a driver circuit. Further, part or whole of a driver circuit can be formed over the same substrate as a pixel portion, using a thin film transistor of an embodiment of the present invention, to obtain a system-on-panel.

The display device includes a display element. A liquid crystal element (also referred to as a liquid crystal display element) or a light-emitting element (also referred to as a light-emitting display element) can be used as the display element. Light-emitting elements here encompass an element whose luminance is controlled by current or voltage, specifically, an inorganic electroluminescent (EL) element, an organic EL element, and the like. Further, a display medium whose contrast is changed by an electric effect, such as an electronic ink, can also be used.

In addition, the display device includes a panel in which the display element is sealed, and a module in which an IC including a controller or the like is mounted on the panel. An embodiment of the present invention relates to one embodiment of an element substrate before the display element is completed in a manufacturing process of the display device, and the element substrate is provided with means for supplying current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any one of other states.

Note that a display device in this specification means an image display device, a display device, or a light source (including a lighting device). Further, the display device includes the following: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

This embodiment shows the appearance and a cross section of a liquid crystal display panel as a semiconductor device of an embodiment of the present invention with reference to FIGS. 24A1, 24A2, and 24B. FIGS. 24A1 and 24A2 illustrate a top view of a panel in which thin film transistors 4010 and 4011 having high electrical characteristics each of which includes a gate insulating layer formed over a first substrate 4001, a source electrode layer and a drain electrode layer formed on a source region and a drain region respectively, and an IGZO semiconductor layer over the gate insulating layer, the source electrode layer and the drain electrode layer; and a liquid crystal element 4013 are sealed between the first substrate 4001 and a second substrate 4006 with a sealant 4005. FIG. 24B illustrates a cross-sectional view taken along line M-N in FIGS. 24A1 and 24A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008 between the first substrate 4001 and the second substrate 4006 with the sealant 4005. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that methods for the connection of the driver circuit that is separately formed include, but are not limited to, a COG method, a wire bonding method, a TAB method, and the like. FIG. 24A1 illustrates an example of mounting the signal line driver circuit 4003 by a COG method, and FIG. 24A2 illustrates an example of mounting the signal line driver circuit 4003 by a TAB method.

The pixel portion 4002 and the scan line driver circuit 4004 provided over the first substrate 4001 include a plurality of thin film transistors. FIG. 24B illustrates the thin film transistor 4010 included in the pixel portion 4002 and the thin film transistor 4011 included in the scan line driver circuit 4004. Insulating layers 4020 and 4021 are provided over the thin film transistors 4010 and 4011.

Each of the thin film transistors 4010 and 4011 corresponds to a thin film transistor having high electrical characteristics including a gate insulating layer, a source electrode layer and a drain electrode layer over a source region and a drain region respectively, and an IGZO semiconductor layer over the gate insulating layer, the source electrode layer and the drain electrode layer, and the thin film transistor 170 described Embodiment 4 can be employed as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and sandwich the liquid crystal layer 4008 with the insulating layers 4032 and 4033 interposed between the pixel electrode layer 4030 and the counter electrode layer 4031.

Note that the first substrate 4001 and the second substrate 4006 can be formed by using glass, metal (typically, stainless steel), ceramic, or plastic such as a fiberglass-reinforced plastics (FRP) plate, a polyvinyl fluoride (PVF) film, a polyester film, or an acrylic resin film. In addition, a sheet with a structure in which an aluminum foil is sandwiched between PVF films or polyester films can also be used.

Reference numeral 4035 denotes a columnar spacer obtained by selectively etching an insulating film and is provided to control the distance between the pixel electrode layer 4030 and the counter electrode layer 4031 (a cell gap). Further, a spherical spacer may also be used. The counter electrode layer 4031 is electrically connected to the common potential line provided on the same substrate as the thin film transistor 4010. With the use of any one of the common connection portions described in Embodiments 1 to 3, the counter electrode layer 4031 and the common potential line are electrically connected through conductive particles arranged between the pair of substrates. Note that the conductive particles are included in the sealant 4005.

Alternatively, liquid crystals exhibiting a blue phase for which an alignment film is unnecessary may also be used. The blue phase is one of liquid crystal phases, which is generated just before a cholesteric phase changes into an isotropic phase while temperature of cholesteric liquid crystals is increased. Since the blue phase is generated only within a narrow range of temperatures, a liquid crystal composition containing a chiral agent at 5 wt % or more so as to increase the temperature range is used for the liquid crystal layer 4008. The liquid crystal composition including liquid crystals exhibiting a blue phase and a chiral agent have the characteristics that the response time is 10 µs to 100 µs, which is short, the alignment process is unnecessary because the liquid crystal composition has optical isotropy, and viewing angle dependency is small.

Although an example of a transmissive liquid crystal display device is shown in this embodiment, the present invention can also be applied to a reflective liquid crystal display device and a transflective liquid crystal display device.

An example of a liquid crystal display device in this embodiment is provided with a polarizing plate on the outer side of a substrate (on a viewer side) and a coloring layer and an electrode layer stacked in this order inside the substrate; however, the polarizing plate may be provided inside the substrate. The stacked structure of the polarizing plate and the coloring layer is not limited to the ones in this embodiment and may be set as appropriate depending on materials of the polarizing plate and the coloring layer or conditions of manufacturing processes. Further, a light-blocking film serving as a black matrix may also be provided.

In this embodiment, in order to reduce the surface roughness of the thin film transistor and to enhance the reliability of the thin film transistor, the thin film transistor obtained in Embodiment 4 is covered with insulating layers (an insulating layer 4020 and an insulating layer 4021) serving as a protective film or a flattening insulating film. Note that the protective film is provided to prevent the entry of contaminant impurities such as an organic substance, a metal, or moisture floating in air and is preferably a dense film. The protective film may be formed with a single layer or stacked layers of a silicon oxide film, a silicon nitride film, a silicon oxynitride film, a silicon nitride oxide film, an aluminum oxide film, an aluminum nitride film, an aluminum oxynitride film, and/or an aluminum nitride oxide film, by a sputtering method. This embodiment shows an example to form the protective film by a sputtering method; however, a method for forming the film is not limited but a variety of methods can be employed.

As the protective film, the insulating layer 4020 that has a stacked structure is formed. Here, a silicon oxide film is formed as a first layer of the insulating layer 4020 by a sputtering method. The use of the silicon oxide film as the protective film has an effect of preventing hillock of an aluminum film used as the source electrode layer and the drain electrode layer.

As a second layer of the protective film, another insulating layer is formed. Here, a silicon nitride film is formed as a second layer of the insulating layer 4020. The use of the silicon nitride film as the protective film can prevent the entry of mobile ions of sodium or the like to a semiconductor region so that variation in electrical characteristics of the TFT can be suppressed.

After the protective film is formed, the IGZO semiconductor layer may be subjected to annealing (300° C. to 400° C.).

In addition, the insulating layer 4021 is formed as the flattening insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. A siloxane-based resin may include as a substituent at least one of fluorine, an alkyl group, and an aryl group, as well as hydrogen. Note that the insulating layer 4021 may be formed by stacking a plurality of insulating films formed of these materials.

Note that a siloxane-based resin is a resin formed from a siloxane material as a starting material and having the bond of Si—O—Si. The siloxane-based resin may include as a substituent at least one of fluorine, an alkyl group, and aromatic hydrocarbon, as well as hydrogen.

A method for forming the insulating layer 4021 is not particularly limited, and the following method can be employed depending on the material: a sputtering method, an SOG method, a spin coating method, a dipping method, a spray coating method, a droplet discharge method (e.g., an ink-jet method, screen printing, offset printing, or the like), a doctor knife, a roll coater, a curtain coater, a knife coater, or the like. In the case of forming the insulating layer 4021 using a material solution, annealing (300° C. to 400° C.) of the IGZO semiconductor layer may be performed at the same time as a baking step. The baking step of the insulating layer 4021 also serves as annealing of the IGZO semiconductor layer so that a semiconductor device can be manufactured efficiently.

The pixel electrode layer 4030 and the counter electrode layer 4031 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, indium tin oxide to which silicon oxide is added, or the like.

The pixel electrode layer 4030 and the counter electrode layer 4031 can also be formed using a conductive composition including a conductive high molecule (also referred to as a conductive polymer). A pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Each of the signals and potentials input to the signal line driver circuit 4003 that is separately formed and the scan line driver circuit 4004 or the pixel portion 4002 are supplied by the FPC 4018.

In this embodiment, the connection terminal electrode 4015 is formed using the same conductive film as the pixel electrode layer 4030 included in the liquid crystal element 4013, and the terminal electrode 4016 is formed using the same conductive film as the source electrode layer and the drain electrode layer of the thin film transistors 4010 and 4011.

The connection terminal electrode 4015 is electrically connected to a terminal included in an FPC 4018 through an anisotropic conductive film 4019.

FIGS. 24A and 24B illustrate an example in which the signal line driver circuit 4003 is separately formed and mounted on the first substrate 4001; however, this embodiment is not limited to this structure. A scan line driver circuit may also be separately formed and mounted, or only a part of the signal line driver circuit or of the scan line driver circuit may be separately formed and mounted.

Figure 25:
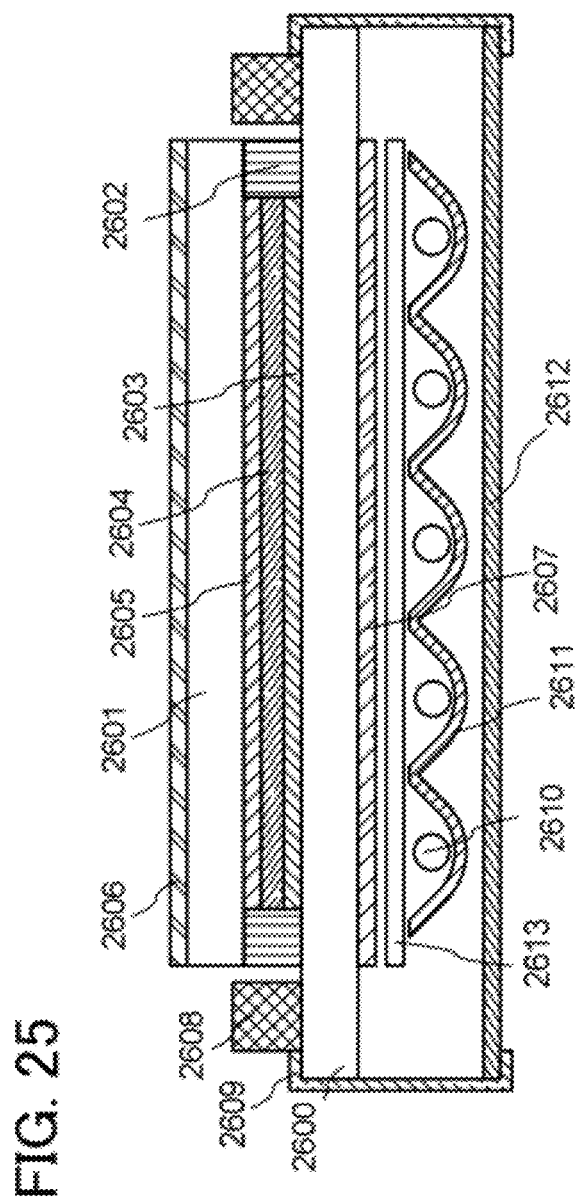
FIG. 25 illustrates a cross-sectional view of a semiconductor device according to an embodiment of the present invention.

FIG. 25 illustrates an example of a liquid crystal display module as a semiconductor device using a TFT substrate 2600 to which an embodiment of the present invention is applied.

FIG. 25 illustrates an example of a liquid crystal display module in which the TFT substrate 2600 is fixed to a counter substrate 2601 with a sealant 2602, and a pixel portion 2603 including a TFT and the like, a display element 2604 including a liquid crystal layer, and a coloring layer 2605 are provided between the TFT substrate 2600 and the counter substrate 2601 to form a display region. The coloring layer 2605 is necessary to perform color display. In the case of the RGB system, respective coloring layers corresponding to colors of red, green, and blue are provided for respective pixels. The polarizing plate 2606 is provided outside the counter substrate 2601, and a polarizing plate 2607 and a diffusing plate 2613 are provided outside the TFT substrate 2600. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit and a power source circuit. The polarizing plate and the liquid crystal layer may be stacked with a retardation plate interposed therebetween.

The liquid crystal display module can employ a twisted nematic (TN) mode, an in-plane-switching (IPS) mode, a fringe-field-switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like.

Through the above process, a highly reliable liquid crystal display panel as a semiconductor device can be manufactured.

This embodiment can be combined with any one of the other embodiments as appropriate.

(Embodiment 11)

This embodiment shows an example of a light-emitting display device as a semiconductor device of an embodiment of the present invention. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by the application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. When the light-emitting organic compound returns to a ground state from the excited state, it emits light. Owing to the above mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an organic EL element is used as a light-emitting element in the description below.

Figure 26:
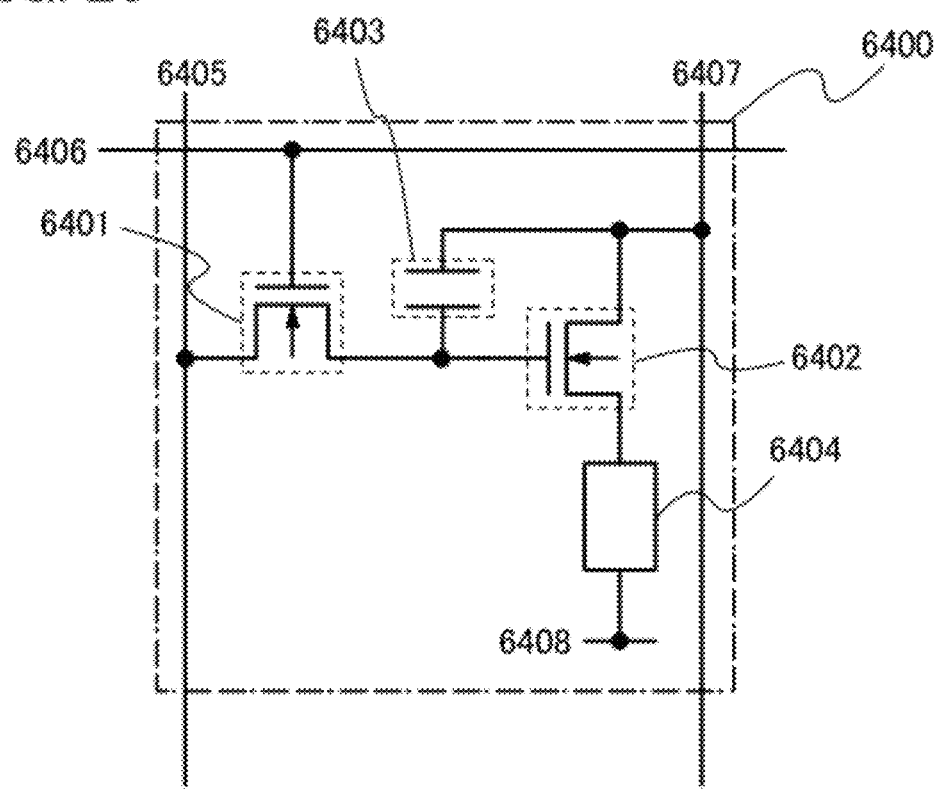
FIG. 26 illustrates an equivalent circuit diagram of a pixel of a semiconductor device according to an embodiment of the present invention.

FIG. 26 illustrates an example of a pixel structure which can be driven by a digital time grayscale method, as an example of a semiconductor device to which an embodiment of the present invention is applied.

A structure and the operation of the pixel which can be driven by the digital time grayscale method are described. Here is an example where two n-channel transistors in which an IGZO semiconductor layer is used for a channel formation region are used in a pixel.

A pixel 6400 includes a switching transistor 6401, a driving transistor 6402, a light-emitting element 6404 and a capacitor 6403. A gate of the switching transistor 6401 is connected to a scan line 6406. A first electrode (either a source electrode or a drain electrode) of the switching transistor 6401 is connected to a signal line 6405. A second electrode (the other of the source electrode and the drain electrode) of the switching transistor 6401 is connected to a gate of the driving transistor 6402. The gate of the driving transistor 6402 is connected to a power source line 6407 through the capacitor 6403. A first electrode of the driving transistor 6402 is connected to the power source line 6407. A second electrode of the driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line formed on the same substrate. A portion where the common electrode 6408 is connected to the common potential line can be a common connection portion to obtain the structure illustrated in FIGS. 1A, 2A, or 3A.

Note that the second electrode (the common electrode 6408) of the light-emitting element 6404 is set to a low power source potential. The low power source potential is lower than a high power source potential set to the power source line 6407. For example, GND or 0 V can be set as the low power source potential. Each potential need to be adjusted such that a potential difference between the high power source potential and the low power source potential is higher than or equal to a forward threshold voltage of the light-emitting element 6404, because the potential difference between the high power source potential and the low power source potential is applied to the light-emitting element 6404 so that current flows in the light-emitting element 6404 to emit light.

Note that the capacitor 6403 can be omitted by being substituted by gate capacitance of the driving transistor 6402. The gate capacitance of the driving transistor 6402 can be formed between a channel formation region and a gate electrode.

In the case of using a voltage-input voltage driving method, a video signal is input to the gate of the driving transistor 6402 to make the driving transistor 6402 completely turn on or off. That is, the driving transistor 6402 is operated in a linear region, and thus, voltage higher than the voltage of the power source line 6407 is applied to the gate of the driving transistor 6402. Note that voltage higher than or equal to (the power source line voltage+$V_{th}$ of the driving transistor 6402) is applied to the signal line 6405.

In the case of using an analog grayscale method instead of the digital time grayscale method, the same pixel structure as in FIG. 26 can be employed by inputting signals in a different way.

In the case of using the analog grayscale method, voltage higher than or equal to (a forward voltage of the light-emitting element 6404+$V_{th}$ of the driving transistor 6402) is applied to the gate of the driving transistor 6402. The forward voltage of the light-emitting element 6404 refers to a voltage to obtain a desired luminance, and includes at least a forward threshold voltage. By inputting a video signal to allow the driving transistor 6402 to operate in a saturation region, current can flow in the light-emitting element 6404. In order to allow the driving transistor 6402 to operate in the saturation region, a potential of the power source line 6407 is higher than a gate potential of the driving transistor 6402. Since the video signal is an analog signal, a current in accordance with the video signal flows in the light-emitting element 6404, and the analog grayscale method can be performed.

Note that the pixel structure is not limited to the one in FIG. 26. For example, the pixel in FIG. 26 can further include a switch, a resistor, a capacitor, a transistor, a logic circuit, or the like.

Next, structures of the light-emitting element will be described with reference to FIGS. 27A to 27C. A cross-sectional structure of a pixel in the case of using an n-channel driving TFT, for example, will be described. Driving TFTs 7001, 7011, and 7021 used for semiconductor devices illustrated in FIGS. 27A to 27C can be manufactured in a manner similar to the thin film transistor described in Embodiment 4, and are highly-reliable thin film transistors, each including, a gate insulating layer, a source electrode layer, a drain electrode layer, an oxygen-excess oxide semiconductor layer over the gate insulating layer, the source electrode layer and the drain electrode layer, and an oxygen-deficiency oxide semiconductor layer as the source region and the drain region.

In order to extract light emitted from the light-emitting element, at least either the anode or the cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. A pixel structure of the invention disclosed in this specification can be applied to a light-emitting element having any one of these emission structures.

A light-emitting element having a top emission structure will be described with reference to FIG. 27A.

Figure 27A:
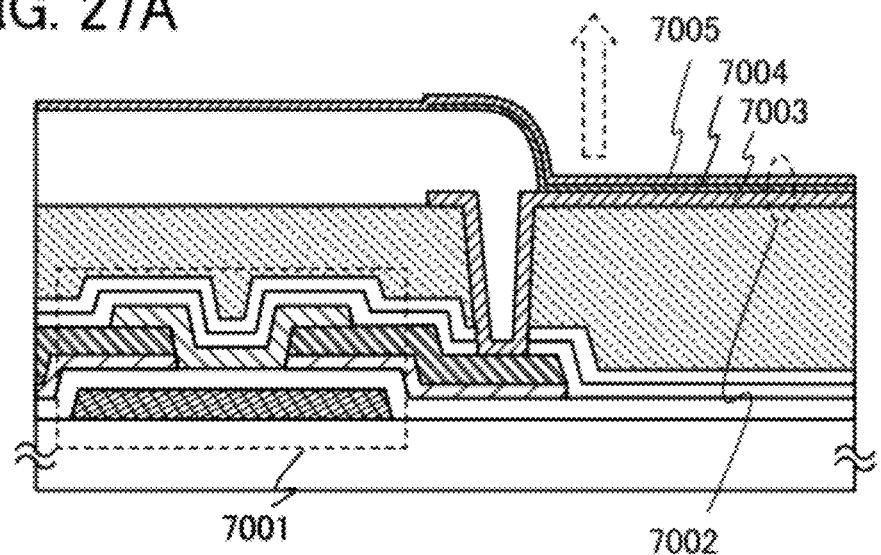
FIGS. 27A to 27C each illustrate a semiconductor device according to an embodiment of the present invention.

FIG. 27A illustrates a cross-sectional view of a pixel in the case where the driving TFT 7001 is an n-channel TFT and light is emitted from a light-emitting element 7002 to a common electrode (an anode 7005) side. In FIG. 27A, a pixel electrode (a cathode 7003) of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, CaF, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, indium tin oxide (also referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the case of the pixel illustrated in FIG. 27A, light is emitted from the light-emitting element 7002 to the anode 7005 side as indicated by an arrow.

Next, a light-emitting element having a bottom emission structure will be described with reference to FIG. 27B. FIG. 27B illustrates a cross-sectional view of a pixel in the case where the driving TFT 7011 is an n-channel transistor and light is emitted from a light-emitting element 7012 to a pixel electrode (a cathode 7013) side. In FIG. 27B, the cathode 7013 of the light-emitting element 7012 is formed over a light-transmitting conductive film 7017 that is electrically connected to the driving TFT 7011, and a light-emitting layer 7014 and a common electrode (an anode 7015) are stacked in this order over the cathode 7013. A light-blocking film 7016 for reflecting or blocking light may be formed to cover the anode 7015 when the anode 7015 has a light-transmitting property. For the cathode 7013, a variety of materials can be used as in the case of FIG. 27A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. Similar to the case of FIG. 27A, the light-emitting layer 7014 may be formed using either a single layer or a plurality of layers stacked. The anode 7015 is not required to transmit light, but can be formed using a light-transmitting conductive material as in the case of FIG. 27A. As the light-blocking film 7016, a metal or the like that reflects light can be used for example; however, it is not limited to a metaluminum film. For example, a resin or the like to which black pigments are added can also be used.

The light-emitting element 7012 corresponds to a region where the cathode 7013 and the anode 7015 sandwich the light-emitting layer 7014. In the case of the pixel illustrated in FIG. 27B, light is emitted from the light-emitting element 7012 to the cathode 7013 side as indicated by an arrow.

Next, a light-emitting element having a dual emission structure will be described with reference to FIG. 27C. In FIG. 27C, a pixel electrode (a cathode 7023) of a light-emitting element 7022 is formed over a light-transmitting conductive film 7027 which is electrically connected to the driving TFT 7021, and a light-emitting layer 7024 and a common electrode (an anode 7025) are stacked in this order over the cathode 7023. As in the case of FIG. 27A, the cathode 7023 can be formed using a variety of conductive materials as long as they have a low work function. The cathode 7023 is formed to have a thickness that can transmit light. For example, a film of Al having a thickness of 20 nm can be used as the cathode 7023. As in FIG. 27A, the light-emitting layer 7024 may be formed using either a single layer or a plurality of layers stacked. The anode 7025 can be formed using a light-transmitting conductive material as in the case of FIG. 27A.

The light-emitting element 7022 corresponds to a region where the cathode 7023, the light-emitting layer 7024, and the anode 7025 overlap with one another. In the case of the pixel illustrated in FIG. 27C, light is emitted from the light-emitting element 7022 to both the anode 7025 side and the cathode 7023 side as indicated by arrows.

Note that, although an organic EL element is described here as a light-emitting element, an inorganic EL element can also be provided as a light-emitting element.

In this embodiment, an example is described in which a thin film transistor (a driving TFT) that controls the driving of a light-emitting element is electrically connected to the light-emitting element; however, a structure may be employed in which a TFT for current control is connected between the driving TFT and the light-emitting element.

Figure 27B:
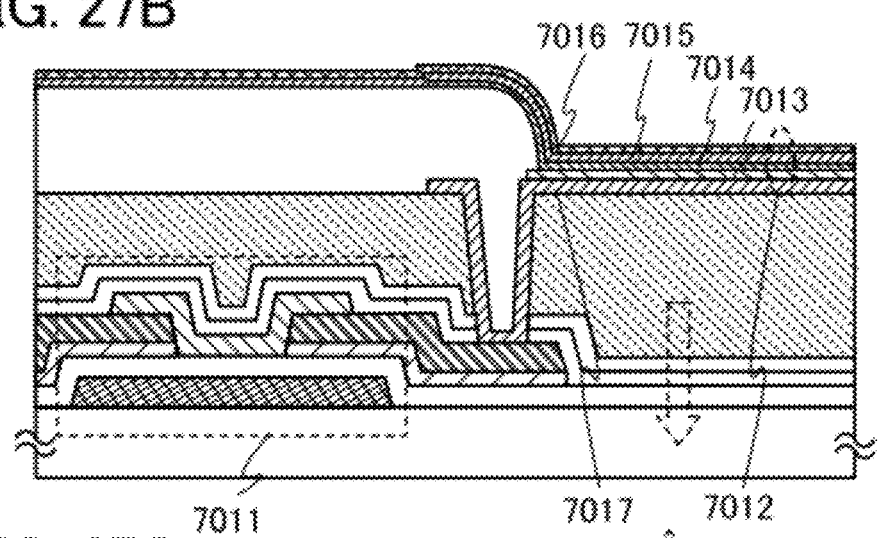
Figure 27C:
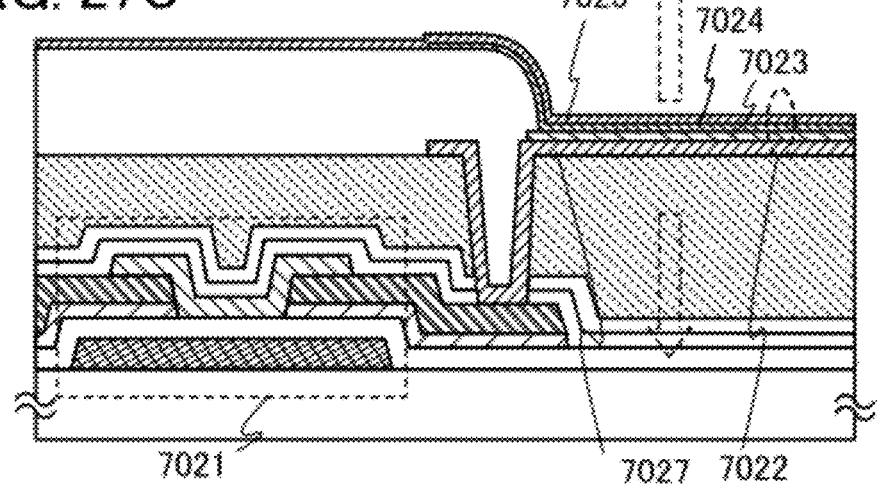

A semiconductor device described in this embodiment is not limited to the structures illustrated in FIGS. 27A to 27C and can be modified in various ways based on the spirit of techniques according to the invention disclosed in this specification.

Next, the appearance and a cross section of a light-emitting display panel (also referred to as a light-emitting panel), which is one embodiment of a semiconductor device of the present invention, will be described with reference to FIGS. 28A and 28B. FIG. 28A illustrates a top view of a panel in which a thin film transistor having high electrical characteristics including a gate insulating layer formed on a first substrate, a source electrode layer and a drain electrode layer formed on a source region and a drain region respectively, and an IGZO semiconductor layer over the gate insulating layer, the source electrode layer and the drain electrode layer are sealed between the first substrate and a second substrate with a sealant. FIG. 28B illustrates a cross-sectional view taken along line H-I of FIG. 28A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with filler 4507 between the first substrate 4501 and the second substrate 4506, with the sealant 4505. In this manner, it is preferable that the pixel portion 4502, the signal line driver circuits 4503a and 4503b, and the scan line driver circuits 4504a and 4504b be packaged (sealed) with a protective film such as an attachment film or an ultraviolet curable resin film or a cover material with high air-tightness and little degasification so as not to be exposed to the external air.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 28B.

Each of the thin film transistors 4509 and 4510 is a thin film transistor having high electrical characteristics and including a gate insulating layer, a source electrode layer and a drain electrode layer formed on a source region and a drain region respectively, and an IGZO semiconductor layer over the gate insulating layer, the source electrode layer and the drain electrode layer, and the thin film transistor 170 described in Embodiment 4 can be employed as the thin film transistors 4509 and 4510. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is not limited to that described in this embodiment, which shows a stacked structure of the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A partition 4520 is formed using an organic resin film, an inorganic insulating film, or an organic polysiloxane. It is particularly preferable that the partition 4520 be formed using a photosensitive material to have an opening on the first electrode layer 4517 and a sidewall of the opening portion be formed as a tilted surface with a continuous curvature.

The electroluminescent layer 4512 may be formed using a single layer or a plurality of layers stacked In order to prevent the entry of oxygen, hydrogen, moisture, carbon dioxide, or the like into the light-emitting element 4511, a protective film may be formed over the second electrode layer 4513 and the partition 4520. A silicon nitride film, a silicon nitride oxide film, a diamond like carbon (DLC) film, or the like can be formed as the protective layer.

In addition, a variety of signals and potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed using the same conductive film as the first electrode layer 4517 included in the light-emitting element 4511, and a terminal electrode 4516 is formed using the same conductive film as the source electrode layer and the drain electrode layer included in the thin film transistors 4509 and 4510.

The connection terminal electrode 4515 is electrically connected to a terminal included in the FPC 4518a through an anisotropic conductive film 4519.

A second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used for the filler 4507.

In addition, if needed, an optical film such as a polarizing plate, a circularly polarizing plate including an elliptically polarizing plate, a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment can be performed so as to diffuse reflected light by projections and depressions on the surface and reduce the glare.

The signal line driver circuits 4503a and 4503b and the scan line driver circuits 4504a and 4504b may be mounted with driver circuits formed using a single crystal semiconductor film or a polycrystalline semiconductor film over a substrate separately prepared. In addition, only the signal line driver circuits or part thereof, or the scan line driver circuits or part thereof may be separately formed and mounted. This embodiment is not limited to the structure illustrated in FIGS. 28A and 28B.

Through the above process, a highly reliable display device (display panel) as a semiconductor device can be manufactured.

This embodiment can be combined with any one of the other embodiments as appropriate.

(Embodiment 12)

An embodiment of a semiconductor device of the present invention can be applied to electronic paper. Electronic paper can be used for electronic devices of a variety of fields as long as they can display data. For example, electronic paper can be applied to an electronic book (e-book) reader, a poster, an advertisement in a vehicle such as a train, displays of various cards such as a credit card, and the like. Examples of the electronic devices are illustrated in FIGS. 29A and 29B and FIG. 30.

Figure 29A:
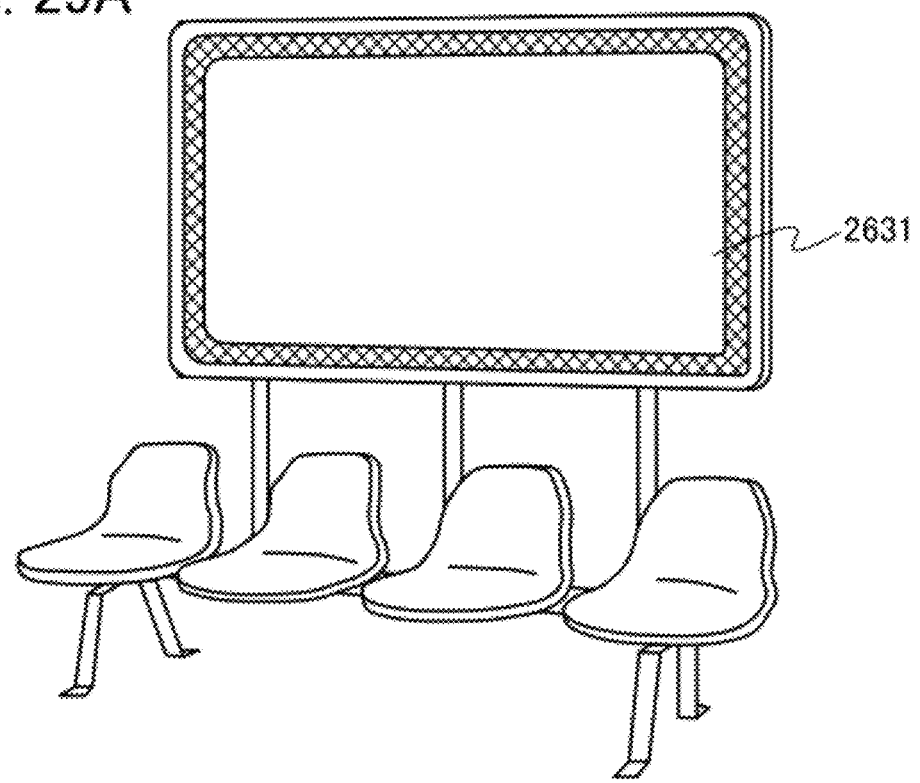
FIGS. 29A and 29B each illustrate an example of applications of electronic paper according to an embodiment of the present invention.

FIG. 29A illustrates a poster 2631 formed using electronic paper. In the case where an advertising medium is printed paper, the advertisement is replaced by manpower; however, by using electronic paper to which an embodiment of the present invention is applied, the advertising display can be changed in a short time. Further, an image can be stably displayed without being distorted. Note that the poster may be configured to transmit and receive data wirelessly.

Figure 29B:
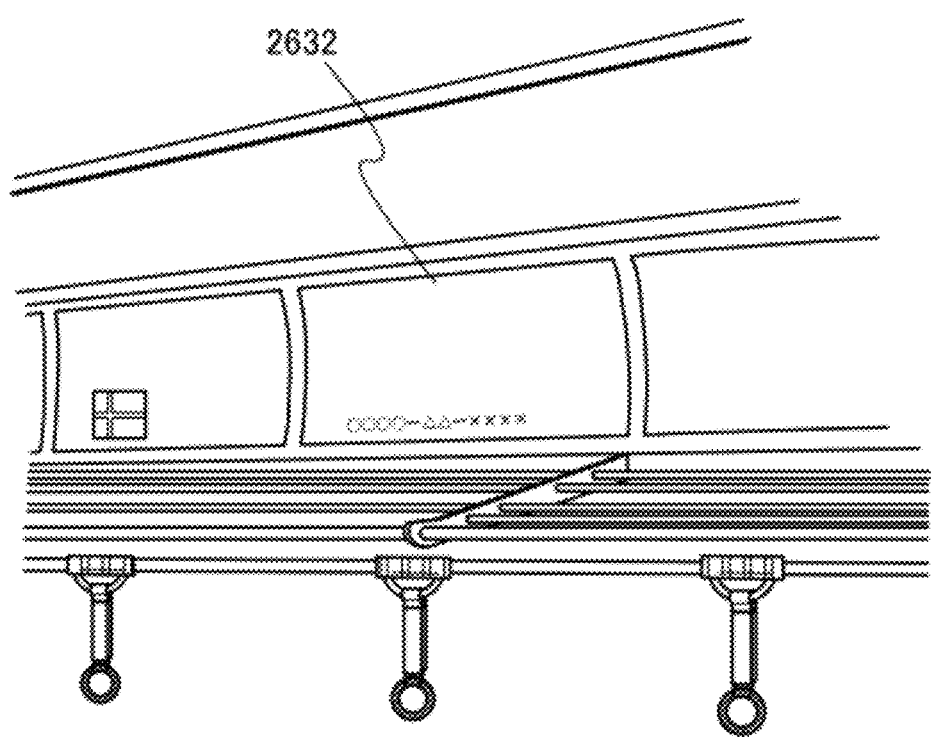

FIG. 29B illustrates an advertisement 2632 in a vehicle such as a train. In the case where an advertising medium is printed paper, the advertisement is replaced by manpower; however, by using electronic paper to which an embodiment of the present invention is applied, the advertising display can be changed in a short time without a lot of manpower. Further, an image can be stably displayed without being distorted. Note that the advertisement in a vehicle may be configured to transmit and receive data wirelessly.

Figure 30:
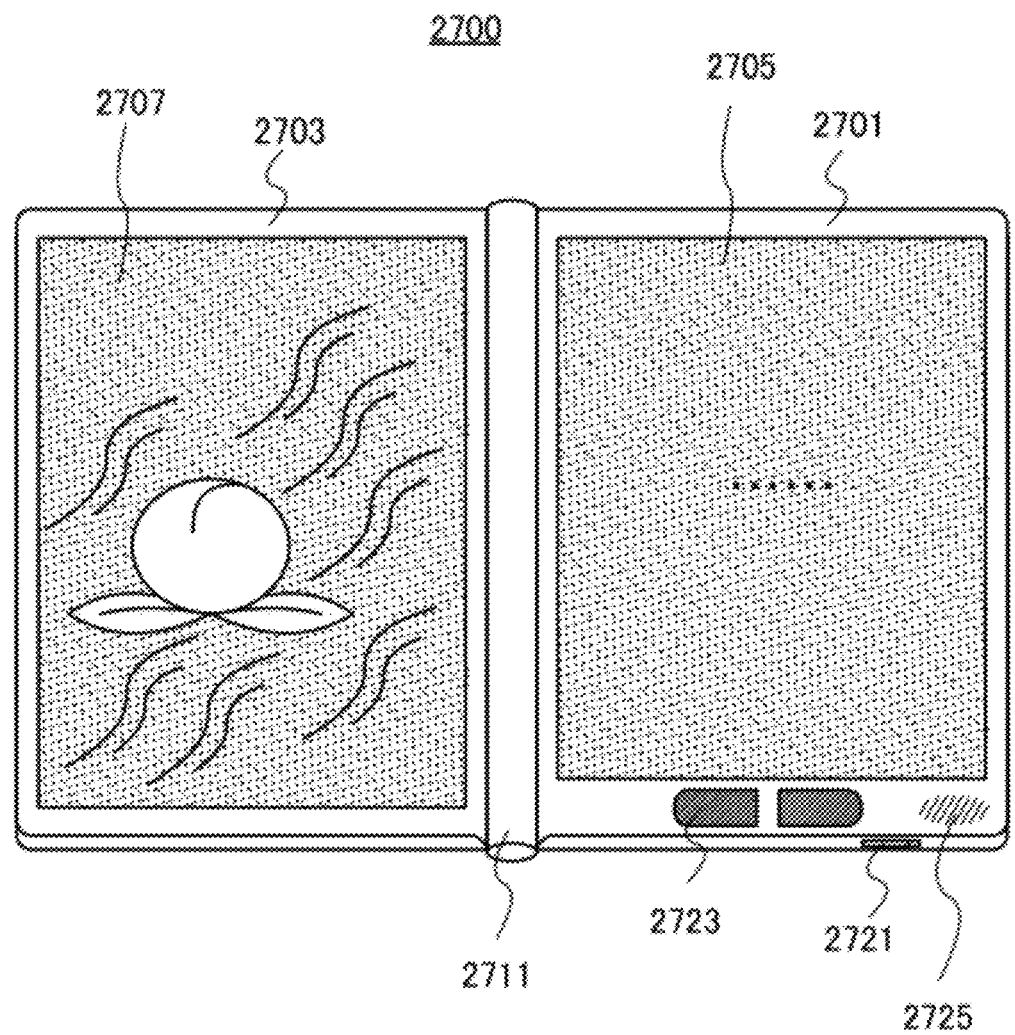
FIG. 30 illustrates an external view of an electronic book reader according to an embodiment of the present invention.

FIG. 30 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the axis of the hinge 2711. With such a structure, the electronic book reader 2700 can be operated like a paper book.

A display portion 2705 and a display portion 2707 are incorporated in the housing 2701 and the housing 2703, respectively. The display portion 2705 and the display portion 2707 may be configured to display one image or different images. In the case where the display portion 2705 and the display portion 2707 display different images, for example, a display portion on the right side (the display portion 2705 in FIG. 30) can display text and a display portion on the left side (the display portion 2707 in FIG. 30) can display graphics.

FIG. 30 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Further, an external connection terminal (an earphone terminal, a USB terminal, a terminal that can be connected to various cables such as an AC adapter and a USB cable, or the like), a recording medium inserting portion, or the like may be provided on the back surface or the side surface of the housing. Further, the electronic book reader 2700 may have a function of an electronic dictionary.

The electronic book reader 2700 may be configured to transmit and receive data wirelessly. The structure can be employed in which desired book data or the like is purchased and downloaded from an electronic book server wirelessly.
(Embodiment 13)

A semiconductor device according to an embodiment of the present invention can be applied to a variety of electronic devices including an amusement machine. Examples of electronic devices include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 31A:
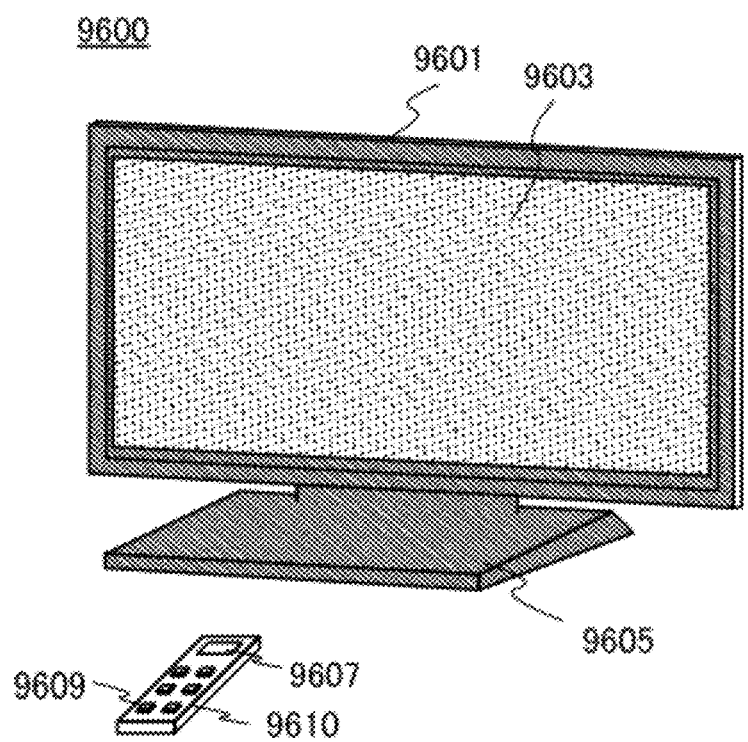
FIGS. 31A and 31B respectively illustrate external views of a television set and a digital photo frame according to an embodiment of the present invention.

FIG. 31A illustrates an example of a television set 9600. In the television set 9600, a display portion 9603 is incorporated in a housing 9601. The display portion 9603 can display an image. Further, the housing 9601 is supported by a stand 9605 here.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 31B:
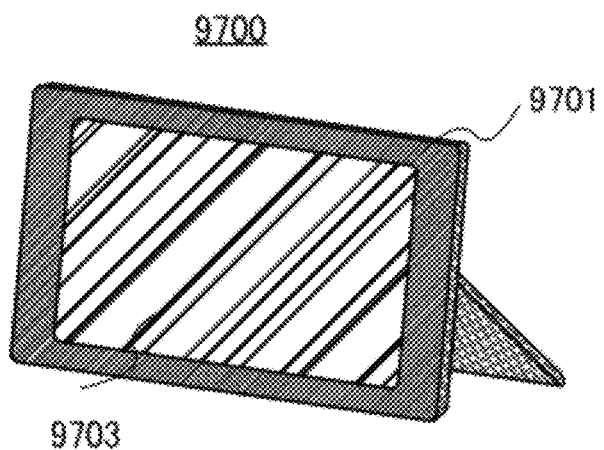

FIG. 31B illustrates an example of a digital photo frame 9700. For example, in the digital photo frame 9700, a display portion 9703 is incorporated in a housing 9701. The display portion 9703 can display various images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium inserting portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium inserting portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 32A:
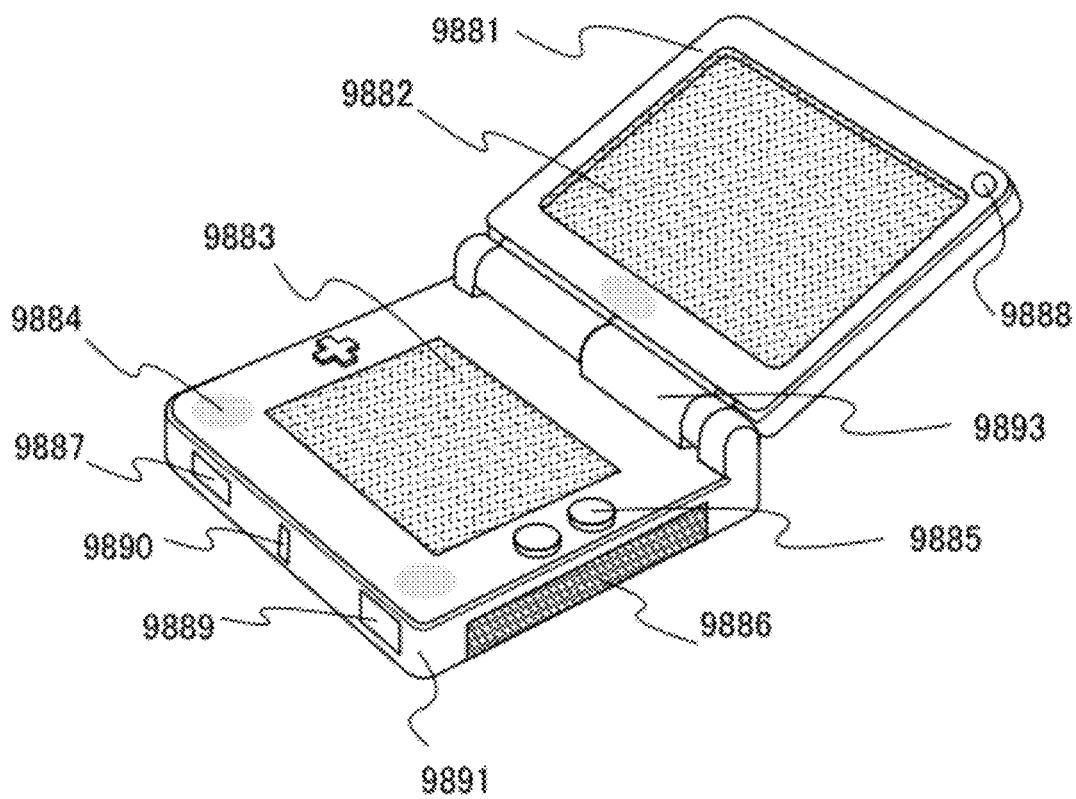
FIGS. 32A and 32B are external views each illustrating a game machine according to an embodiment of the present invention.

FIG. 32A illustrates a portable game machine and includes two housings: a housing 9881 and a housing 9891, which are connected with a joint portion 9893 so that the portable game machine can be opened and folded. A display portion 9882 is incorporated in the housing 9881, and a display portion 9883 is incorporated in the housing 9891. In addition, the portable game machine illustrated in FIG. 32A is provided with a speaker portion 9884, a recording medium inserting portion 9886, an LED lamp 9890, input means (an operation key 9885, a connection terminal 9887, a sensor 9888 having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray, and a microphone 9889), and the like. Needless to say, the structure of the portable game machine is not limited to that described above. The portable game machine may have a structure in which additional accessory equipment is provided as appropriate as long as at least a semiconductor device according to one embodiment of the present invention is provided. The portable game machine illustrated in FIG. 32A has a function of reading a program or data stored in a recording medium to display it on the display portion, and a function of sharing information with another portable game machine by wireless communication. Note that a function of the portable game machine illustrated in FIG. 32A is not limited to those described above, and the portable game machine can have a variety of functions.

Figure 32B:
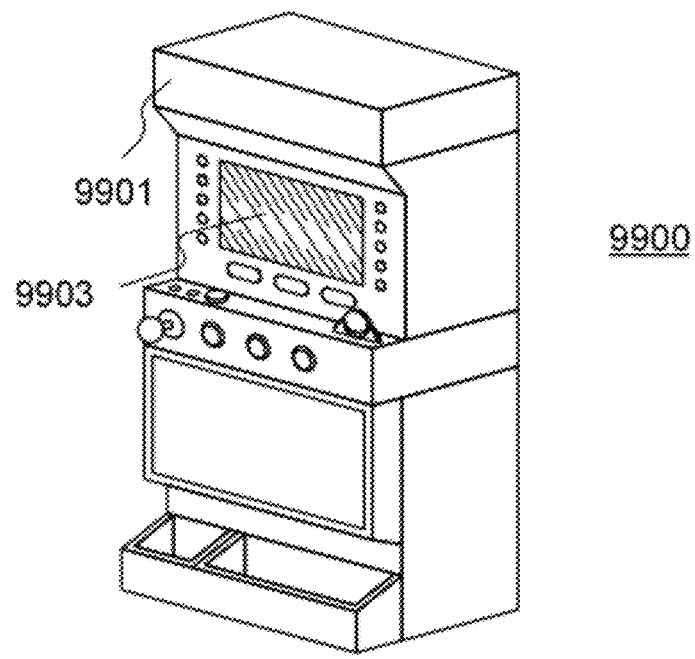

FIG. 32B illustrates an example of a slot machine 9900 which is a large-sized amusement machine. In the slot machine 9900, a display portion 9903 is incorporated in a housing 9901. In addition, the slot machine 9900 is provided with operation means such as a start lever and a stop switch, a coin slot, a speaker, or the like. Needless to say, the structure of the slot machine 9900 is not limited to the above-described structure. The slot machine may have a structure in which additional accessory equipment is provided as appropriate as long as at least a semiconductor device according to one embodiment of the present invention is provided.

Figure 33:
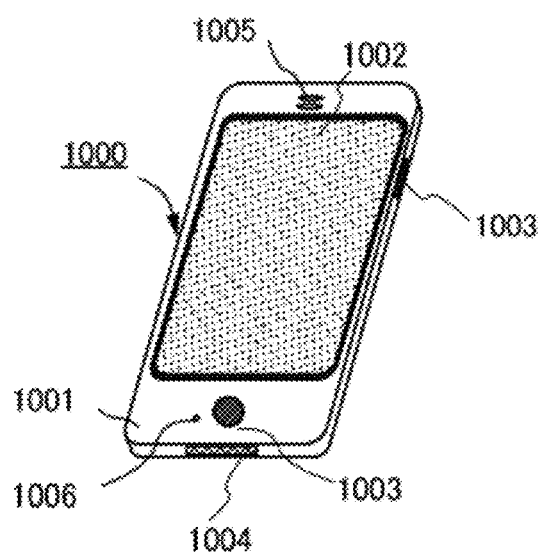
FIG. 33 illustrates an external view of a mobile phone handset according to an embodiment of the present invention.

FIG. 33 illustrates an example of a mobile phone handset 1000. The mobile phone handset 1000 is provided with a display portion 1002 incorporated in a housing 1001, operation buttons 1003, an external connection port 1004, a speaker 1005, a microphone 1006, and the like.

When the display portion 1002 of the mobile phone handset 1000 illustrated in FIG. 33 is touched with a finger or the like, data can be input into the mobile phone handset 1000. Further, operations such as making a phone call and texting can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode which is a combination of the two modes, that is, a combination of the display mode and the input mode.

For example, in the case of making a phone call or texting, a text input mode mainly for inputting text is selected for the display portion 1002 so that characters displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display on the screen of the display portion 1002 can be automatically changed by determining the orientation of the mobile phone handset 1000 (whether a long side or a short side of the mobile phone 1000 is the base thereof).

The screen modes are changed by touching the display portion 1002 or using the operation buttons 1003 of the housing 1001. Alternatively, the screen modes may be changed depending on the kind of the image displayed on the display portion 1002. For example, when a signal of an image to be displayed on the display portion is of moving image data, the screen mode is changed to the display mode. When the signal is of text data, the screen mode is changed to the input mode.

Further, in the input mode, when input by touching the display portion 1002 is not performed for a certain period while a signal detected by the optical sensor in the display portion 1002 is detected, the screen mode may be controlled so as to be changed from the input mode to the display mode.

The display portion 1002 may also function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

This application is based on Japanese Patent Application serial no. 2008-241557 filed with Japan Patent Office on Sep. 19, 2008, the entire contents of which are hereby incorporated by reference.

Explanation of Reference

100: a substrate, 101: a gate electrode, 102: a gate insulating layer, 103: an IGZO semiconductor layer, 104a: a source region, 104b: a drain region, 105a: a source electrode layer, 105b: a drain electrode layer, 106a: a source region, 106b: a drain region, 107: a protective insulating film, 108: a capacitor wiring, 110: a pixel electrode, 111a and 111b: an IGZO layer, 121: a first terminal, 122: a second terminal, 123: an IGZO layer, 125: a contact hole, 126: a contact hole, 127: a contact hole, 128 a transparent conductive film, 129: a transparent conductive film, 130: a first IGZO film, 150: a second terminal, 151: a first terminal, 152: a gate insulating layer, 153: a connection electrode, 154: a protective insulating film, 155: a transparent conductive film, 156: an electrode, 157: a first IGZO film, 158: a first IGZO film, 170 to 173: thin film transistors, 181: a common potential line, 185: a common potential line, 186: an oxide semiconductor layer, 190: a common electrode, 191: a connection electrode, 580: a substrate, 581: a thin film transistor, 585: an insulating layer, 587: an electrode layer, 588: an electrode layer, 589: a spherical particle, 590a: a black region, 590b: a white region, 594: a cavity, 595: filler, 596: a substrate, 1000: a mobile phone handset, 1001: a housing, 1002: a display portion, 1003: operation buttons, 1004: an external connection port, 1005: a speaker, 1006: a microphone, 2600: a TFT substrate, 2601: a counter substrate, 2602: a sealant, 2603: a pixel portion, 2604: a display element, 2605: a coloring layer, 2606: a polarizing plate, 2607: a polarizing plate, 2608: a wiring circuit portion, 2609: a flexible wiring substrate, 2610: a cold cathode tube, 2611: a reflective plate, 2612: a circuit substrate, 2613: a diffusing plate, 2631: a poster, 2632: an advertisement in a vehicle, 2700: an electronic book reader, 2701: a housing, 2703: a housing, 2705: a display portion, 2707: a display portion, 2711: a hinge, 2721: a power switch, 2723: an operation key, 2725: a speaker, 4001: a substrate, 4002: a pixel portion, 4003: a signal line driver circuit, 4004: a scan line driver circuit, 4005: a sealant, 4006: a substrate, 4008: a liquid crystal layer, 4010: a thin film transistor, 4011: a thin film transistor, 4013: a liquid crystal element, 4015: a connection terminal, 4016: a terminal electrode, 4018: an FPC, 4019: an anisotropic conductive film, 4020: an insulating layer, 4021: an insulating layer, 4030: a pixel electrode layer, 4031: a counter electrode layer, 4032: an insulating layer, 4033: an insulating layer, 4501: a substrate, 4502: a pixel portion, 4503a and 4503b: signal line driver circuits, 4504a and 4504b: scan line driver circuits, 4505: a sealant, 4506: a substrate, 4507: filler, 4509: a thin film transistor, 4510: a thin film transistor, 4511: a light-emitting element, 4512: an electroluminescent layer, 4513: an electrode layer, 4515: a connection terminal electrode, 4516: a terminal electrode, 4517: an electrode layer, 4519: an anisotropic conductive film, 4520: a partition, 5300: a substrate, 5301: a pixel portion, 5302: a scan line driver circuit, 5303: a signal line driver circuit, 5400: a substrate, 5401: a pixel portion, 5402: a scan line driver circuit, 5403: a signal line driver circuit, 5404: a scan line driving circuit, 5501: a first wiring, 5502: a second wiring, 5503: a third wiring, 5504: a fourth wiring, 5505: a fifth wiring, 5506: a sixth wiring, 5543: a node, 5544: a node, 5571: a first thin film transistor, 5572: a second thin film transistor, 5573: a third thin film transistor, 5574: a fourth thin film transistor, 5575: a fifth thin film transistor, 5576: a sixth thin film transistor, 5577: a seventh thin film transistor, 5578: an eighth thin film transistor, 5601: a driver IC, 5602: switch groups, 5603a: a first thin film transistor, 5603b: a second thin film transistor, 5603*c*: a third thin film transistor, 5611: a first wiring, 5612: a second wiring, 5613: a third wiring, 5621_1 to 5621_M: wirings, 5701_1 to 5701_n: flip-flops, 5701_i: a flip-flop, 5703*a*: timing of on/off of the first thin film transistor, 5703*b*: timing of on/off of the second thin film transistor, 5703*c*: timing of on/off of the third thin film transistor, 5803*a*: timing of on/off of the first thin film transistor, 5803*b*: timing of on/off of the second thin film transistor, 5803*c*: timing of on/off of the third thin film transistor, 5711: a first wiring, 5712: a second wiring, 5713: a third wiring, 5714: a fourth wiring, 5715: a fifth wiring, 5716: a sixth wiring, 5717: a seventh wiring, 5721: a signal, 5821: a signal, 6400: a pixel, 6401: a switching transistor, 6402: a driving transistor, 6403: a capacitor, 6404: a light-emitting element, 6405: a signal line, 6406: a scan line, 6407: a power source line, 6408: a common electrode, 7001: a driving TFT, 7002: a light-emitting element, 7003: a cathode, 7004: a light-emitting layer, 7005: an anode, 7011: a driving TFT, 7012: a light-emitting element, 7013: a cathode, 7014: a light-emitting layer, 7015: an anode, 7016: a light-blocking film, 7017: a conductive film, 7021: a driving TFT, 7022: a light-emitting element, 7023: a cathode, 7024: a light-emitting layer, 7025: an anode, 7027: a conductive film, 9600 a television set, 9601: a housing, 9603: a display portion, 9605: a stand, 9607: a display portion, 9609: an operation key, 9610: a remote controller, 9700: a digital photo frame, 9701: a housing, 9703: a display portion, 9881: a housing, 9882: a display portion, 9883: a display portion, 9884: a speaker portion, 9885: an operation key, 9886: a recording medium inserting portion, 9887: a connection terminal, 9888: a sensor, 9889: a microphone, 9890: an LED lamp, 9891: a housing, 9893: a joint portion, 9900: a slot machine, 9901: a housing, 9903: a display portion.

The invention claimed is:

1. A display device comprising:
a first substrate comprising a pixel portion and a common connection portion;
a second substrate comprising a first conductive layer; and
a conductive particle interposed between the first substrate and the second substrate,
wherein the pixel portion comprises:
 a gate electrode over the first substrate;
 a first insulating layer over the gate electrode;
 a first oxide semiconductor layer and a second oxide semiconductor layer over the first insulating layer;
 a second conductive layer over the first oxide semiconductor layer;
 a third conductive layer over the second oxide semiconductor layer;
 a third oxide semiconductor layer over the second and third conductive layers and the first insulating layer;
 a second insulating layer comprising a first contact hole formed over the third conductive layer, the second insulating layer over the second and third conductive layers and the third oxide semiconductor layer; and
 a fourth conductive layer over the second insulating layer and electrically connected to the third conductive layer through the first contact hole,
wherein the common connection portion comprises:
 a third insulating layer over the first substrate, the third insulating layer formed using the same material as the first insulating layer;
 a fourth oxide semiconductor layer over the third insulating layer, the fourth oxide semiconductor layer formed using the same material as the first and second oxide semiconductor layers;
 a fifth conductive layer over the fourth oxide semiconductor layer, the fifth conductive layer formed using the same material as the second and third conductive layers;
 a fourth insulating layer comprising a second contact hole formed over the fifth conductive layer, the fourth insulating layer formed using the same material as the second insulating layer; and
 a sixth conductive layer over the fourth insulating layer and electrically connected to the fifth conductive layer through the second contact hole, the sixth conductive layer formed using the same material as the fourth conductive layer,
wherein the first oxide semiconductor layer, the second oxide semiconductor layer, and the third oxide semiconductor layer comprise at least one of indium, gallium, and zinc, and
wherein the sixth conductive layer in the common connection portion is electrically connected to the first conductive layer through the conductive particle.

2. The display device according to claim 1, wherein an oxygen concentration of the third oxide semiconductor layer is higher than an oxygen concentration of the first and second oxide semiconductor layers.

3. The display device according to claim 1, wherein an electric conductivity of the third oxide semiconductor layer is lower than an electric conductivity of the first and second oxide semiconductor layers.

4. The display device according to claim 1, wherein the third oxide semiconductor layer is of an oxygen-excess type and the first and second oxide semiconductor layers are of an oxygen-deficiency type.

5. A display device comprising:
a first substrate comprising a pixel portion and a common connection portion;
a second substrate comprising a first conductive layer; and
a conductive particle interposed between the first substrate and the second substrate,
wherein the pixel portion comprises:
 a gate electrode over the first substrate;
 a first insulating layer over the gate electrode;
 a first oxide semiconductor layer and a second oxide semiconductor layer over the first insulating layer;
 a second conductive layer over the first oxide semiconductor layer;
 a third conductive layer over the second oxide semiconductor layer;
 a third oxide semiconductor layer over the second and third conductive layers and the first insulating layer;
 a second insulating layer comprising a first contact hole formed over the third conductive layer, the second insulating layer over the second and third conductive layers and the third oxide semiconductor layer; and
 a fourth conductive layer over the second insulating layer and electrically connected to the third conductive layer through the first contact hole,
wherein the common connection portion comprises:
 a fifth conductive layer over the first substrate, the fifth conductive layer formed using the same material as the gate electrode;
 a third insulating layer over the fifth conductive layer, the third insulating layer formed using the same material as the first insulating layer;
a fourth insulating layer over the third insulating layer, the fourth insulating layer formed using the same material as the second insulating layer, the third and fourth insulating layers comprising a second contact hole formed over the fifth conductive layer; and a sixth conductive layer over the fourth insulating layer and electrically connected to the fifth conductive layer through the second contact hole, the sixth conductive layer formed using the same material as the fourth conductive layer, wherein the first oxide semiconductor layer, the second oxide semiconductor layer, and the third oxide semiconductor layer comprise at least one of indium, gallium, and zinc, and wherein the sixth conductive layer in the common connection portion is electrically connected to the first conductive layer through the conductive particle.

6. The display device according to claim 5, wherein an oxygen concentration of the third oxide semiconductor layer is higher than an oxygen concentration of the first and second oxide semiconductor layers.

7. The display device according to claim 5, wherein an electric conductivity of the third oxide semiconductor layer is lower than an electric conductivity of the first and second oxide semiconductor layers.

8. The display device according to claim 5, wherein the third oxide semiconductor layer is of an oxygen-excess type and the first and second oxide semiconductor layers are of an oxygen-deficiency type.

9. A display device comprising:
a first substrate comprising a pixel portion and a common connection portion;
a second substrate comprising a first conductive layer; and
a conductive particle interposed between the first substrate and the second substrate,
wherein the pixel portion comprises:
a gate electrode over the first substrate;
a first insulating layer over the gate electrode;
a first oxide semiconductor layer and a second oxide semiconductor layer over the first insulating layer;
a second conductive layer over the first oxide semiconductor layer;
a third conductive layer over the second oxide semiconductor layer;
a third oxide semiconductor layer over the second and third conductive layers and the first insulating layer;
a second insulating layer comprising a first contact hole formed over the third conductive layer, the second insulating layer over the second and third conductive layers and the third oxide semiconductor layer; and
a fourth conductive layer over the second insulating layer and electrically connected to the third conductive layer through the first contact hole,
wherein the common connection portion comprises:
a fifth conductive layer over the first substrate, the fifth conductive layer formed using the same material as the gate electrode;
a third insulating layer over the fifth conductive layer, the third insulating layer formed using the same material as the first insulating layer;
a fourth oxide semiconductor layer over the third insulating layer, the fourth oxide semiconductor layer formed using the same material as the first and second oxide semiconductor layers;
a sixth conductive layer over the fourth oxide semiconductor layer, the sixth conductive layer formed using the same material as the second and third conductive layers;
a fourth insulating layer comprising a second contact hole formed over the sixth conductive layer, the fourth insulating layer formed using the same material as the second insulating layer; and
a seventh conductive layer over the fourth insulating layer and electrically connected to the sixth conductive layer through the second contact hole, the seventh conductive layer formed using the same material as the fourth conductive layer,
wherein the first oxide semiconductor layer, the second oxide semiconductor layer, and the third oxide semiconductor layer comprise at least one of indium, gallium, and zinc, and
wherein the seventh conductive layer in the common connection portion is electrically connected to the first conductive layer through the conductive particle.

10. The display device according to claim 9, wherein an oxygen concentration of the third oxide semiconductor layer is higher than an oxygen concentration of the first and second oxide semiconductor layers.

11. The display device according to claim 9, wherein an electric conductivity of the third oxide semiconductor layer is lower than an electric conductivity of the first and second oxide semiconductor layers.

12. The display device according to claim 9, wherein the third oxide semiconductor layer is of an oxygen-excess type and the first and second oxide semiconductor layers are of an oxygen-deficiency type.

13. The display device according to claim 9,
wherein the sixth conductive layer comprises an opening, and
wherein the seventh conductive layer is electrically connected to the fifth conductive layer through the opening.

* * * * *

UNITED STATES PATENT AND TRADEMARK OFFICE
CERTIFICATE OF CORRECTION

PATENT NO. : 8,427,595 B2
APPLICATION NO. : 12/556595
DATED : April 23, 2013
INVENTOR(S) : Shunpei Yamazaki et al.

Page 1 of 1

It is certified that error appears in the above-identified patent and that said Letters Patent is hereby corrected as shown below:

In the Claims:

In claim 9 at column 46, line 25, "laver" should be --layer--.

Signed and Sealed this
Twenty-fourth Day of September, 2013

Teresa Stanek Rea
*Deputy Director of the United States Patent and Trademark Office*